(12) United States Patent
Sampsell et al.

(10) Patent No.: US 8,284,475 B2
(45) Date of Patent: Oct. 9, 2012

(54) METHODS OF FABRICATING MEMS WITH SPACERS BETWEEN PLATES AND DEVICES FORMED BY SAME

(75) Inventors: Jeffrey Brian Sampsell, Pueblo West, CO (US); Brian James Gally, Los Gatos, CA (US); Philip Don Floyd, Redwood City, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 110 days.

(21) Appl. No.: 12/752,982

(22) Filed: Apr. 1, 2010

(65) Prior Publication Data

US 2010/0182675 A1   Jul. 22, 2010

Related U.S. Application Data

(62) Division of application No. 11/863,079, filed on Sep. 27, 2007, now Pat. No. 7,719,752.

(60) Provisional application No. 60/917,609, filed on May 11, 2007.

(51) Int. Cl.
  G02B 26/00 (2006.01)
  G02B 26/08 (2006.01)
(52) U.S. Cl. .................................. 359/290; 359/223.1
(58) Field of Classification Search ............. 359/198.1, 359/223.1, 230, 231, 290, 291
See application file for complete search history.

(56) References Cited

U.S. PATENT DOCUMENTS

| | | | |
|---|---|---|---|
| 4,190,488 A | 2/1980 | Winters | |
| 4,498,953 A | 2/1985 | Cook et al. | |
| 4,500,171 A | 2/1985 | Penz et al. | |
| 4,519,676 A | 5/1985 | te Velde | |
| 4,560,435 A | 12/1985 | Brown et al. | |
| 4,566,935 A | 1/1986 | Hornbeck | |

(Continued)

FOREIGN PATENT DOCUMENTS

CN   1378245   11/2002

(Continued)

OTHER PUBLICATIONS

Office Action dated Jul. 26, 2011 in Chinese App. No. 201010000258.3.

(Continued)

*Primary Examiner* — William Choi
(74) *Attorney, Agent, or Firm* — Knobbe Martens Olson & Bear LLP

(57) ABSTRACT

Methods of fabricating a microelectromechanical systems (MEMS) device with spacers between plates and MEMS devices formed by the same are disclosed. In one embodiment, a MEMS device is fabricated by laminating a front substrate and a carrier, each of which has components preformed thereon. The front substrate is provided with stationary electrodes formed thereover. A carrier including movable electrodes formed thereover is attached to the front substrate. The carrier of some embodiments is released after transferring the movable electrodes to the front substrate. In other embodiments, the carrier stays over the front substrate, and serves as a backplate for the MEMS device. Features are formed by deposition and patterning, by embossing, or by patterning and etching. Spacers are provided between the front substrate and the backplate to maintain a gap therebetween. The methods not only reduce the manufacturing costs, but also provide a higher yield. The resulting MEMS devices can trap smaller volumes between laminated substrates and are less susceptible to pressure variations and moisture leakage.

19 Claims, 60 Drawing Sheets

U.S. PATENT DOCUMENTS

| | | | |
|---|---|---|---|
| 4,710,732 A | 12/1987 | Hornbeck | |
| 4,855,544 A * | 8/1989 | Glenn | 200/61.45 R |
| 4,859,060 A | 8/1989 | Katagiri et al. | |
| 4,880,493 A | 11/1989 | Ashby et al. | |
| 4,900,395 A | 2/1990 | Syverson et al. | |
| 4,954,789 A | 9/1990 | Sampsell | |
| 4,956,619 A | 9/1990 | Hornbeck | |
| 5,083,857 A | 1/1992 | Hornbeck | |
| 5,099,353 A | 3/1992 | Hornbeck | |
| 5,124,834 A | 6/1992 | Cusano et al. | |
| 5,190,637 A | 3/1993 | Guckel | |
| 5,216,537 A | 6/1993 | Hornbeck | |
| 5,231,532 A | 7/1993 | Magel et al. | |
| 5,233,456 A | 8/1993 | Nelson | |
| 5,287,215 A | 2/1994 | Warde et al. | |
| 5,293,272 A | 3/1994 | Jannson et al. | |
| 5,324,683 A | 6/1994 | Fitch et al. | |
| 5,345,328 A | 9/1994 | Fritz et al. | |
| 5,358,806 A | 10/1994 | Haraichi et al. | |
| 5,381,040 A | 1/1995 | Sun et al. | |
| 5,454,906 A | 10/1995 | Baker et al. | |
| 5,485,304 A | 1/1996 | Kaeriyama | |
| 5,497,262 A | 3/1996 | Kaeriyama | |
| 5,526,172 A | 6/1996 | Kanack | |
| 5,526,951 A | 6/1996 | Bailey | |
| 5,583,688 A | 12/1996 | Hornbeck | |
| 5,600,383 A | 2/1997 | Hornbeck | |
| 5,606,441 A | 2/1997 | Florence et al. | |
| 5,631,782 A | 5/1997 | Smith et al. | |
| 5,646,768 A | 7/1997 | Kaeriyama | |
| 5,650,881 A | 7/1997 | Hornbeck | |
| 5,656,554 A | 8/1997 | Desai et al. | |
| 5,673,139 A | 9/1997 | Johnson | |
| 5,683,649 A | 11/1997 | Chatterjee et al. | |
| 5,690,839 A | 11/1997 | Min | |
| 5,719,068 A | 2/1998 | Suzawa et al. | |
| 5,726,480 A | 3/1998 | Pister | |
| 5,745,281 A | 4/1998 | Yi et al. | |
| 5,751,469 A | 5/1998 | Arney et al. | |
| 5,783,864 A | 7/1998 | Dawson et al. | |
| 5,784,212 A | 7/1998 | Hornbeck | |
| 5,801,084 A | 9/1998 | Beasom et al. | |
| 5,808,781 A | 9/1998 | Arney et al. | |
| 5,822,110 A | 10/1998 | Dabbaj | |
| 5,825,528 A | 10/1998 | Goossen | |
| 5,835,255 A | 11/1998 | Miles | |
| 5,838,484 A | 11/1998 | Goossen et al. | |
| 5,844,711 A | 12/1998 | Long, Jr. | |
| 5,867,302 A | 2/1999 | Fleming et al. | |
| 5,914,803 A | 6/1999 | Hwang et al. | |
| 5,920,421 A | 7/1999 | Choi | |
| 5,967,163 A | 10/1999 | Pan et al. | |
| 5,986,796 A | 11/1999 | Miles | |
| 5,998,293 A | 12/1999 | Dawson et al. | |
| 6,008,123 A | 12/1999 | Kook et al. | |
| 6,031,653 A | 2/2000 | Wang | |
| 6,038,056 A | 3/2000 | Florence et al. | |
| 6,040,937 A | 3/2000 | Miles | |
| 6,046,659 A | 4/2000 | Loo et al. | |
| 6,100,477 A | 8/2000 | Randall et al. | |
| 6,162,657 A | 12/2000 | Schiele et al. | |
| 6,165,890 A | 12/2000 | Kohl et al. | |
| 6,204,080 B1 | 3/2001 | Hwang | |
| 6,215,221 B1 | 4/2001 | Cabuz et al. | |
| 6,248,654 B1 | 6/2001 | Lee et al. | |
| 6,284,560 B1 | 9/2001 | Jech et al. | |
| 6,288,472 B1 | 9/2001 | Cabuz et al. | |
| 6,297,072 B1 | 10/2001 | Tilmans et al. | |
| 6,319,824 B1 | 11/2001 | Lee et al. | |
| 6,337,027 B1 | 1/2002 | Humphrey | |
| 6,342,452 B1 | 1/2002 | Coronel et al. | |
| 6,358,021 B1 | 3/2002 | Cabuz | |
| 6,359,673 B1 | 3/2002 | Stephenson | |
| 6,377,233 B2 | 4/2002 | Colgan et al. | |
| 6,407,851 B1 | 6/2002 | Islam et al. | |
| 6,447,126 B1 | 9/2002 | Hornbeck | |
| 6,448,622 B1 | 9/2002 | Franke et al. | |
| 6,465,320 B1 | 10/2002 | McNeil et al. | |
| 6,465,355 B1 | 10/2002 | Horsley | |
| 6,574,033 B1 | 6/2003 | Chui et al. | |
| 6,602,791 B2 | 8/2003 | Ouellet et al. | |
| 6,618,187 B2 | 9/2003 | Pilossof | |
| 6,620,712 B2 | 9/2003 | Huang et al. | |
| 6,632,698 B2 | 10/2003 | Ives | |
| 6,635,919 B1 | 10/2003 | Melendez et al. | |
| 6,650,455 B2 | 11/2003 | Miles | |
| 6,657,832 B2 | 12/2003 | Williams et al. | |
| 6,666,979 B2 | 12/2003 | Chinn et al. | |
| 6,674,090 B1 | 1/2004 | Chua et al. | |
| 6,674,562 B1 | 1/2004 | Miles | |
| 6,677,225 B1 | 1/2004 | Ellis et al. | |
| 6,680,792 B2 | 1/2004 | Miles | |
| 6,689,211 B1 | 2/2004 | Wu et al. | |
| 6,713,235 B1 | 3/2004 | Ide et al. | |
| 6,720,267 B1 | 4/2004 | Chen et al. | |
| 6,747,800 B1 | 6/2004 | Lin | |
| 6,756,317 B2 | 6/2004 | Sniegowski et al. | |
| 6,778,306 B2 | 8/2004 | Sniegowski et al. | |
| 6,782,166 B1 | 8/2004 | Grote et al. | |
| 6,788,175 B1 | 9/2004 | Prophet et al. | |
| 6,794,119 B2 | 9/2004 | Miles | |
| 6,806,110 B2 | 10/2004 | Lester et al. | |
| 6,812,482 B2 | 11/2004 | Fleming et al. | |
| 6,849,471 B2 | 2/2005 | Patel et al. | |
| 6,861,277 B1 | 3/2005 | Monroe et al. | |
| 6,867,896 B2 | 3/2005 | Miles | |
| 6,870,654 B2 | 3/2005 | Lin et al. | |
| 6,872,319 B2 | 3/2005 | Tsai | |
| 6,882,458 B2 | 4/2005 | Lin et al. | |
| 6,882,461 B1 | 4/2005 | Tsai et al. | |
| 6,905,613 B2 | 6/2005 | Gutierrez et al. | |
| 6,913,942 B2 | 7/2005 | Patel et al. | |
| 6,951,824 B2 | 10/2005 | Fischer et al. | |
| 6,952,303 B2 | 10/2005 | Lin et al. | |
| 6,953,702 B2 | 10/2005 | Miller et al. | |
| 6,960,305 B2 | 11/2005 | Doan et al. | |
| 6,967,757 B1 | 11/2005 | Allen et al. | |
| 6,972,891 B2 | 12/2005 | Patel et al. | |
| 6,982,820 B2 | 1/2006 | Tsai | |
| 6,987,432 B2 | 1/2006 | Lutz et al. | |
| 6,991,995 B2 | 1/2006 | Aulnette et al. | |
| 6,995,890 B2 | 2/2006 | Lin | |
| 6,999,225 B2 | 2/2006 | Lin | |
| 6,999,236 B2 | 2/2006 | Lin | |
| 7,008,812 B1 | 3/2006 | Carley | |
| 7,012,726 B1 | 3/2006 | Miles | |
| 7,027,202 B1 | 4/2006 | Hunter et al. | |
| 7,041,224 B2 | 5/2006 | Patel et al. | |
| 7,041,571 B2 | 5/2006 | Strane | |
| 7,049,164 B2 | 5/2006 | Bruner | |
| 7,078,293 B2 | 7/2006 | Lin et al. | |
| 7,110,158 B2 | 9/2006 | Miles | |
| 7,119,945 B2 | 10/2006 | Kothari et al. | |
| 7,123,216 B1 | 10/2006 | Miles | |
| 7,172,915 B2 | 2/2007 | Lin et al. | |
| 7,183,637 B2 | 2/2007 | Bruner | |
| 7,198,973 B2 | 4/2007 | Lin et al. | |
| 7,202,101 B2 | 4/2007 | Gabriel et al. | |
| 7,221,495 B2 | 5/2007 | Miles et al. | |
| 7,250,315 B2 | 7/2007 | Miles | |
| 7,256,107 B2 | 8/2007 | Takeuchi et al. | |
| 7,291,921 B2 | 11/2007 | Lin | |
| 7,321,457 B2 | 1/2008 | Heald | |
| 7,327,510 B2 | 2/2008 | Cummings et al. | |
| 7,405,863 B2 | 7/2008 | Tung et al. | |
| 7,420,728 B2 | 9/2008 | Tung et al. | |
| 7,429,334 B2 | 9/2008 | Tung et al. | |
| 7,446,926 B2 | 11/2008 | Sampsell | |
| 7,450,295 B2 | 11/2008 | Tung et al. | |
| 7,459,402 B2 | 12/2008 | Doan et al. | |
| 7,485,236 B2 | 2/2009 | Lin | |
| 7,486,867 B2 | 2/2009 | Wang | |
| 7,492,502 B2 | 2/2009 | Chui et al. | |
| 7,527,996 B2 | 5/2009 | Luo et al. | |
| 7,534,640 B2 | 5/2009 | Sasagawa et al. | |
| 7,545,552 B2 | 6/2009 | U'Ren | |
| 7,547,565 B2 | 6/2009 | Lin et al. | |

| | | |
|---|---|---|
| 7,547,568 B2 | 6/2009 | Chou et al. |
| 7,556,917 B2 | 7/2009 | Miles |
| 7,561,321 B2 | 7/2009 | Heald |
| 7,566,940 B2 | 7/2009 | Sasagawa et al. |
| 7,573,547 B2 | 8/2009 | Palmateer et al. |
| 7,616,369 B2 | 11/2009 | Miles et al. |
| 7,623,287 B2 | 11/2009 | Sasagawa et al. |
| 7,630,123 B2 | 12/2009 | Kothari et al. |
| 7,642,110 B2 | 1/2010 | Miles |
| 7,679,812 B2 | 3/2010 | Sasagawa et al. |
| 7,684,104 B2 | 3/2010 | Chui et al. |
| 7,704,773 B2 | 4/2010 | Kogut et al. |
| 7,706,044 B2 | 4/2010 | Lin et al. |
| 7,709,964 B2 | 5/2010 | Lin |
| 7,719,752 B2 | 5/2010 | Sampsell et al. |
| 7,723,015 B2 | 5/2010 | Miles |
| 7,835,093 B2 | 11/2010 | Wang |
| 7,952,789 B2 | 5/2011 | Tung et al. |
| 2001/0003487 A1 | 6/2001 | Miles |
| 2001/0040675 A1 | 11/2001 | True et al. |
| 2002/0003400 A1 | 1/2002 | Lee |
| 2002/0014579 A1 | 2/2002 | Dunfield |
| 2002/0021485 A1 | 2/2002 | Pilossof |
| 2002/0027636 A1 | 3/2002 | Yamada |
| 2002/0054422 A1 | 5/2002 | Carr et al. |
| 2002/0055253 A1 | 5/2002 | Rudhard |
| 2002/0058422 A1 | 5/2002 | Jang et al. |
| 2002/0071169 A1 | 6/2002 | Bowers et al. |
| 2002/0086455 A1 | 7/2002 | Franosch et al. |
| 2002/0110948 A1 | 8/2002 | Huang et al. |
| 2002/0117728 A1 | 8/2002 | Brosnihhan et al. |
| 2002/0146200 A1 | 10/2002 | Kudric et al. |
| 2002/0155717 A1 | 10/2002 | Sniegowski et al. |
| 2002/0186483 A1 | 12/2002 | Hagelin et al. |
| 2003/0003682 A1 | 1/2003 | Moll et al. |
| 2003/0003761 A1 | 1/2003 | Yang et al. |
| 2003/0006468 A1 | 1/2003 | Ma et al. |
| 2003/0016428 A1 | 1/2003 | Kato et al. |
| 2003/0029831 A1 | 2/2003 | Kawase |
| 2003/0047533 A1 | 3/2003 | Reid et al. |
| 2003/0053078 A1 | 3/2003 | Missey et al. |
| 2003/0053233 A1 | 3/2003 | Felton |
| 2003/0071015 A1 | 4/2003 | Chinn et al. |
| 2003/0072070 A1 | 4/2003 | Miles |
| 2003/0111439 A1 | 6/2003 | Fetter et al. |
| 2003/0123126 A1 | 7/2003 | Meyer et al. |
| 2003/0138986 A1 | 7/2003 | Bruner |
| 2003/0141561 A1 | 7/2003 | Fischer et al. |
| 2003/0202264 A1 | 10/2003 | Weber et al. |
| 2003/0202265 A1 | 10/2003 | Reboa et al. |
| 2003/0210851 A1 | 11/2003 | Fu et al. |
| 2003/0231373 A1 | 12/2003 | Kowarz et al. |
| 2004/0027671 A1 | 2/2004 | Wu et al. |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0076802 A1 | 4/2004 | Tompkin et al. |
| 2004/0080035 A1 | 4/2004 | Delapierre |
| 2004/0080832 A1 | 4/2004 | Singh |
| 2004/0100680 A1 | 5/2004 | Huibers et al. |
| 2004/0124483 A1 | 7/2004 | Partridge et al. |
| 2004/0124495 A1 | 7/2004 | Chen et al. |
| 2004/0125281 A1 | 7/2004 | Lin et al. |
| 2004/0125347 A1 | 7/2004 | Patel et al. |
| 2004/0132243 A1 | 7/2004 | Kurosawa |
| 2004/0136045 A1 | 7/2004 | Tran |
| 2004/0136076 A1 | 7/2004 | Tayebati |
| 2004/0159629 A1 | 8/2004 | Busta |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0207898 A1 | 10/2004 | Lin et al. |
| 2004/0209195 A1 | 10/2004 | Lin |
| 2004/0217264 A1 | 11/2004 | Wood et al. |
| 2004/0217919 A1 | 11/2004 | Pichl et al. |
| 2004/0233498 A1 | 11/2004 | Starkweather et al. |
| 2004/0244191 A1 | 12/2004 | Orr et al. |
| 2005/0014374 A1 | 1/2005 | Partridge et al. |
| 2005/0020089 A1 | 1/2005 | Shi et al. |
| 2005/0024557 A1 | 2/2005 | Lin |
| 2005/0034822 A1 | 2/2005 | Kim et al. |
| 2005/0036095 A1 | 2/2005 | Yeh et al. |
| 2005/0045276 A1 | 3/2005 | Patel et al. |
| 2005/0068605 A1 | 3/2005 | Tsai |
| 2005/0068627 A1 | 3/2005 | Nakamura et al. |
| 2005/0098840 A1 | 5/2005 | Fuertsch et al. |
| 2005/0118832 A1 | 6/2005 | Korzenski et al. |
| 2005/0124135 A1 | 6/2005 | Ayazi et al. |
| 2005/0170670 A1 | 8/2005 | King et al. |
| 2005/0195462 A1 | 9/2005 | Lin |
| 2005/0195464 A1 | 9/2005 | Faase et al. |
| 2005/0206991 A1 | 9/2005 | Chui et al. |
| 2005/0226281 A1 | 10/2005 | Faraone et al. |
| 2005/0266599 A1 | 12/2005 | Ikegami |
| 2006/0008200 A1 | 1/2006 | Nakamura et al. |
| 2006/0024620 A1 | 2/2006 | Nikkel et al. |
| 2006/0037933 A1 | 2/2006 | Wang et al. |
| 2006/0066864 A1 | 3/2006 | Cummings et al. |
| 2006/0066932 A1 | 3/2006 | Chui et al. |
| 2006/0067642 A1 | 3/2006 | Tyger |
| 2006/0077503 A1 | 4/2006 | Palmateer et al. |
| 2006/0077509 A1 | 4/2006 | Tung et al. |
| 2006/0077516 A1 | 4/2006 | Kothari |
| 2006/0079048 A1 | 4/2006 | Sampsell et al. |
| 2006/0148262 A1 | 7/2006 | Lee et al. |
| 2006/0183644 A1 | 8/2006 | Nakamura et al. |
| 2006/0203325 A1 | 9/2006 | Faase et al. |
| 2006/0234412 A1 | 10/2006 | Lazaroff |
| 2007/0041076 A1 | 2/2007 | Zhong et al. |
| 2007/0047900 A1 | 3/2007 | Sampsell et al. |
| 2007/0064760 A1 | 3/2007 | Kragh |
| 2007/0077525 A1 | 4/2007 | David et al. |
| 2007/0093045 A1 | 4/2007 | Yamaguchi et al. |
| 2007/0111533 A1 | 5/2007 | Korzenski et al. |
| 2007/0155051 A1 | 7/2007 | Wang et al. |
| 2007/0170540 A1 | 7/2007 | Chung et al. |
| 2007/0249078 A1 | 10/2007 | Tung et al. |
| 2008/0041817 A1 | 2/2008 | Lin |
| 2008/0100899 A1 | 5/2008 | Shimokawa et al. |
| 2008/0130089 A1 | 6/2008 | Miles |
| 2008/0180783 A1 | 7/2008 | Wang et al. |
| 2008/0226929 A1 | 9/2008 | Chung et al. |
| 2008/0231931 A1 | 9/2008 | Londergan et al. |
| 2009/0022884 A1 | 1/2009 | Chui et al. |
| 2009/0315567 A1 | 12/2009 | Chou et al. |
| 2009/0323168 A1 | 12/2009 | Miles et al. |
| 2010/0019336 A1 | 1/2010 | Sasagawa et al. |
| 2010/0044808 A1 | 2/2010 | Dekker et al. |
| 2010/0147790 A1 | 6/2010 | Sasagawa et al. |
| 2010/0149627 A1 | 6/2010 | Sasagawa et al. |
| 2010/0202039 A1 | 8/2010 | Kogut et al. |
| 2010/0320555 A1 | 12/2010 | Miles et al. |

FOREIGN PATENT DOCUMENTS

| | | |
|---|---|---|
| CN | 092109265 | 4/2003 |
| CN | 1755492 | 4/2006 |
| DE | 199 38 072 | 3/2000 |
| DE | 198 47 455 | 4/2004 |
| EP | 0 069 226 | 1/1983 |
| EP | 0 035 299 | 9/1983 |
| EP | 0 695 959 | 2/1996 |
| EP | 0 788 005 | 8/1997 |
| EP | 1 209 738 | 5/2002 |
| EP | 1 275 997 | 1/2003 |
| EP | 1 452 481 | 9/2004 |
| EP | 1 640 319 | 3/2006 |
| EP | 1 640 767 | 3/2006 |
| EP | 1 640 768 | 3/2006 |
| EP | 1 640 770 | 3/2006 |
| JP | 49-004993 | 1/1974 |
| JP | 01-102415 | 4/1989 |
| JP | 05275401 | 10/1993 |
| JP | 06-350105 | 12/1994 |
| JP | 07-098326 | 4/1995 |
| JP | 07-060844 | 7/1995 |
| JP | 9-127439 | 5/1997 |

| | | |
|---|---|---|
| JP | 10-020328 | 1/1998 |
| JP | 10-148644 | 6/1998 |
| JP | 10-209176 | 8/1998 |
| JP | 11-097799 | 4/1999 |
| JP | 11-258777 | 9/1999 |
| JP | 2001-085519 | 3/2001 |
| JP | 2002-287047 | 3/2001 |
| JP | 2002-062490 | 2/2002 |
| JP | 2002-207182 | 7/2002 |
| JP | 2002-243937 | 8/2002 |
| JP | 2002-328313 | 11/2002 |
| JP | 2003-001598 | 1/2003 |
| JP | 2003-340795 | 12/2003 |
| JP | 2004-106074 | 4/2004 |
| JP | 2004-133281 | 4/2004 |
| JP | 2004-141995 | 5/2004 |
| JP | 2004-212656 | 7/2004 |
| JP | 2005-028504 | 3/2005 |
| JP | 2005-193336 | 7/2005 |
| TW | 546833 | 8/2003 |
| WO | WO 91/05284 | 4/1991 |
| WO | WO 92/10925 | 6/1992 |
| WO | WO 98/29748 | 7/1998 |
| WO | WO 01/14248 | 3/2001 |
| WO | WO 01/63657 | 8/2001 |
| WO | WO 02/24570 | 3/2002 |
| WO | WO 02/075803 | 9/2002 |
| WO | WO 02/079853 | 10/2002 |
| WO | WO 03/014789 | 2/2003 |
| WO | WO 03/107094 | 12/2003 |
| WO | WO 2004/003981 | 1/2004 |
| WO | WO 2004/015741 | 2/2004 |
| WO | WO 2004/055885 | 7/2004 |
| WO | WO 2004/079056 | 9/2004 |
| WO | WO 2004/087561 | 10/2004 |
| WO | WO 2005/061378 | 7/2005 |
| WO | WO 2006-036435 | 3/2006 |
| WO | WO 2006/037044 | 4/2006 |
| WO | WO 2006/073111 | 7/2006 |
| WO | WO 2006/110042 | 10/2006 |
| WO | WO 2006/113492 | 10/2006 |
| WO | WO 2007/053308 | 5/2007 |
| WO | WO 2007/054408 | 5/2007 |
| WO | WO 2008/046682 | 4/2008 |

OTHER PUBLICATIONS

Notice to Submit Response dated May 17, 2011 in Korean App. No. 10-2009-7025851.
Liu et al., Oct. 2004, Vertical profiles and cd loss control in deep REI technology, Solid-State and Integrated Circuits Technology, 7th International Conference, pp. 1848-1851.
Williams et al., Dec. 2003, Etch rates for micromachining processing—part II, Journal of Microelectromechanical Systems, 12(6):761-778.
Office Action dated Feb. 11, 2011 received in Chinese application No. 200880015637.0.
Aratani et al., Process and Design Considerations for Surface Micromachined Beams for a Tuneable Interferometer Array in Silicon, Proc. IEEE Microelectromechanical Workshop, Fort Lauderdale, FL, pp. 230-235 (Feb. 1993).
Aratani K. et al. Surface Micromachined Tuneable Interferometer Array, Sensors and Actuators A, Elsevier Sequoia S.A., Lausanne, CH, A43(1/3):17-23, May 1, 1994.
Dai et al., "A CMOS surface micromachined pressure sensor," Journal of the Chinese institute of Engineers, 22(3):375-380 (May 1999).

Fan et al., Channel Drop Filters in Photonic Crystals, Optics Express, 3(1) (1998).
Ibbotson et al., Comparison of XeF2 and F-atom reactions with Si and SiO2, Applied Physics Letters, 44(12):1129-1131 (Jun. 1984).
Petersen et al. 1978. Light-activated micromechanical devices, IBM Technical Disclosure Bulletin, 21(3):1205-1206.
Raley et al., A Fabry-Perot Microinterferometer for Visible Wavelengths, IEEE Solid-State Sensor and Actuator Workshop, Hilton Head, SC, pp. 170-173 (1992).
Sridharan et al. Post-packaging Release a New Concept for Surface-Micromachined Devices Technical Digest, IEEE Solid-State Sensor & Actuator Workshop, New York, NY US Nov. 8, 1998 pp. 225-228.
Wang et al., Flexible circuit-based RF MEMS Switches, Proceedings of 2001 ASME International Mechanical Engineering Congress and Exposition, pp. 1-6, 2001.
Williams, et al. Etch Rates for Micromachining Processing. Journal of Microelectromechanical Systems, 5(4):256-259, (Dec. 1996).
Winters, et al. The etching of silicon with XeF2 vapor. Applied Physics Letters, 34(1):70-73, (Jan. 1979).
Yao et al., BrF3 dry release technology for large freestanding parylene microstructures and electrostatic actuators, Sensors and Actuators A, 97-98:771-775, Apr. 2002.
Partial European Search Report for App. No. 08153803.5, dated Sep. 4, 2008.
Extended European Search Report dated Jan. 13, 2009 for App. No. 08153803.5.
Official Action dated Jan. 18, 2010 for App. No. 08153803.5.
Extended European Search Report dated Mar. 2, 2009 for App. No. 08153806.8.
Extended European Search Report dated Feb. 2, 2009 for App. No. 08153791.2.
Extended European Search Report dated Jan. 29, 2009 for App. No. 08153809.2.
Extended European Search Report dated Jan. 29, 2009 for App. No. 08153787.0.
ISR and WO for PCT/US06/061812 filed Apr. 28, 2008.
IPRP for PCT/US06/061812 received Oct. 2, 2009.
Office Action dated Aug. 5, 2009 in U.S. Appl. No. 11/863,079.
Dokmeci et al., Dec. 2004, Two-axis single-crystal silicon micromirror arrays, Journal of Microelectromechanical Systems, 13(6):1006-1017.
Boucinha et al., 2000, Amorphous silicon air-gap resonators on large-area substrates, Applied Physics Letters, 77(6):907-909.
Chung et al., 2005, Fabrication and characterization of amorphous Si films by PECVD for MEMS, J. Micromech. Microeng. 15:136-142.
Rusu et al., 2001, Planarization of deep trenches, Proc. SPIE, 4557:49-57.
Official Action dated Feb. 22, 2012 for App. No. 08153803.5.
Office Action dated Mar. 7, 2012 in Chinese App. No. 200880015637.0.
Notice to Submit Response dated Jan. 27, 2012 in Korean App. No. 10/2010-7000152.
Notice to Submit Reponse dated Feb. 28, 2012 in Korean App. No. 10-2009-7025851.
Official Communication dated Jan. 20, 2012 for App. No. 08153791.2.
Official Communication dated Jan. 19, 2012 for App. No. 08153787.0.
Notice of Reasons for Rejection dated Jan. 4, 2012 in Japanese App. 2010-507525.
Notice of Reasons for Rejection dated Jan. 4, 2012 in Japanese App. 2010-056109.

* cited by examiner

| | Column Output Signals | |
|---|---|---|
| | $+V_{bias}$ | $-V_{bias}$ |
| Row Output Signals  0 | Stable | Stable |
| $+\Delta V$ | Relax | Actuate |
| $-\Delta V$ | Actuate | Relax |

METHODS OF FABRICATING MEMS WITH SPACERS BETWEEN PLATES AND DEVICES FORMED BY SAME

CROSS-REFERENCE TO RELATED APPLICATIONS

This application is a divisional of and claims priority to U.S. patent application Ser. No. 11/863,079, filed Sep. 27, 2007, which claims the priority benefit under 35 U.S.C. §119 (e) of Provisional Application Ser. No. 60/917,609, filed May 11, 2007. The full disclosures of the foregoing applications are incorporated herein by reference. This application is also related to U.S. Patent Application Publication No. 2006/0067646 A1, entitled MEMS DEVICE FABRICATED ON A PRE-PATTERNED SUBSTRATE.

BACKGROUND

1. Field

This invention relates to microelectromechanical devices and methods for making the same. More particularly, this invention relates to interferometric modulators and methods for making the same.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

Methods of fabricating a microelectromechanical systems (MEMS) device and MEMS devices formed by the same are provided. In one aspect, a MEMS device is fabricated by attaching a front substrate and a carrier, each of which has features preformed thereon. The features can be formed by deposition and patterning or by shaping (e.g., embossing, patterning and etching, or inscribing). In some embodiments in which features are formed by shaping and deposition, multiple patterns are formed using multiple levels without using separate masks. In another aspect, methods of forming routing structures for MEMS devices are provided. In yet another aspect, MEMS devices are provided with spacing structures to maintain a space between a front substrate and a backplate. In another aspect, methods for forming black masks to prevent unwanted reflections in optical MEMS (e.g., interferometric modulators) are provided. The methods described above not only reduce the manufacturing costs, but also provide a higher yield. The resulting MEMS devices are less susceptible to pressure variations and moisture leakage.

In one aspect, a method of making a MEMS device is provided. The method includes: providing a transparent electrode assembly comprising a transparent substrate and an at least partially transparent electrode formed over the transparent substrate; providing a carrier comprising a reflective electrode formed thereover; and attaching the transparent electrode assembly to the carrier such that the reflective electrode faces the at least partially transparent electrode to form a cavity.

In another aspect, a method of making an interferometric device array is provided. The method includes providing a front substrate comprising supports defining cavities on the front substrate. The front substrate further comprises front electrodes formed in the cavities. The method further includes providing a carrier comprising movable electrodes formed thereover; and attaching the front substrate to the carrier such that the movable electrodes face at least a portion of the front electrodes to form one or more interferometric devices.

In yet another aspect, a microelectromechanical system (MEMS) device is provided. The device includes: a front substrate comprising a plurality of supports defining cavities on the front substrate; and a plurality of movable electrodes supported by the supports. Each of the movable electrodes includes first portions overlying the supports and second portions neighboring first portions. The second portions do not overlie the supports. The first portions have a first thickness. The second portions have a second thickness. The second thickness is greater than the first thickness.

In yet another aspect, an array of microelectromechanical systems (MEMS) devices is provided. The array includes a front substrate comprising a plurality of supports defining cavities on the front substrate, wherein each of the cavities has a bottom surface. The device further includes a backplate substantially opposing and overlying the front substrate. The backplate has a surface facing the cavities of the front substrate. The surface is most removed from the front substrate. The device also includes a plurality of mechanical strips interposed between the supports and the surface of the backplate. Each of the mechanical strips serves as moving electrodes for multiple MEMS devices. A distance between the bottom surface of one of the cavities and the most removed surface of the backplate is between about 6,500 Å and about 20 μm.

In another aspect, a microelectromechanical system (MEMS) device is provided. The device includes a substrate comprising a plurality of supports integrally formed with and of the same material as the substrate; and a plurality of mechanical elements defining moving electrodes. The mechanical elements are supported on top of the supports.

In another aspect, a microelectromechanical system (MEMS) device is provided. The device includes a substrate having a surface. The substrate includes a plurality of troughs formed into the surface. The troughs extend substantially parallel to one another. The surface of the substrate defines a higher region of the substrate whereas the troughs defines lower regions of the substrate. The device further includes a plurality of fixed electrodes formed on the lower regions of the substrate.

In yet another aspect, a front substrate for a microelectromechanical system (MEMS) is provided. The front substrate includes a substrate comprising a plurality of supports defining a plurality of cavities on the substrate. The supports are integrally formed with and of the same material as the substrate. The front substrate further includes a conductive layer formed in the cavities between the supports.

In another aspect, a method of making an interferometric modulator is provided. The method includes forming a plurality of supports from a substrate. The supports are integrally formed with and of the same material as the substrate. The method further includes forming a plurality of mechanical elements defining moving electrodes such that the mechanical elements are supported on the supports.

In another aspect, a method of making a microelectromechanical system (MEMS) is provided. The method includes providing a planar substrate; and forming support structures integral with the substrate to define heights of MEMS cavities. The MEMS cavities have floors, and the MEMS cavities are configured to accommodate motion of moving electrodes therein. The method further includes forming a conductive layer on the floors of the cavities.

In another aspect, a microelectromechanical system (MEMS) device is provided. The device includes a front substrate comprising a plurality of electrodes formed over the front substrate; and a carrier substantially opposing the front substrate such that the electrodes are interposed between the carrier and the front substrate. The carrier includes a plurality of rails extending from the carrier. The device further includes a plurality of movable electrodes interposed between the front substrate and the rails of the carrier.

In another aspect, a carrier for attaching to a microelectromechanical system (MEMS) front substrate with a stationary electrode formed thereover is provided. The carrier includes a substrate including a plurality of rails. The rails define troughs alternating with the rails. The carrier also includes an electrode layer comprising first portions formed over the rails and second portions formed within the troughs. The electrode layer is discontinuous between the troughs and the rails.

In yet another aspect, a method of making a microelectromechanical system (MEMS) array is provided. The MEMS array includes a front substrate having a first surface. The front substrate includes a plurality of fixed lower electrodes formed over the first surface. The method includes shaping a carrier substrate so as to have mesas integrally formed from the carrier substrate. The mesas define troughs alternating with the mesas. The method further includes depositing a mechanical layer over the mesas and within the troughs of the carrier substrate. The mechanical layer is discontinuous between the troughs and the mesas.

In another aspect, a microelectromechanical system (MEMS) device is provided. The device includes a front substrate comprising a first support extending from the front substrate; a backplate having a surface substantially opposing the front substrate such that the first support is interposed between the front substrate and the surface of the backplate; and a moving electrode interposed between the front substrate and backplate. The moving electrode includes a portion supported on the first support. The device further includes a second support extending from one of the first support of the front substrate and the surface of the backplate. The second support is positioned between the first support of the front substrate and the surface of the backplate.

In another aspect, a microelectromechanical system (MEMS) device is provided. The device includes a front substrate having a first surface. The front substrate includes an optical stack formed over the first surface. The device also includes a backplate opposing the front substrate. The backplate has a second surface facing the first surface. The backplate includes posts extending from the second surface toward the first surface such that the height of the posts defines a distance between the first surface and the second surface. The device further includes a plurality of movable electrode strips extending substantially parallel to one another. The strips are interposed between the first surface and the second surface.

In yet another aspect, a microelectromechanical system (MEMS) device is provided. The device includes a front substrate and a backplate opposing the front substrate. The backplate has a surface facing the front substrate. The device also includes a plurality of movable electrode strips extending substantially parallel to one another. The strips are interposed between the front substrate and the backplate. Portions of the strips are movable toward the front substrate. The device further includes a plurality of posts extending from the surface of the backplate such that the posts are arranged to limit movement of the portions of the strips toward the surface.

In another aspect, a method of making microelectromechanical system (MEMS) device is provided. The method includes providing a front substrate comprising a first support extending from the front substrate; providing a backplate having a surface; attaching the front substrate to the backplate such that the first support is interposed between the front substrate and the surface of the backplate; and forming a second support between the first support of the front substrate and the surface of the backplate such that the second support extends from one of the first support of the front substrate and the surface of the backplate.

In another aspect, a microelectromechanical system (MEMS) device is provided. The device includes a front substrate having a first surface. The front substrate includes an array region and a peripheral region on the first surface. The device also includes a backplate having a second surface facing the first surface. The first and second surfaces have a gap therebetween. The backplate includes an array region and a peripheral region on the second surface. The device further includes a conductive line extending on the peripheral region of the front substrate; and a conductive structure extending between the peripheral regions of the front substrate and the backplate. The conductive structure contacts the conductive line.

In another aspect, a carrier assembly for making an interferometric modulator is provided. The interferometric modulator includes a front substrate comprising substantially transparent electrodes formed thereon. The carrier assembly includes a releasable structure having a surface; and a plurality of elongated conductive strips formed over the surface. The elongated conductive strips extend in a direction substantially parallel to one another.

In another aspect, an interferometric modulator is provided. The interferometric modulator includes a carrier assembly which includes a releasable structure having a surface, and a plurality of elongated conductive strips formed over the surface. The elongated conductive strips extend in a direction substantially parallel to one another. The interferometric modulator also includes a front substrate comprising a plurality of supports and substantially transparent electrodes. The front substrate is attached to the carrier assembly such that the conductive strips are supported by the supports.

In yet another aspect, a method of making an interferometric modulator is provided. The interferometric modulator includes a front substrate comprising a plurality of supports defining cavities on the front substrate. The front substrate further includes lower electrodes formed in the cavities. The method includes providing a releasable structure having a surface; depositing a movable electrode material over the surface; providing a mask over the movable electrode material so as to selectively expose portions of the movable electrode material; and selectively etching the movable electrode material using the mask, thereby forming a plurality of movable electrode strips. The movable electrode strips extend in a direction substantially parallel to one another. The method further includes positioning the releasable structure over the front substrate such that the movable electrode strips face the cavities of the front substrate.

In another aspect, a microelectromechanical system (MEMS) device is provided. The device includes a front substrate comprising an array region and a peripheral region. The front substrate comprises a plurality of supports defining a plurality of lower regions therebetween in the array region. The front substrate further comprises a land in the peripheral region. At least a portion of the land has substantially the same height as the supports in the array region. The device also includes a plurality of conductors formed over the land in the peripheral region. The conductors are electrically isolated from one another. The device further includes a conductive layer formed on the lower regions of the front substrate.

In another aspect, a carrier for combining with a front substrate of an interferometric modulator is provided. The front substrate includes substantially transparent electrodes formed thereon. The carrier includes a substrate including an array region and a peripheral region; and a plurality of movable electrode strips formed over the array region of the substrate. The strips extend substantially parallel to one another. The carrier further includes a plurality of routing traces formed over the substrate. Each of the traces extends from a respective one of the strips to the peripheral region.

In yet another aspect, a microelectromechanical system (MEMS) device is provided. The device includes a front substrate including an array region and a peripheral region. The front substrate includes a plurality of rails extending parallel to one another in the array region. The rails define a plurality of troughs in the array region. The front substrate further includes trenches in the peripheral region. Each of the trenches extends from a respective one of the troughs. The device further includes row routing traces formed in the trenches. The row routing traces extend from the troughs in the array region to the at least one portion of the peripheral region. The row routing traces are electrically isolated from one another.

In another aspect, a microelectromechanical system (MEMS) device is provided. The device includes a front substrate having a surface comprising an array region and a peripheral region surrounding the array region. The front substrate includes an annular sealing region on the surface of the front substrate. The sealing region substantially surrounds the array region. The sealing region has a first width extending in a direction toward the array region. The front substrate also includes a recess formed into the substrate. The recess has a second width extending in the direction. The second width is greater than the first width. The recess extends across a portion of the sealing region. The recess defines an elevation lower than that of the surface of the front substrate. The front substrate further includes a first conductive layer formed on the surface of the front substrate; and a second conductive layer formed in the recess, wherein the first and second conductive layers are discontinuous with each other.

In another aspect, a method of making a microelectromechanical system (MEMS) device is provided. The method includes providing a front substrate having a surface comprising an array region and a routing region; and forming an isolation trench in the routing region of the surface of the front substrate. The isolation trench includes a bottom surface and sidewalls. The bottom surface of the isolation trench defines an elevation lower than that of the surface of the front substrate. The method further includes forming a conductive layer on the surface of the substrate and the bottom surface of the isolation trench such that the conductive layer is discontinuous between the surface of the substrate and the isolation trench.

In another aspect, a method of making an interferometric modulator is provided. The method includes providing a substrate comprising cavities on a surface thereof; providing a liquid mixture comprising a light-absorbing material over the surface of the substrate such that the liquid mixture fills at least portions of the cavities; and partially removing a component of the liquid mixture from the cavities of the substrate after providing the liquid mixture such that at least a portion of the light-absorbing material remains in the cavities.

In another aspect, an interferometric modulator is provided. The interferometric modulator includes a substrate having a surface. The substrate includes a plurality of supports formed on the surface of the substrate. The interferometric modulator also includes a light-absorbing material formed on the surface of the substrate. Substantially all of the material is positioned in corners where the supports meet the surface.

In yet another aspect, a method of making an interferometric modulator is provided. The method includes forming support structures over a substrate; and depositing a black mask material over the substrate after forming the support structures.

In another aspect, a method of making a static interferometric display device is provided. The method includes providing a first substrate comprising a partially transparent layer formed thereon. The first substrate is formed of a substantially transparent material. The method also includes providing a second substrate comprising a mirror layer formed thereon. At least one of the first and second substrates includes cavities patterned based on an image which the static interferometric device is configured to display. The method further includes laminating the first substrate with the second substrate. The partially transparent layer faces the second substrate. The mirror layer faces the first substrate. The cavities of one of the substrates face the other of the substrates.

In another aspect, a method of making a static interferometric display device is provided. The method includes providing a first substrate comprising a first surface including a plurality of cavities. The cavities have at least one depth. The cavities are patterned at least partially based on an image which the static interferometric display device is configured to display. The method also includes providing a second substrate including a second surface; and attaching the first substrate to the second substrate such that the first surface faces the second surface.

In yet another aspect, a static interferometric display device is provided. The device includes a first substrate including a first surface. The first substrate includes cavities defined on the first surface. The cavities are patterned at least partially based on an image which the static interferometric display device is configured to display. The first substrate is formed of a substantially transparent material. The device also includes a second substrate attached to the first substrate. The second substrate includes a second surface facing the first surface. The device further includes a partially reflective layer in the cavities of the first substrate.

In yet another aspect, a static interferometric display device is provided. The device includes a first substrate including a first surface. The first substrate includes cavities defined on the first surface. The cavities are patterned at least partially based on an image which the static interferometric display device is configured to display. The device also includes a second substrate attached to the first substrate. The second substrate includes a second surface facing the first surface. The second substrate is formed of a substantially transparent material. The device further includes a minor layer on the first surface of the first substrate; and a partially reflective layer on the second surface of the second substrate.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments will also be better understood with reference to the appended claims and drawings which form part of this disclosure. In addition, various changes, modifications, combinations and sub-combinations may be made without departing from the spirit and scope of the invention, as defined by the appended claims. These and other embodiments of the invention will become readily apparent to those skilled in the art from the following detailed description of the preferred embodiments having reference to the attached figures, the invention not being limited to any particular preferred embodiment(s) disclosed.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

A microelectromechanical systems (MEMS) device may be fabricated by attaching two substrates, each of which has components preformed thereon. A method of making a MEMS device according to one embodiment includes providing a front substrate and stationary electrodes formed over the front substrate. Then, a carrier including movable electrodes formed thereover is attached to the front substrate. The carrier of some embodiments can be released after transferring the movable electrodes to the front substrates; in other embodiments, the carrier serves as a backplate for the MEMS. Features can be formed by deposition and patterning, by embossing, or by patterning and etching. The method not only reduces the manufacturing costs, but also provides less variation and therefore higher yield. The resulting MEMS device is less susceptible to pressure variations and moisture leakage. Also disclosed are methods of routing from movable electrodes to column drivers and from stationary electrodes to row drivers. Techniques for forming black masks to prevent unwanted reflections in optical MEMS (e.g., interferometric modulators) are also taught.

Figure 1:
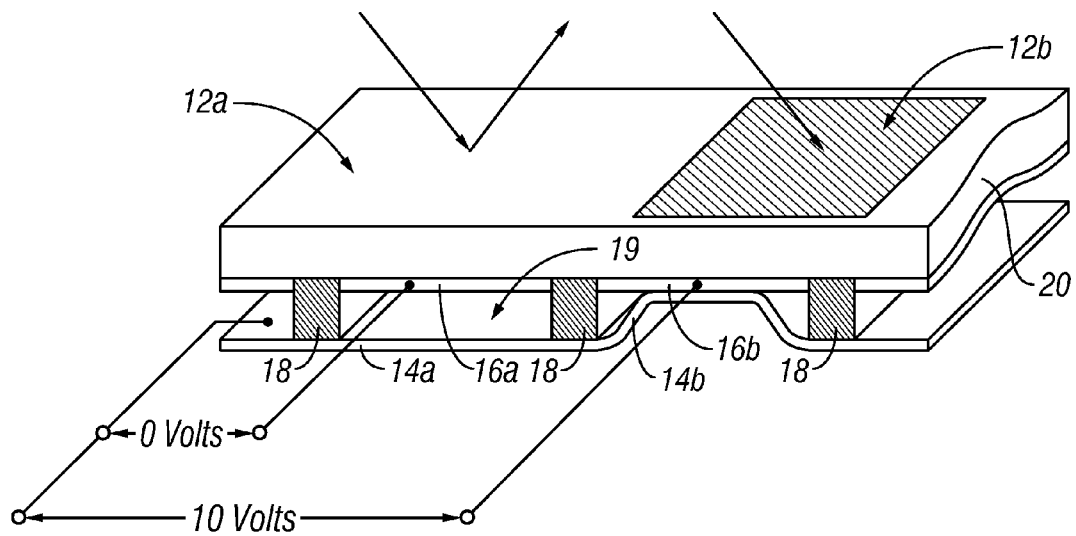
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metallic layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap or cavity 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
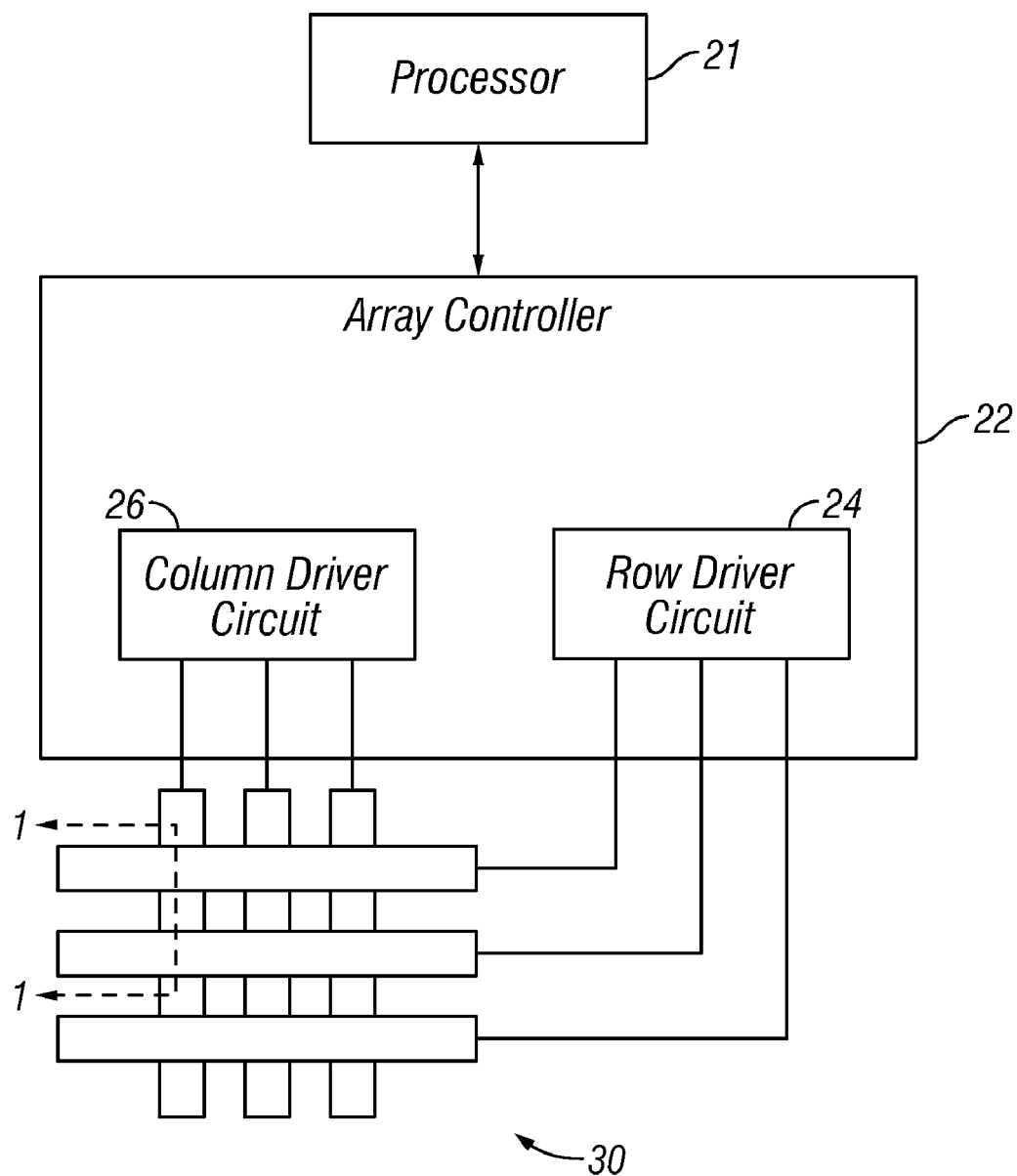
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
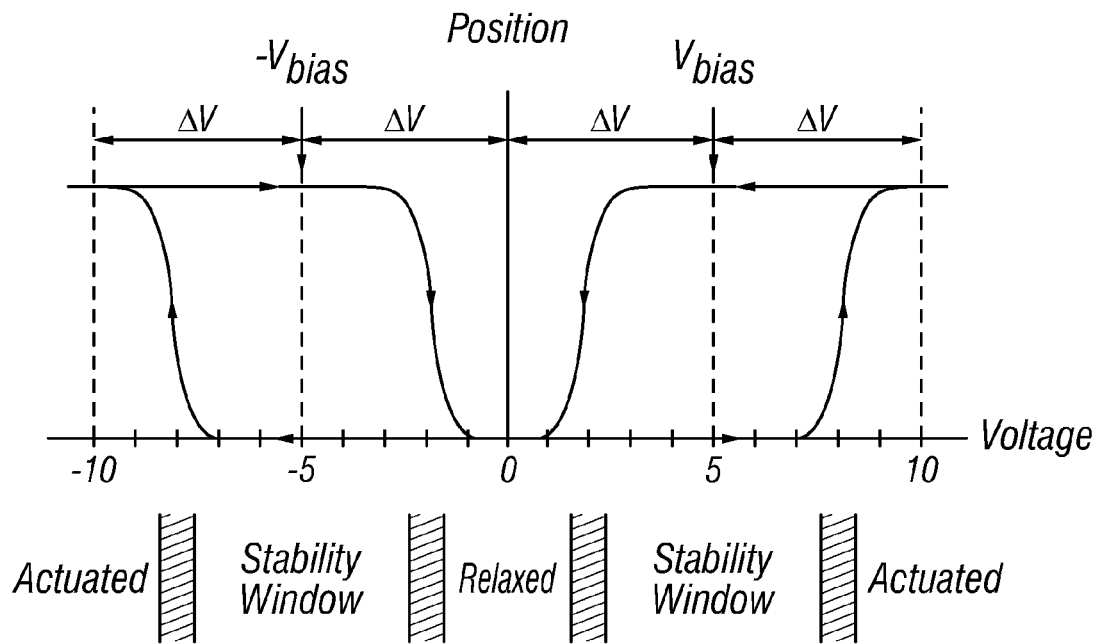
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
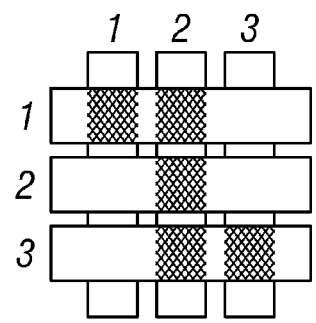
FIGS. 5A and 5B illustrate one exemplary timing diagram for row and column signals that may be used to write a frame of display data to the 3×3 interferometric modulator display of FIG. 2.
Figure 5B:
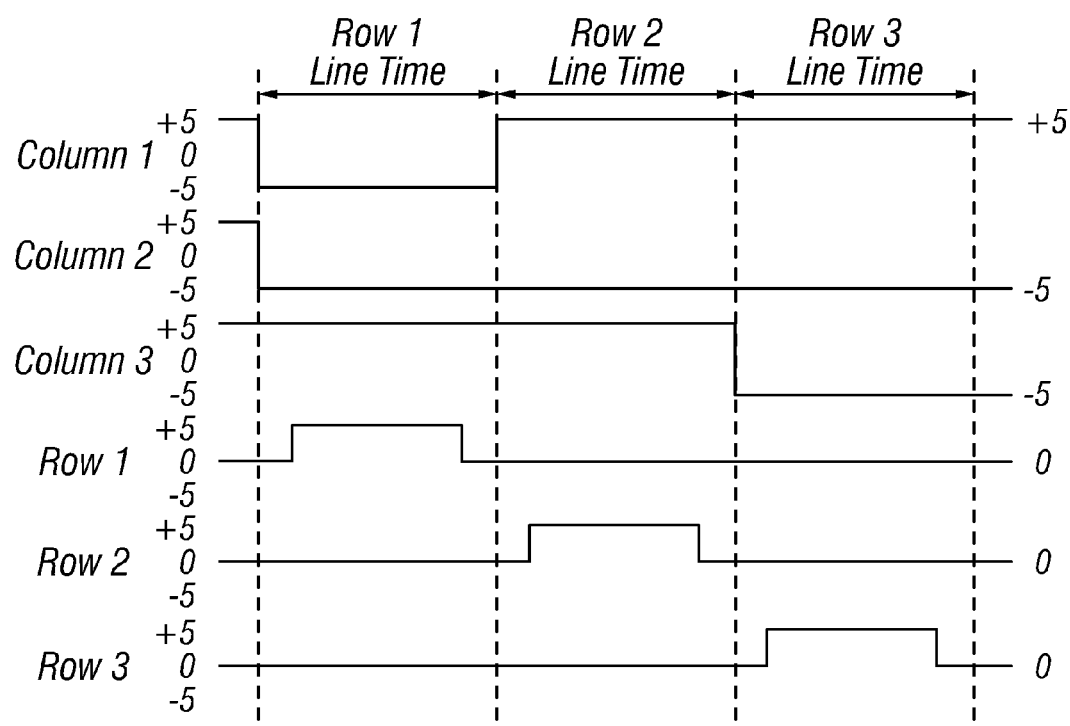

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
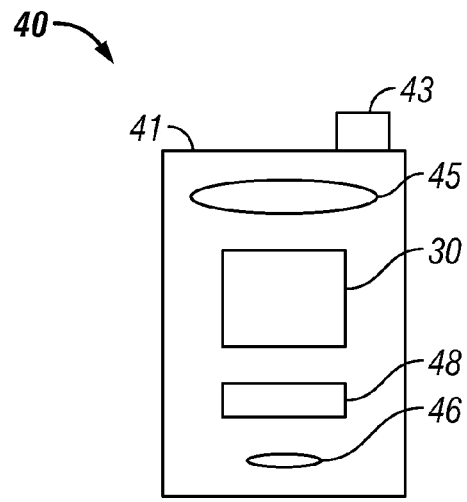
FIGS. 6A and 6B are system block diagrams illustrating an embodiment of a visual display device comprising a plurality of interferometric modulators.
Figure 6B:
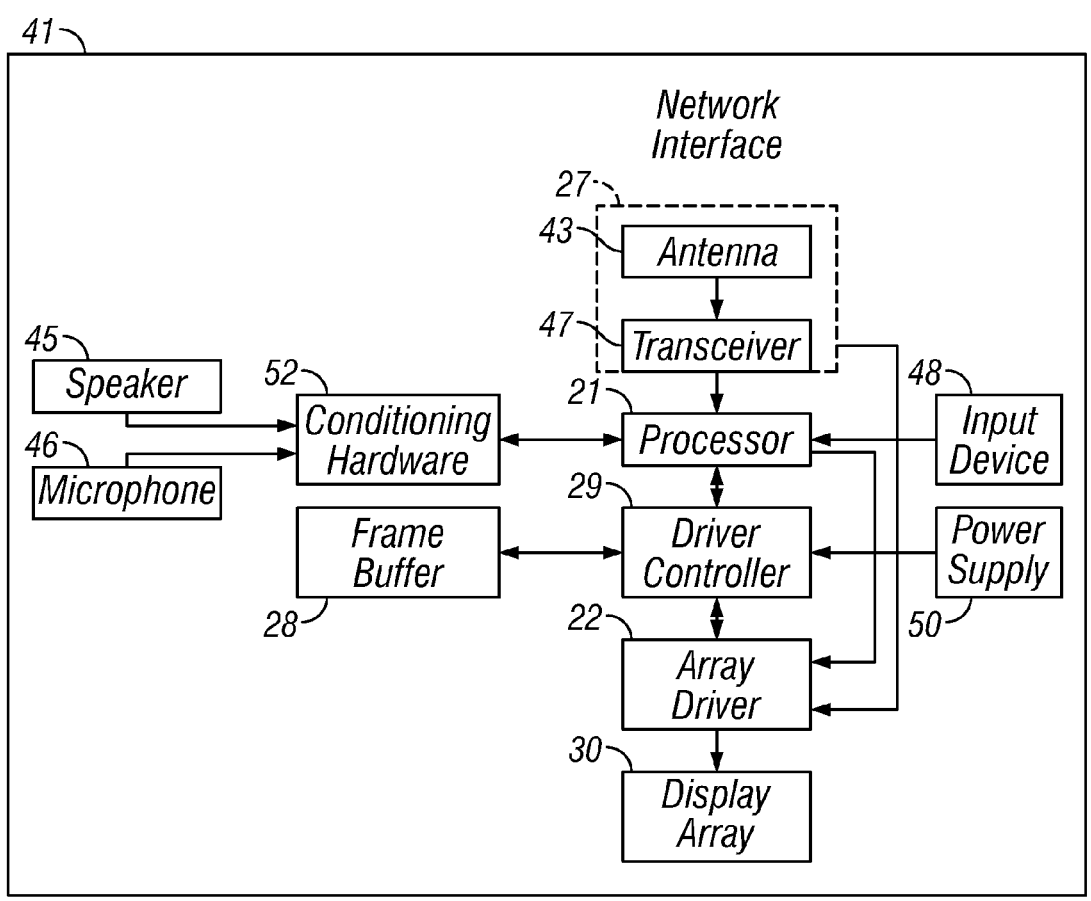

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUE-TOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
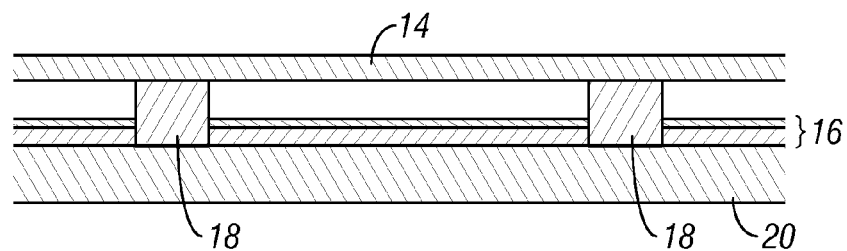
FIG. 7A is a cross section of the device of FIG. 1.
Figure 7B:
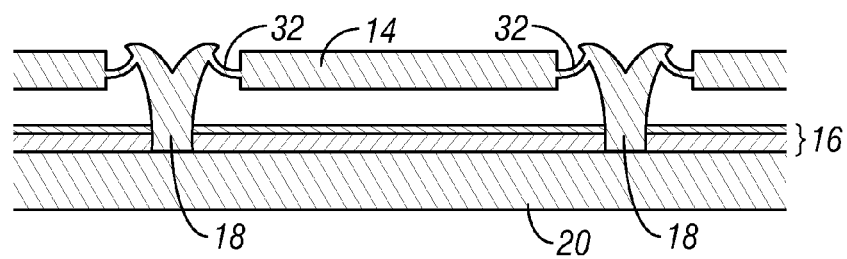
FIG. 7B is a cross section of an alternative embodiment of an interferometric modulator.
Figure 7C:
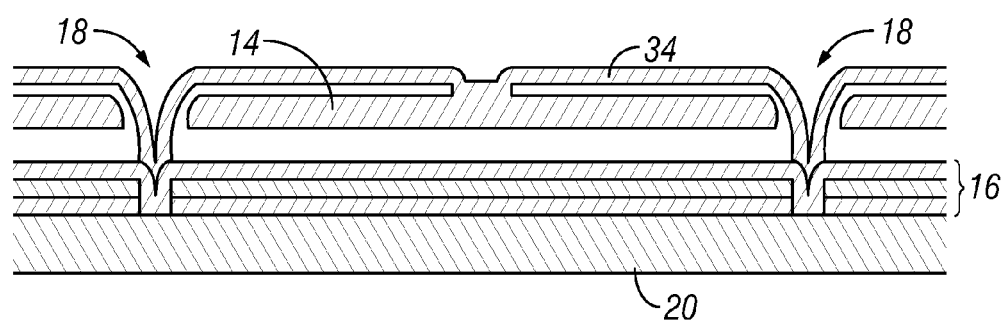
FIG. 7C is a cross section of another alternative embodiment of an interferometric modulator.
Figure 7D:
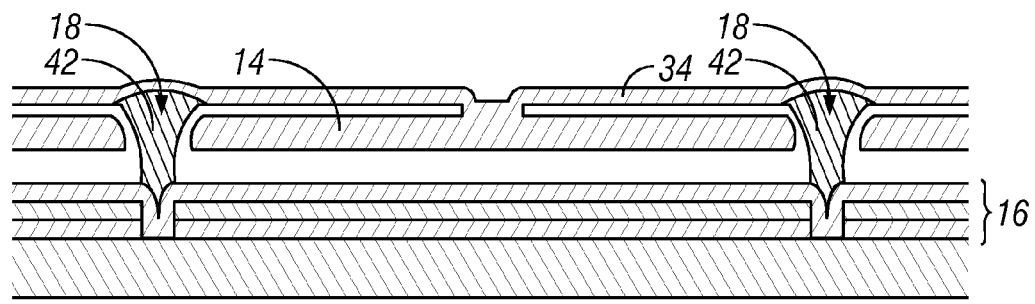
FIG. 7D is a cross section of yet another alternative embodiment of an interferometric modulator.
Figure 7E:
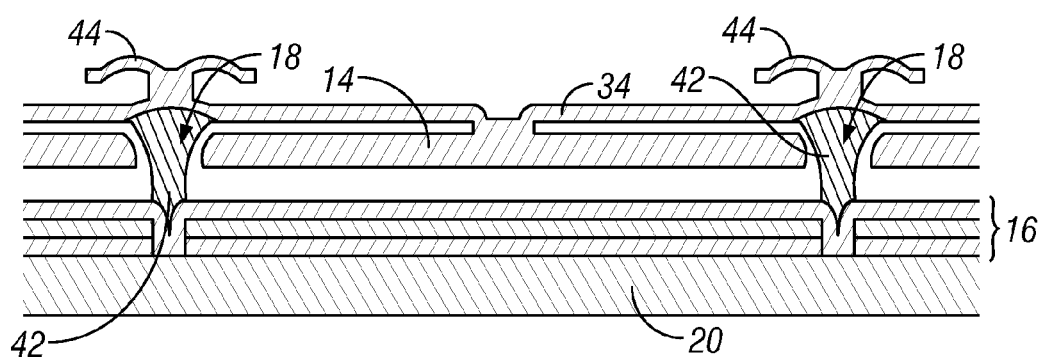
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 at various locations. The connections are herein referred to as support structures or posts 18. The embodiment illustrated in FIG. 7D has support structures 18 including support post plugs 42 upon which the deformable layer 34 rests. The movable reflective layer 14 remains suspended over the cavity, as in FIGS. 7A-7C, but the deformable layer 34 does not form the support posts 18 by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the movable electrode is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

| TABLE OF CONTENTS | |
|---|---|
| I. Manufacturing Interferometric Modulators through Attaching Substrates | 30 |
| II. Formation of Front Substrates | 32 |
|     1. Formation of Shaped Front Substrate | 33 |
|     2. Formation of Patterned Front Substrate | 48 |
|     3. Formation of Preformed Support Front Substrate | 49 |
|     4. Other Column Routing Structures | 50 |
| III. Formation of Back Carriers | 51 |
|     1. Shaped Carriers | 52 |
|         a. Shaped Carrier Backplate | 54 |
|         b. Shaped Removable Carrier | 64 |
|     2. Carriers with Patterned Movable Electrodes | 66 |
|         a. Carrier Backplate with Patterned Movable Electrodes | 66 |
|         b. Removable Carrier with Patterned Movable Electrodes | 70 |
| IV. Lamination | 70 |
|     1. Shaped Carrier Backplate and Shaped Front Substrate | 71 |
|         A. Embodiment A | 71 |
|             a. Routing Option 1 | 72 |
|             b. Routing Option 2 | 74 |
|             c. Routing Option 3 | 75 |
|             d. Routing Option 4 | 76 |
|             e. Packaging and Sealing | 76 |
|         B. Embodiment B | 79 |
|     2. Shaped Carrier Backplate and Patterned Front Substrate | 79 |
|     3. Shaped Carrier Backplate and Preformed Support Front Substrate | 80 |
|     4. Shaped Removable Carrier and Shaped Front Substrate | 81 |

-continued

TABLE OF CONTENTS

| | | |
|---|---|---|
| | 5. Shaped Removable Carrier and Patterned Front Substrate | 82 |
| | 6. Shaped Removable Carrier and Preformed Support Front Substrate | 82 |
| | 7. Carrier Backplate with Patterned Movable Electrodes and Shaped Front Substrate | 83 |
| | 8. Carrier Backplate with Patterned Movable Electrodes and Patterned Front Substrate | 83 |
| | 9. Carrier Backplate with Patterned Movable Electrodes and Preformed Support Front Substrate | 84 |
| | 10. Removable Carrier with Patterned Movable Electrodes and Shaped Front Substrate | 85 |
| | 11. Removable Carrier with Patterned Movable Electrodes and Patterned Front Substrate | 85 |
| | 12. Removable Carrier with Patterned Movable Electrodes and Preformed Support Front Substrate | 85 |
| | 13. Shaped Front Substrate and Traditional Deposition of Movable Electrodes | 86 |
| V. | Spacers for Maintaining Space between Front Substrate and Backplate | 87 |
| VI. | Black Mask | 91 |
| | 1. Patterned Black Mask | 91 |
| | 2. Partial Wetting Black Mask | 92 |
| VII. | Static Interferometric Display | 94 |
| | 1. Static Interferometric Display with Shaped or Preformed Support Front Substrate | 95 |
| | 2. Static Interferometric Display with Shaped or Preformed Backplate | 98 |
| | 3. Static Interferometric Display with Cavity Filler | 100 |
| | 4. Static Interferometric Display with Continuous Depth Cavities | 102 |

I. Manufacturing Interferometric Modulators through Attaching Substrates

In some embodiments, MEMS devices may be made by attaching two substrates, each of which has components preformed thereon. In addition, the two substrates may be separately manufactured by different manufacturers having equipments suitable for making each substrate. Then, the substrates may be assembled together by a third manufacturer. The assembly process can also aid in reducing movable layer leeway and thus cavity size variability from MEMS component to MEMS component across an array, or from array to array. Such flexibility in manufacturing not only reduces the overall costs, but also provides a higher yield. Furthermore, some of the embodiments described hereinbelow facilitate patterning without masking (e.g., photolithography), and can thus reduce the manufacturing costs by avoiding complicated steps to build up topography from multiple thin layers.

MEMS devices made by the processes described herein may have a relatively small gap (e.g., between about 6,500 Å and about 20 μm, and particularly between about 2 μm and about 15 μm or between about 10,000 Å and about 5 μm) between the two substrates thereof. In the embodiments described in this disclosure, a gap between two substrates (i.e., a front substrate and a backplate) generally refers to a gap between the bottom of the deepest trough of the front substrate and a backplate surface facing the front substrate when the backplate overlies the front substrate. The backplate surface is one which is most removed from the front substrate. The "gap between two substrates" will be better understood from description below with respect to the lamination of a shaped carrier backplate and a shaped front substrate. In addition, the MEMS devices may have supports or spacers throughout the array region thereof, not only at their edges. Thus, the MEMS devices are less susceptible to pressure variations. In addition, the relatively small gap requires less sealant between the two substrates, and thus the MEMS devices are less susceptible to moisture leakage, even without a desiccant inside the MEMS devices. Furthermore, the MEMS devices may have a slim profile because of the small gap size.

In embodiments below, MEMS devices are described in the context of optical MEMS devices, particularly interferometric modulators. A skilled artisan will, however, appreciate that the processes described herein have application for other MEMS devices, such as other types of optical MEMS or MEMS electromechanical capacitive switches.

Figure 8:
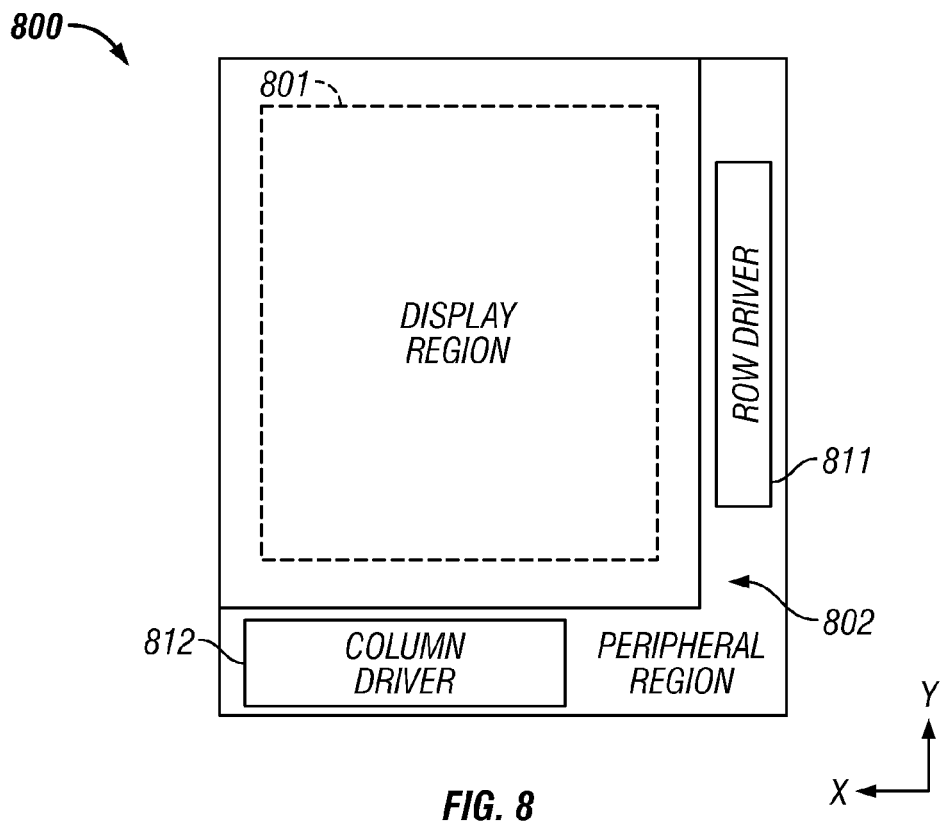
FIG. 8 is a top plan view of one embodiment of an interferometric modulator display device.

FIG. 8 illustrates an interferometric modulator display device 800 in accordance with one embodiment. The interferometric modulator display device 800 includes a display region 801 and a peripheral region 802.

The display region 801 includes a plurality of pixels which are together configured to display an image or a sequence of images. The display region 801 includes row electrodes (not shown) extending substantially parallel to one another, and column electrodes (not shown) extending substantially parallel to one another and substantially perpendicular to the row electrodes. The row and column electrodes are vertically separated and together define a matrix of pixels at the intersections thereof.

The peripheral region 802 surrounds the display region 801. The display region 801 is also referred to herein as an "array region" because it includes an array of individually actuated electrostatic MEMS units. The peripheral region 802 may include driver chip regions and interconnect or routing structures. The device 800 may have a row driver 811 and a column driver 812 mounted on the driver chip regions. The drivers 811 and 812 may be mounted on the driver chip regions using any suitable bonding technique, including, but not limited to, chip-on-glass (COG) bonding, tape carrier package (TCP) attachment, or film-on-glass (FOG) bonding. The routing structures are configured to electrically connect the row and column electrodes to the row and column drivers 811, 812, respectively.

Figure 9:
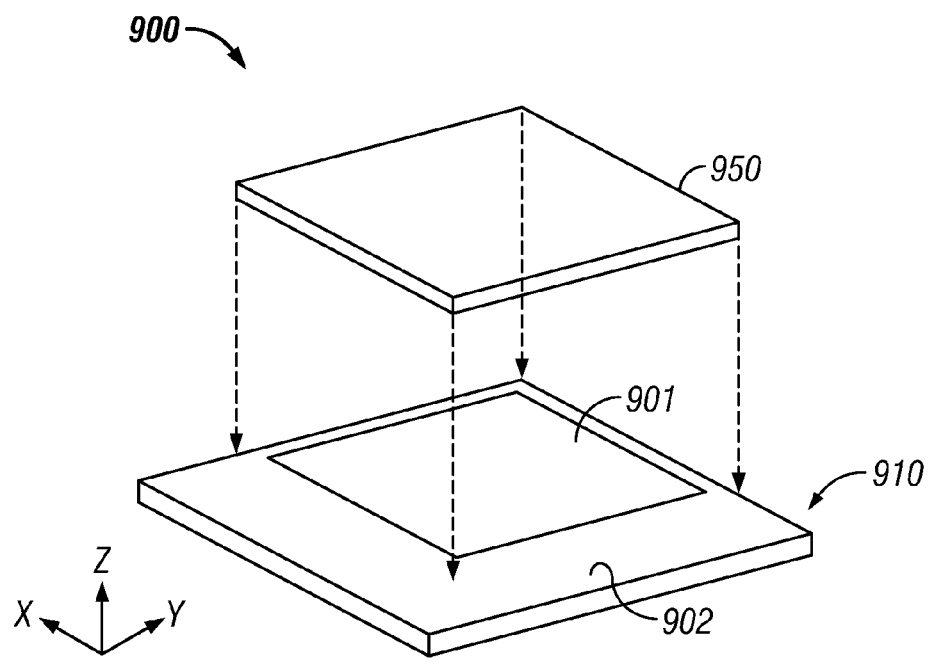
FIG. 9 is an exploded perspective view of one embodiment of an interferometric modulator display device.

The interferometric modulator display device 800 of FIG. 8 may be formed by attaching a front substrate to a backplate. FIG. 9 illustrates a method of making an interferometric modulator display device 900 according to one embodiment. First, a front substrate 910 is provided having a display or array region 901 and a peripheral region 902. The front substrate 910 may include an array of cavities or trenches in the display region 901. The cavities or trenches may each include an optical stack including fixed or stationary electrodes. The front substrate 910 may also include routing structures and driver chip regions in the peripheral region 902, as described with respect to FIG. 8.

Then, a carrier 950 for carrying some functional components of the interferometric modulator display device 900 is attached to the front substrate 910, covering the display region 901 and part of the peripheral region 902 that surrounds the display region 901. In one embodiment, movable electrodes are formed on the carrier 950 prior to attaching the carrier 950 to the front substrate 910. When the front substrate 910 and carrier 950 are attached to each other, the movable electrodes are interposed therebetween. The movable electrodes may be attached to support structures of the front substrate 910, using, for example, anodic bonding, fusion bonding, and analogous methods.

In some embodiments, movable electrodes are formed on a carrier, which can be a removable carrier (see, e.g., FIGS. 35A-35D, and attendant description). In other embodiments the carrier serves as a permanent backplate for the display device 900 (see, e.g., FIGS. 25-34D and 36A-39B, and attendant description). In another embodiment, movable electrodes are formed over the front substrate prior to attaching a permanent backplate to the front substrate. Then, the backplate is attached to the front substrate.

II. Formation of Front Substrates

In making the interferometric modulator display device described above, the front substrate of the device may be formed in various ways. In one embodiment, the front substrate may be prepared by forming cavities or recesses into a surface of a substrate, and then forming an optical stack in the cavities. The cavities may be formed by any suitable process, e.g., embossing, photolithography and etching, and inscribing. In the context of this document, a front substrate formed by such a process is referred to as a "shaped front substrate." Typically, the cavities are demarcated by supports (e.g., rails or posts) that are integrally formed with the substrate for shaped front substrates.

In another embodiment, the front substrate may be prepared by forming an optical stack on a substrate and then forming supports on the optical stack to define cavities. In the context of this document, a front substrate formed by this process is referred to as a "patterned front substrate." Typically, the supports are separate from and formed over the substrate, and can be made of materials different from the substrate for patterned substrates. (See, e.g., FIGS. 22A-22C and attendant descriptions).

In yet another embodiment, the front substrate may be made by forming posts on a substrate to define cavities, and then forming an optical stack in the cavities. In the context of this document, a front substrate formed by this process is referred to as a "preformed support front substrate." Like a patterned front substrate, preformed support front substrates have posts separately from the substrate and can be made of material different from the substrate; unlike patterned front substrates, the optical stacks (including stationary electrodes) are not interposed between the supports and the substrate.

1. Formation of Shaped Front Substrate

Figure 10:
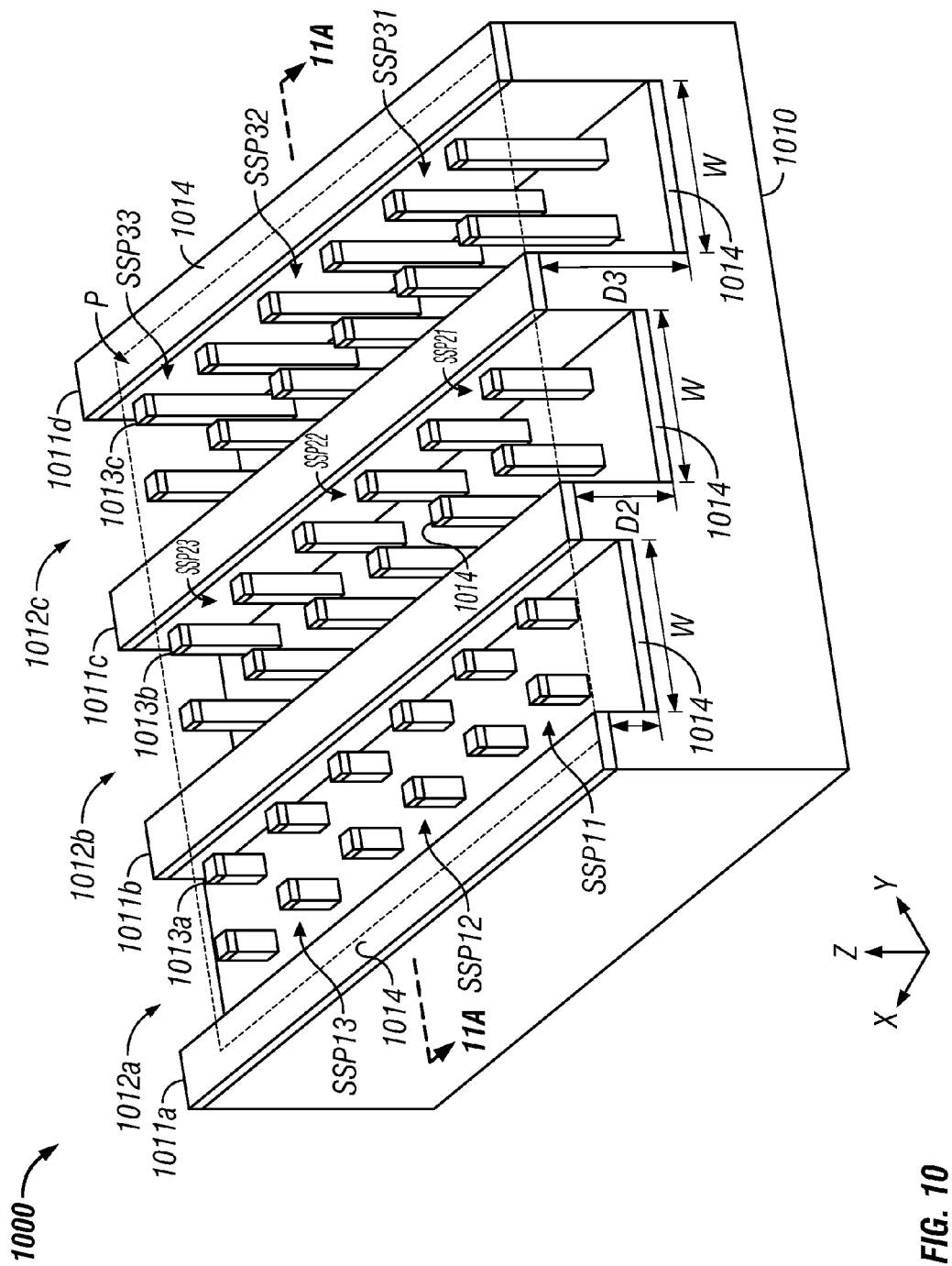
FIG. 10 is a partial perspective view of one embodiment of a shaped front substrate of an interferometric modulator display device.

FIG. 10 is a schematic partial perspective view of a shaped front substrate 1000 according to one embodiment. The illustrated portion of the front substrate 1000 is part of the display region of the front substrate 1000. Therefore, it should be noted that FIG. 10 is only a partial illustration of the display region and thus the structure shown in FIG. 10 is repeated substantially throughout the display region.

The front substrate 1000 includes a substrate 1010 having a plurality of rails 1011a-1011d and a plurality of troughs 1012a-1012c defined between pairs of the rails 1011a-1011d. The substrate 1010 also includes a plurality of posts 1013a-1013c formed in the troughs 1012a-1012c. In the context of this document, the rails 1011a-1011d and the posts 1013a-1013c may be collectively referred to as "supports" or "support structures." The front substrate 1000 also includes optical stacks 1014 (which include stationary electrodes) on the bottom of the troughs 1012a-1012c and the same layers of the optical stacks 1014 on top of the supports 1011a-1011d and 1013a-1013c.

The substrate 1010 may be formed of a substantially transparent material. Examples of the transparent material include, but are not limited to, glass and transparent polymeric materials. In other embodiments for non-optical MEMS devices, the substrate may include a stainless steel plate laminated with a polymeric material (e.g., polyethylene). The substrate 1010 may be shaped by any method suitable for removing or shaping portions of the substrate 1010 or forming recesses into a surface of the substrate 1010. Examples of shaping methods include, but are not limited to, embossing, photolithography and etching, and inscribing. Because the substrate 1010 is shaped without adding an additional material to the substrate 1010 in the methods described above, the supports in the form of the rails 1011a-1011d and the posts 1013a-1013c may be formed integrally with and of the same material as that of the substrate 1010.

The rails 1011a-1011d extend in a row direction α-direction) parallel to one another, as shown in FIG. 10. It will be understood that designation of row/column or XYZ directions are essentially arbitrary, but will be referenced consistently herein. The rails 1011a-1011d have their top surfaces at substantially the same level, i.e., within a single plane.

The troughs 1012a-1012c alternate with the rails 1011a-1011d, extending in the row direction (x-direction) parallel to one another, as shown in FIG. 10. The troughs 1012a-1012c provide cavities or spaces for movable electrodes (not shown) to collapse down towards the front substrate 1010, as will be better understood from description below.

For the illustrated interferometric modulator embodiment, the troughs 1012a-1012c may have a depth between about 600 Å and about 4,000 Å. The troughs 1012a-1012c may have various depths D1, D2, D3, depending on the colors which the troughs 1012a-1012c are designed to produce during operation of the resulting display device. In the illustrated embodiment, the front substrate 1000 has first, second, and third troughs of three different depths D1, D2, D3 for three different colors. The first trough 1012a has the smallest depth and is configured to generate blue (B) color. The first trough 1012a may have a first depth D1 between about 600 Å and about 2,000 Å. The second trough 1012b has an intermediate depth and is configured to generate green (G) color. The second trough 1012b may have a second depth D2 between about 1,000 Å and about 3,000 Å. The third trough 1012c has the greatest depth, and is configured to generate red (R) color. The third trough 1012c may have a third depth D3 between about 2,000 Å and about 4,000 Å. The troughs 1012a-1012c may have a width W between about 10 μm and about 200 μm. A skilled artisan will appreciate that the configurations and depths of the troughs 1012a-1012c may vary depending on the colors and designs of pixels.

The posts 1013a-1013c are formed on the bottom of the troughs 1012a-1012c, extending upward. The posts 1013a-1013c have their top surfaces at substantially the same level (substantially in the same plane) as the tops of the rails 1011a-1011d. Each post 1013a-1013c has a height which corresponds to the depth of the trough 1012a-1012c in which the post 1013a-1013c is positioned. Thus, the posts 1013a-1013c in the troughs 1012a-1012c of different depths have heights different from one another. In the illustrated embodiment, the posts 1013a in the first trough 1012a have a first height corresponding to the first depth D1. The posts 1013b in the second trough 1012b have a second height corresponding to the second depth D2. The posts 1013c in the third trough 1012c have a third height corresponding to the third depth D3.

The posts 1013a-1013c are arranged in a predetermined pattern. As will be better understood from description below, the illustrated portion of the display region of the front substrate 1000 forms a single pixel P which may be replicated across the entire display region in a matrix form. The illustrated pixel P has a substantially square form. The pixel P includes a first subpixel SP1, a second subpixel SP2, and a third subpixel SP3, each of which is in a rectangular form. Each of the subpixels SP1-SP3 includes sub-subpixels SSP11-SSP13, SSP21-SSP23, or SSP31-SSP33. Each sub-subpixel SSP11-SSP13, SSP21-SSP23, SSP31-SSP33 includes a group of four posts to provide support for a movable electrode (not shown). The posts 1013a-1013c are spaced apart from one another to allow the movable electrode to bend down therebetween. In the illustrated embodiment, each of the sub-subpixels SSP13, SSP21-SSP23, SSP31-SSP33 has four posts positioned near free edges of the sub-subpixel when viewed from above.

The optical stacks 1014 may include several fused layers. In one embodiment, the optical stacks 1014 may include a transparent conductive layer and a dielectric layer overlying the transparent conductive layer. The transparent conductive layer may be formed of indium tin oxide (ITO). The dielectric layer may be formed of silicon dioxide. In another embodiment, the dielectric layer may have a two-layered structure, including an upper sublayer and a lower sublayer. In certain embodiments in which the dielectric layer is exposed to a fluorine etchant for any sacrificial layer release steps, the upper sublayer may be formed of a protective material such as aluminum oxide. The lower sublayer may be formed of silicon dioxide. In one embodiment, the transparent conductive layer may have a thickness between about 10 Å and about 800 Å. The dielectric layer may have a thickness between about 100 Å and about 1,600 Å. In the embodiment in which the dielectric layer has upper and lower sublayers, the upper sublayer may have a thickness of, for example, about 50 Å, while the lower sublayer may have a thickness of, for example, about 450 Å. In the illustrated embodiment, the optical stacks 1014 are discontinuous between the bottom of the troughs 1012a-1012c and the top of the supports 1011a-1011d and 1013a-1013c.

The conductive layers of the optical stacks 1014 on the bottom of the troughs 1012a-1012c are electrically isolated from one another by the rails 1011a-1011d. The electrically isolated conductive layers form row electrodes of the resulting interferometric modulator display device.

In certain embodiments, the optical stacks 1014 may also include a metallic absorber layer (or a partially reflective layer) between the transparent conductive layer and the dielectric layer. The absorber layer may be formed of a semi-transparent thickness of metal, such as chromium (Cr), molybdenum (Mo), or Mo/Cr. In another embodiment for a broad-band white interferometric modulator, the absorber layer may be replaced with a semiconductor layer, such as a germanium layer. The absorber or semiconductor layer may have a thickness between about 1 Å and about 100 Å, particularly between about 50 Å and about 100 Å.

Figure 11A:
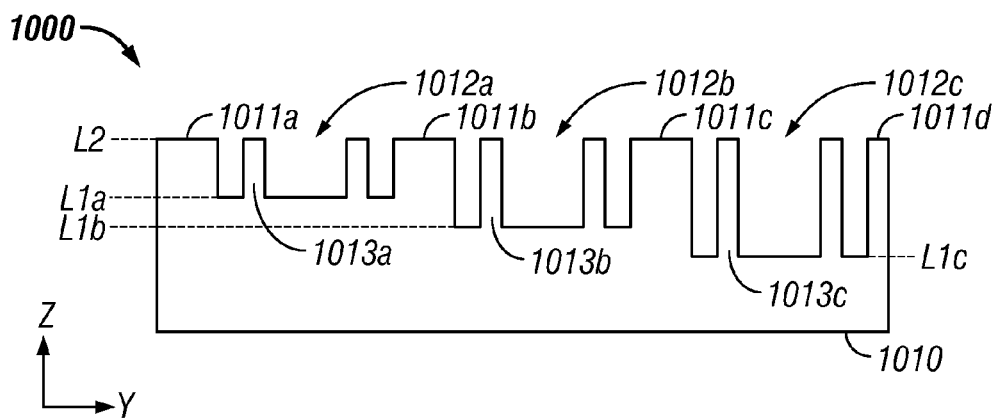
FIG. 11A is a cross section of the shaped front substrate of FIG. 10 without an optical stack.

FIG. 11A is a cross section of the front substrate 1000 (without the optical stacks 1014) of FIG. 10, taken along the lines 11A-11A. Because of the difference in the depths, the troughs 1012a-1012c have their bottom surfaces at different levels, L1a, L1b, L1c, respectively. However, because the supports 1011a-1011d and 1013a-1013c have different heights corresponding to the depths of the troughs 1012a-1012c, the top surfaces of the supports 1011a-1011d and 1013a-1013c are at substantially the same level L2, i.e., substantially in the same plane.

Optical stacks on top of the supports 1101a-1101d, 1013a-1013c can serve as "black masks." The optical stacks provide the same optical effect at all times as interferometric modulators in their collapsed state. The optical stacks can provide black color. In other embodiments, the optical stacks can provide white color, depending on the interferometric modulator design.

Figure 11B:
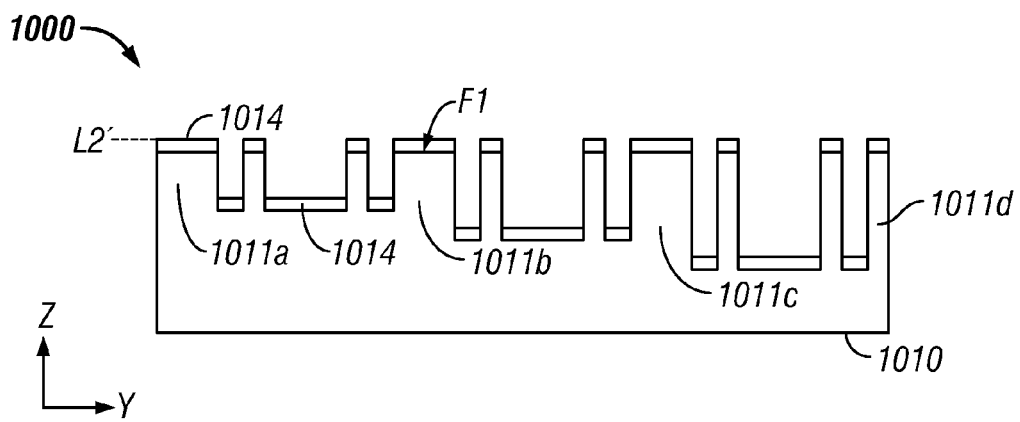
FIG. 11B is a cross section of the shaped front substrate of FIG. 11A after deposition of an optical stack.

FIG. 11B is the cross section of FIG. 11A, after deposition of the optical stacks 1014. Because of the optical stacks 1014, the uppermost point of the front substrate 1000 is at a level L2' which is higher than the level L2 by the thickness of the optical stacks 1014.

Figure 12A:
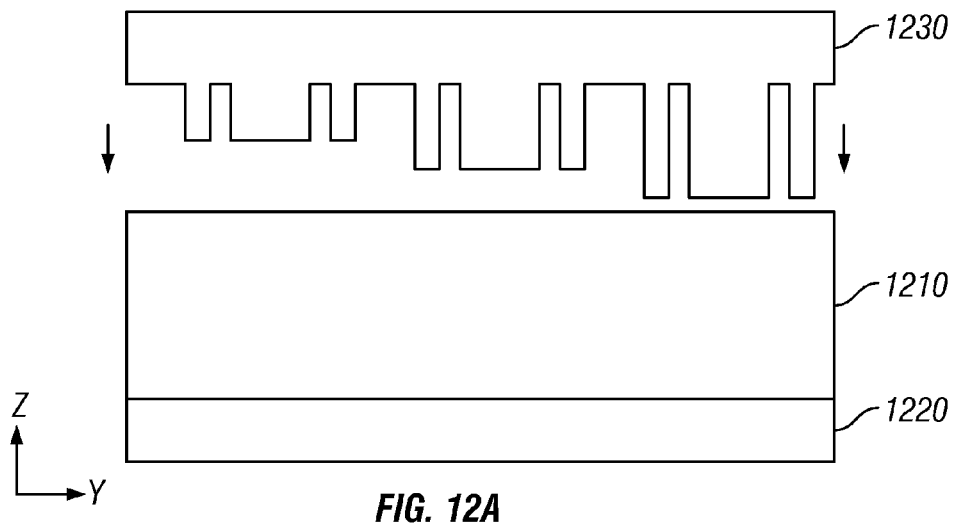
FIGS. 12A-12D illustrates one embodiment of a method of forming a shaped front substrate like that of FIGS. 10-11B.

FIGS. 12A-12D are cross sections illustrating a method of forming a shaped front substrate according to one embodiment. The illustrated method uses embossing for shaping the front substrate. As shown in FIG. 12A, a substantially flat substrate 1210 is placed on a platen 1220. The substrate 1210 may be formed of glass or other material, preferably transparent, that is readily made malleable for shaping. The illustrated platen 1220 may be formed of a metallic material. The substrate 1210 may be heated such that the substrate 1210 is soft enough to impress at a subsequent embossing step. The substrate 1210 may be heated to a temperature which varies depending on the material used for the substrate 1210.

Figure 12B:
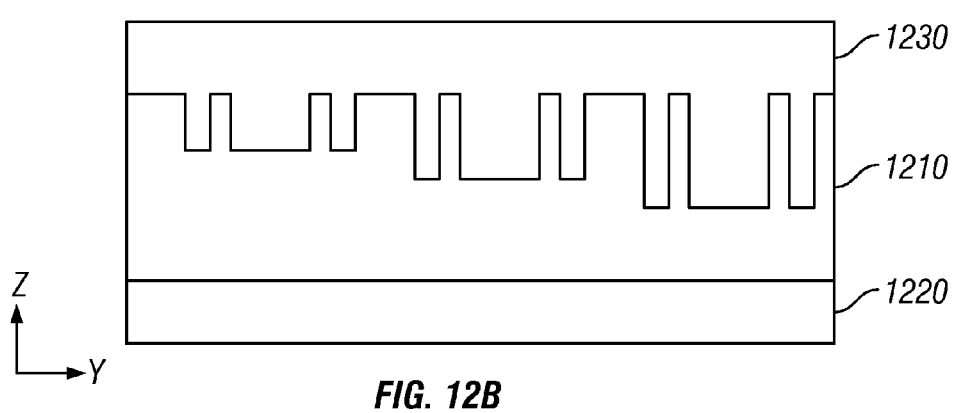

Then, an embossing plate 1230 is pressed onto the softened substrate 1210, as shown in FIG. 12B. The embossing plate 1230 has recesses and protrusions shaped to define rails, troughs, and posts on the substrate 1210. The embossing plate 1230 may be formed of a metallic material. In certain embodiments, at least one of the platen 1220 and the embossing plate 1230 may be in a form of a rotating cylinder. A skilled artisan will appreciate that various other configurations of embossing techniques may also be adapted for shaping the front substrate 1210.

Figure 12C:
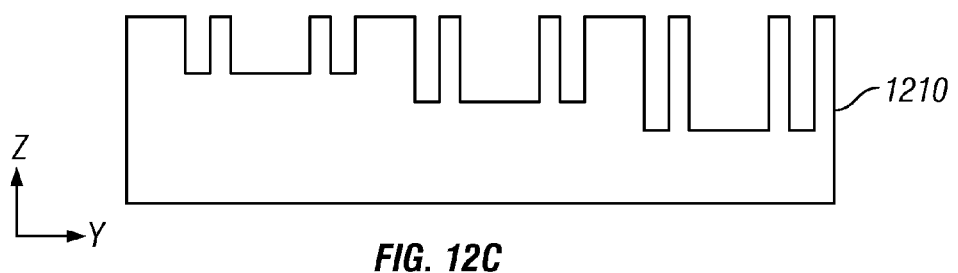

Then, the embossing plate 1230 is removed from the front substrate 1210. Subsequently, the embossed front substrate 1210 is removed from the platen 1220. The resulting front substrate 1210 is shown in FIG. 12C.

In another embodiment, the front substrate 1210 may be shaped by selectively removing portions of a substrate using photolithography and etching technique. In yet another embodiment, the front substrate 1210 may be shaped by first inscribing predetermined portions of a substrate and then selectively etching the portions. The term "inscribing" may be used interchangeably with marking or scoring. Inscribing may be conducted using various techniques, e.g., machining or laser-inscribing. An automatic inscribing method is available from Nippon Sheet Glass, Co., Ltd, Tokyo, Japan. The embossing technique shown in FIGS. 12A-12D can be conducted without a masking process. In addition, a patterned plate can be repeatedly used for many substrates. It will be appreciated that various other techniques may also be used for shaping the front substrate 1210.

Subsequently, optical stack materials are sequentially deposited substantially across the shaped front substrate 1210. The optical stack materials can be deposited using any suitable technique, e.g., sputtering, such that the optical stack 1214 is deposited on the tops of supports and on the bottoms of troughs, but is not conformal enough for continuous sidewall coverage. This configuration can apply to any MEMS device (optical or non-optical MEMS device). The optical stacks on top of the supports can serve as a "black mask" for an optical MEMS device. The configuration of the optical stacks 1214 may be as described above with respect to the optical stacks 1014 of FIG. 10.

Figure 13:
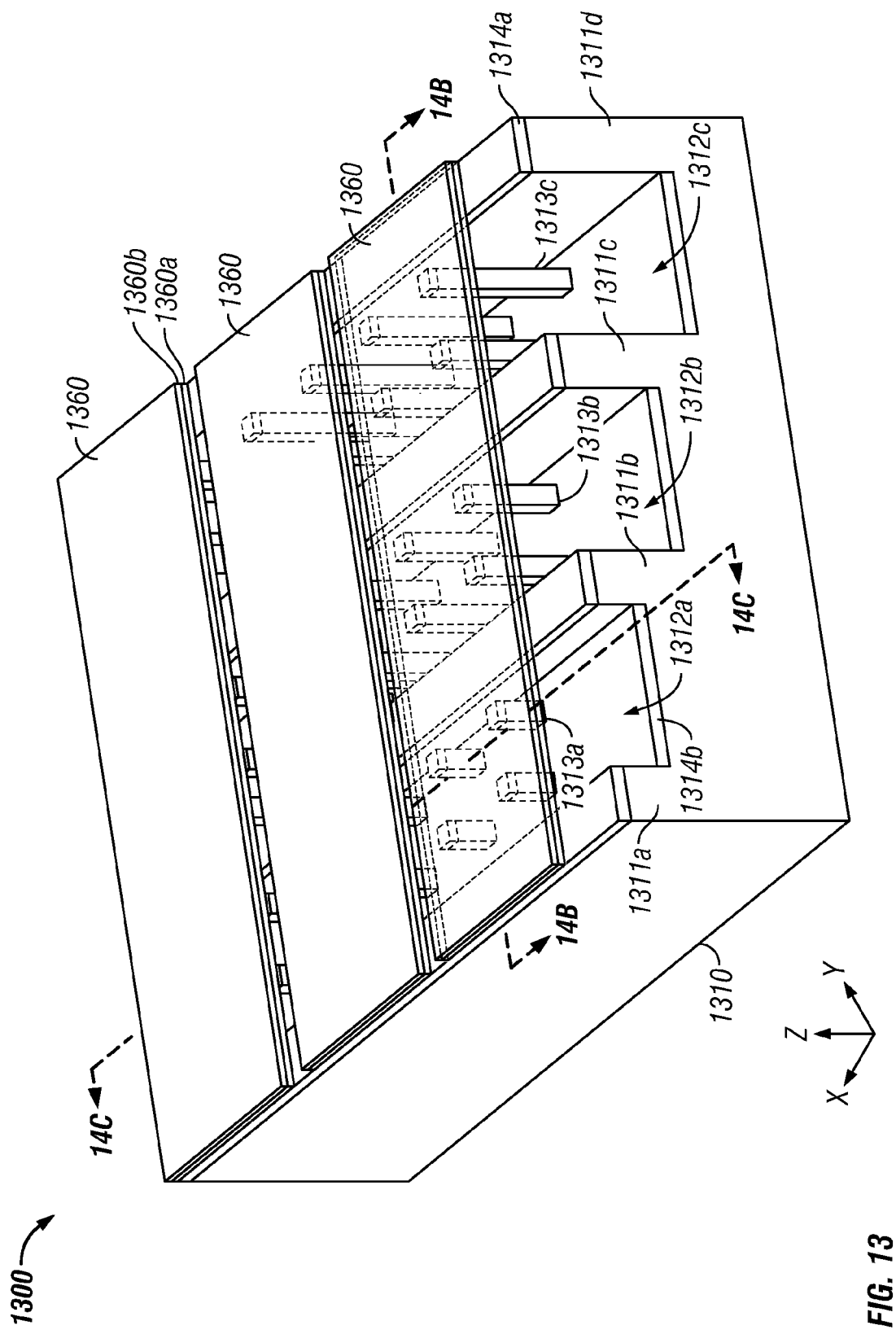
FIG. 13 illustrates a partial perspective view of an array or display region of a partially fabricated interferometric modulator display device according to one embodiment.
Figure 14A:
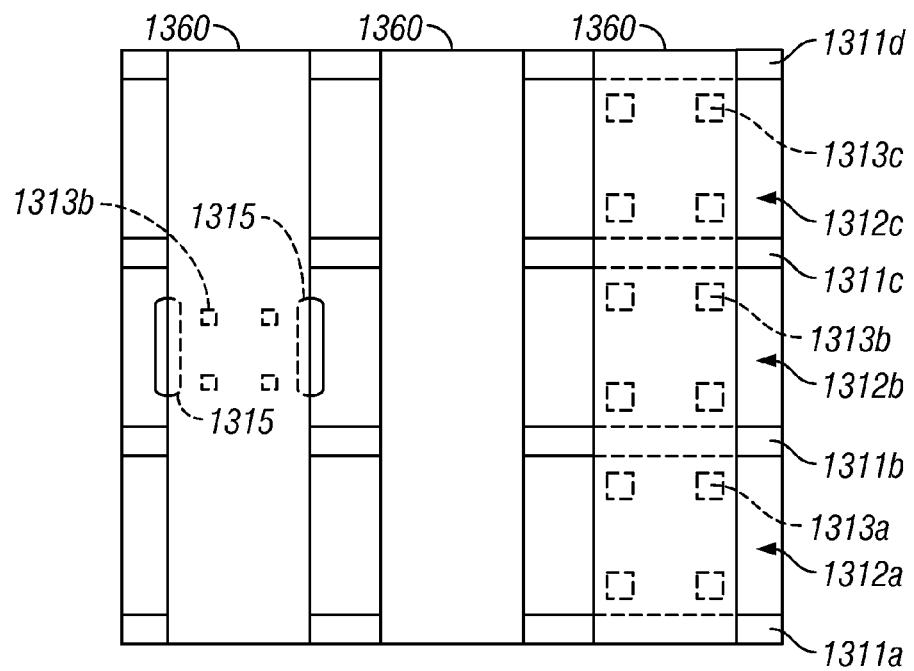
FIG. 14A is a top plan view of the partially fabricated interferometric modulator display device of FIG. 13.

FIG. 13 is a partial perspective view of one embodiment of a partially fabricated interferometric modulator display device 1300 including a front substrate 1310 with movable electrodes 1360 arranged thereon. The configuration of the front substrate 1310 may be as described above with respect to the front substrate 1000 of FIG. 10. The movable electrodes 1360 run substantially parallel to one another and substantially perpendicular to troughs 1312a-1312c of the front substrate 1310, as shown in FIGS. 13 and 14A. In the illustrated embodiment, the movable electrodes 1360 and the troughs 1312a-1312c intersect with each other, defining sub-subpixels described above with reference to FIG. 10. In other embodiments, a single movable electrode (instead of the three movable electrodes 1360 of FIG. 13) may cover substantially the entire illustrated portion of the front substrate 1310, thereby defining a single pixel.

Figure 14B:
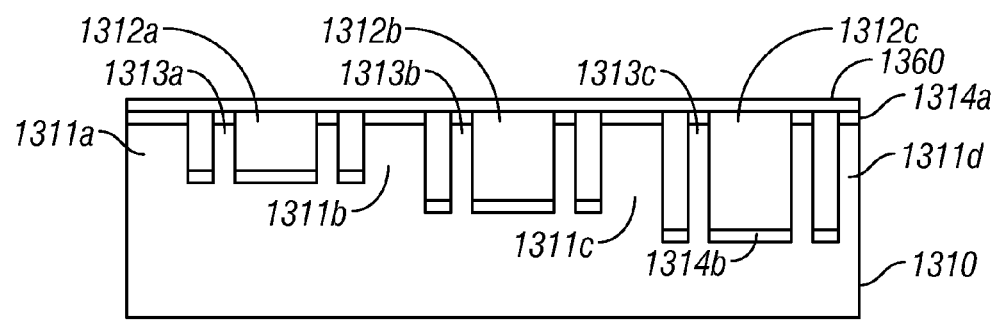
FIG. 14B is a cross section of the partially fabricated interferometric modulator display device of FIG. 13, taken along lines 14B-14B.
Figure 14C:
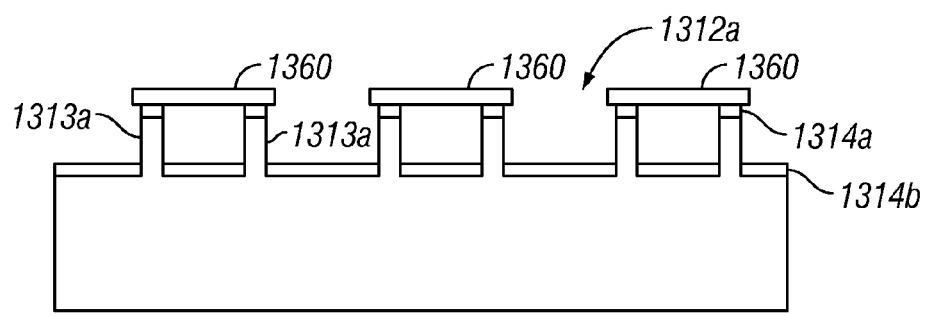
FIG. 14C is a cross section of the partially fabricated interferometric modulator display device of FIG. 13, taken along lines 14C-14C, with a back wall formed by continuous rails omitted for clarity.

In the embodiment of FIGS. 13, and 14A-14C, the movable electrodes 1360 are supported on rails 1311a-1311c and posts 1313a-1313c of the front substrate 1310 with intervening optical stacks 1314a, as shown in FIGS. 13 and 14B (a cross section of the device of FIG. 13, taken along lines 14B-14B). FIG. 14C (another cross section of the device of FIG. 13, taken along lines 14C-14C) also illustrates that the movable electrodes 1360 are supported on the posts 1313a-1313c of the front substrate 1310 with the intervening optical stacks 1314a. In certain embodiments, edge spacers 1315 (FIG. 14A) may be provided on the bottom of the troughs 1312a-1312c to further support the movable electrodes 1360. The edge spacers 1315 may be positioned at edges of each pixel while being laterally spaced from the posts 1313a-1313c.

Figure 14D:
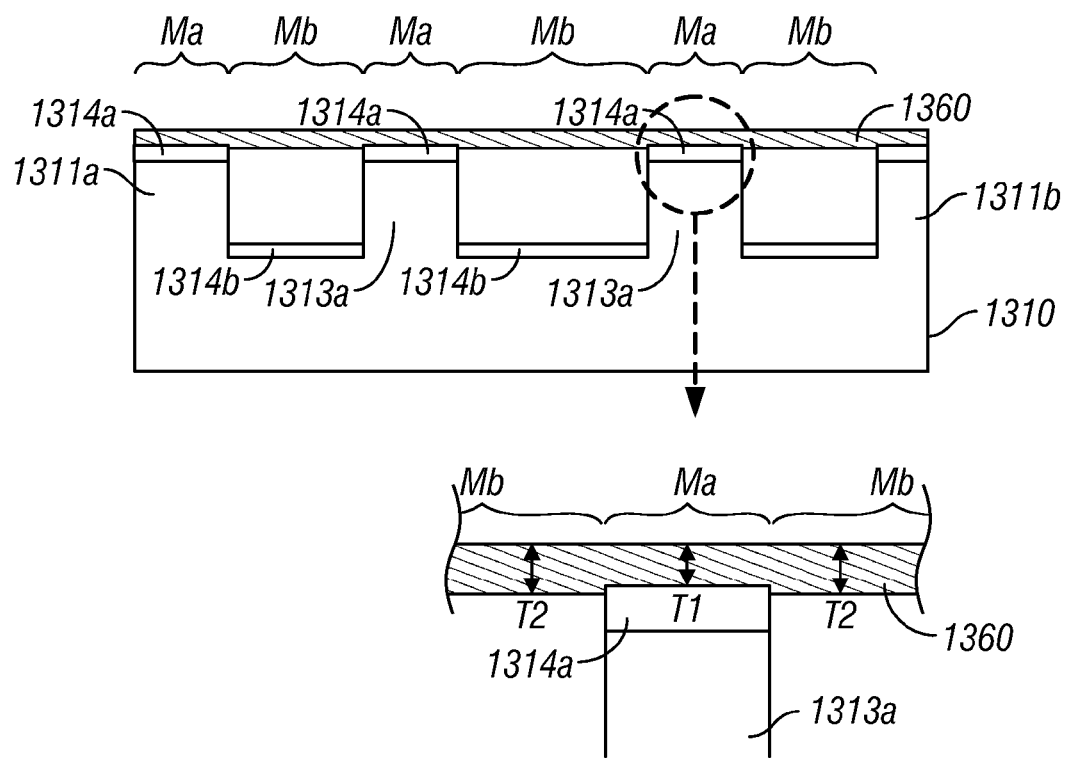
FIG. 14D is an enlarged cross section of the partially fabricated interferometric modulator display device of FIG. 14B.

FIG. 14D is a partial enlarged cross-section of the front substrate 1310 of FIG. 14B with a movable electrode 1360 formed thereon. The movable electrode 1360 is supported on top of the optical stacks 1314a on the support structures (e.g., the rails 1311a-1311c and the posts 1313a-1313c) of the front substrate 1310. The illustrated movable electrode 1360 has first portions Ma overlying the support structures and second portions Mb between the first portions Ma. The second portions Mb do not overlie the support structures. The first portions have a first thickness T1 while the second portions have a second thickness T2.

As described above with reference to FIG. 9, the movable electrode 1360 is formed on a carrier prior to being attached to the front substrate 1310. In order to attach the movable electrode 1360 to the front substrate 1310, the carrier is pressed against the front substrate 1310 with the movable electrode 1360 interposed therebetween. Portions (e.g., the first portions Ma described above) of the movable electrode 1360 which contact the support structures may be compressed, particularly where the movable electrode 1360 is deformable or malleable. As a result, the first thickness T1 of the first portions Ma of the movable electrode 1360 may be thinner than the second thickness T2 of the second portions Mb thereof. In one embodiment, the first thickness T1 may be from about 200 Å to about 2,000 Å. The second thickness T2 may be from about 200 Å to about 2,000 Å. A difference between the first thickness T1 and the second thickness T2 may be from about 5 Å to about 100 Å. The difference between the first and second thicknesses T1 and T2 can vary depending on the pressure applied when attaching the movable electrode 1360 to the front substrate 1310.

Returning to FIG. 13, the illustrated movable electrodes 1360 are elongated or strip-shaped, each spanning multiple MEMS units or pixels in a column. The elongated movable electrodes 1360 may have a length and a width. A ratio of the length to the width of the movable electrodes 1360 is roughly on the same order as about x:1 where x is three times the number of pixels in a column across a display array. In one embodiment, the length-to-width ratio of the movable electrodes 1360 is between about 10:1 and about 1,000,000:1. The movable electrodes 1360 may include a reflective layer (or minor) 1360a and a mechanical (or deformable) layer 1360b. The reflective layer 1360a may be attached or fused to the mechanical layer 1360b; in other arrangements, the reflective layer may be suspended from the mechanical layer (see, e.g., FIGS. 7C-7E). The reflective layer 1360a may be formed of a specular or reflective metal, for example, Al, Au, Ag, or an alloy of the foregoing, and is thick enough to reflect substantially all visible light incident upon the front substrate 1310 for interferometric effect. The mechanical layer 1360b may be formed of Ni, Cu, Pt, Au, Al, or an alloy of the foregoing. The mechanical layer 1360b may have a thickness that is sufficient to provide mechanical support while being sufficiently thin and flexible to allow the movable electrodes 1360 to move toward the optical stacks 1314b on the bottom of the troughs 1312a-1312c. The mechanical layer 1360b may have a thickness between several hundred angstroms and several thousand angstroms. In an exemplary embodiment, the reflective layer 1360a has a thickness of about 300 Å, and the mechanical layer 1360b has a thickness of about 1000 Å. The thicknesses of the layers 1360a and 1360b may be different in other embodiments. In certain embodiments where the MEMS device is used as an electromechanical capacitive switch, the movable electrodes may include a substantially electrically conductive material.

Figure 15:
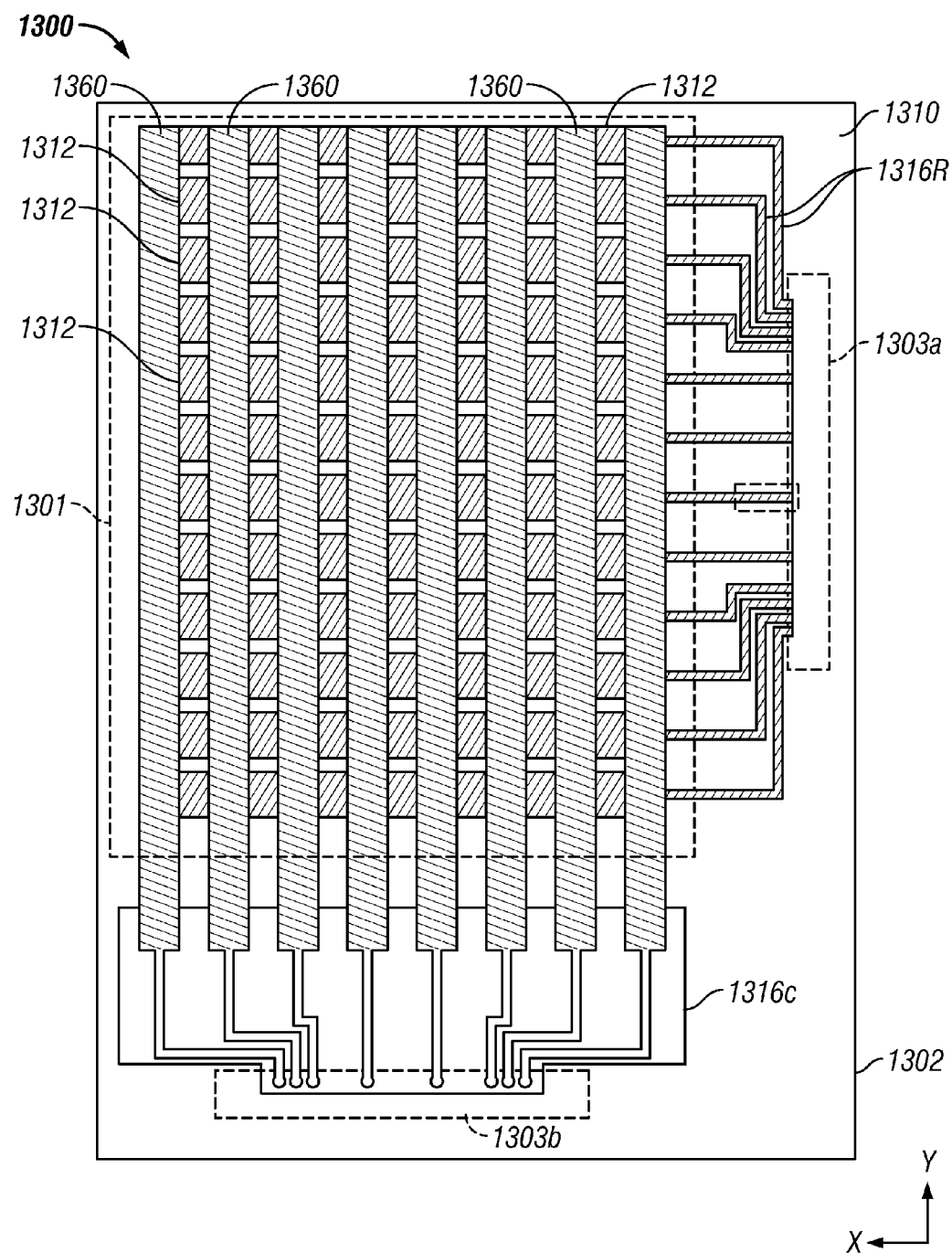
FIG. 15 is a top plan view of a partially fabricated interferometric modulator display device according to one embodiment, schematically illustrating interconnects for row and column drivers.

FIG. 15 is a schematic top plan view of the partially fabricated interferometric modulator display device 1300 of FIG. 13. The device 1300 includes the front substrate 1310 and the plurality of movable electrodes 1360 formed thereon.

The front substrate 1310 includes a display region 1301 and a peripheral region 1302. The front substrate 1310 includes a plurality of troughs 1312 extending parallel to one another in the display region 1301, the troughs including stationary electrodes at their bottoms. The front substrate 1310 also includes a plurality of routing trenches 1316R, 1316C and driver chip regions 1303a, 1303b in the peripheral region 1302. The routing trenches include row routing trenches 1316R and column isolation trenches 1316C. The driver chip regions include a row driver chip region 1303a and a column driver chip region 1303b. The movable electrodes 1360 run substantially parallel to one another and substantially perpendicular to the troughs 1312 of the front substrate 1310.

Figure 16A:
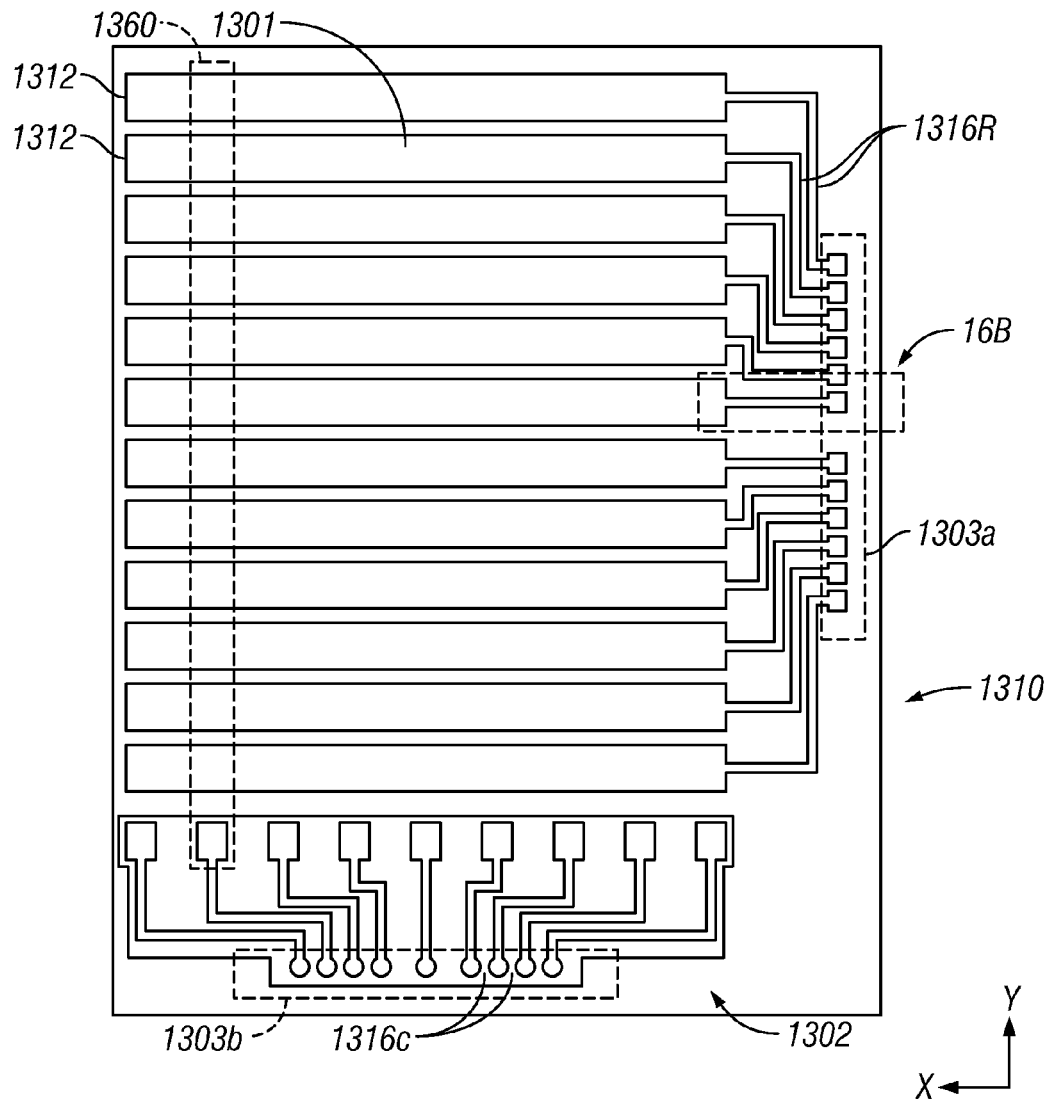
FIG. 16A is a top plan view of a shaped front substrate having column and row routing structures according to one embodiment.

FIG. 16A is a top plan view of the front substrate 1310 of FIG. 15 with the position of just one movable electrode 1360, shown in phantom. As described above, the front substrate 1310 includes the troughs 1312 in the display region 1301 and the row routing trenches 1316R and the column isolation trenches 1316C in the peripheral region 1302. The row routing trenches 1316R extend from the troughs 1312 to the row driver chip region 1303a. The column isolation trenches 1316C extend from near the display region 1301 to the column driver chip region 1303b such that one end of each trench is proximate to a corresponding one of the movable electrodes 1360.

Figure 16B:
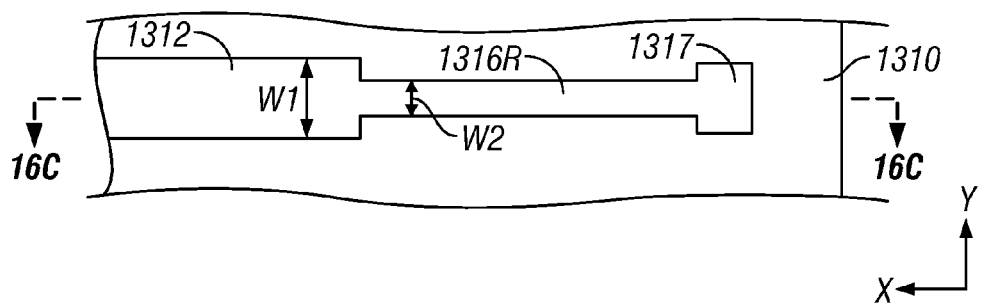
FIG. 16B is an enlarged top plan view of one of the row routing structures of FIG. 16A.
Figure 16C:
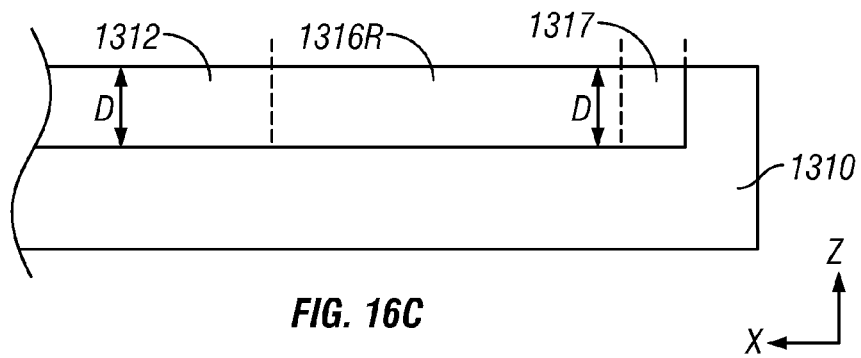
FIG. 16C is a cross section of the row routing structure of FIG. 16B, taken along lines 16C-16C, according to one embodiment.
Figure 16D:
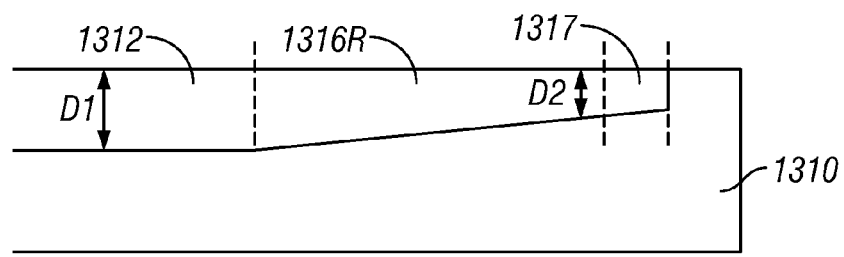
FIG. 16D is a cross section of the row routing structure of FIG. 16B, taken along lines 16C-16C, according to another embodiment.

FIG. 16B is an enlarged top plan view of one of the troughs 1312 and a corresponding one of the row routing trenches 1316R of FIG. 16A, denoted by 16B. The trough 1312 has a width W1. The row routing trench 1316R has a width W2 smaller than the width W1 of the trough 1312. The front substrate 1310 also includes a contact trench 1317 connected to the row routing trench 1316R. The contact trench 1317 is shaped to accommodate a connecting bump or anisotropic conductive film (not shown) of a row driver which will provide electrical signals to the pixels of the resulting interferometric modulator display device. While illustrated as square or rectangular in FIG. 16B, in other embodiments, the front substrate 1310 may have contact trenches of various other shapes and configurations. The trough 1312, the row routing trench 1316R, and the contact trench 1317 have substantially the same depth D, as shown in FIG. 16C. In other embodiments, one of the trough 1312, the row routing trench 1316R, and the contact trench 1317 may have a different depth from the others. Referring to FIG. 16D, in another embodiment, the routing trench 1316R may have a decreasing depth D2 or ramped bottom as it extends from the trough 1312 to the contact trench 1317. In an embodiment in which the substrate is shaped by inscribing, such a depth variation can be made by varying pressure during inscribing. It will be appreciated that the depths and widths of the trough 1312, the row routing trench 1316R, and the contact trench 1317 may vary widely depending on the structure and dimension of the front substrate 1310 and driver chips provided thereto.

Figure 16E:
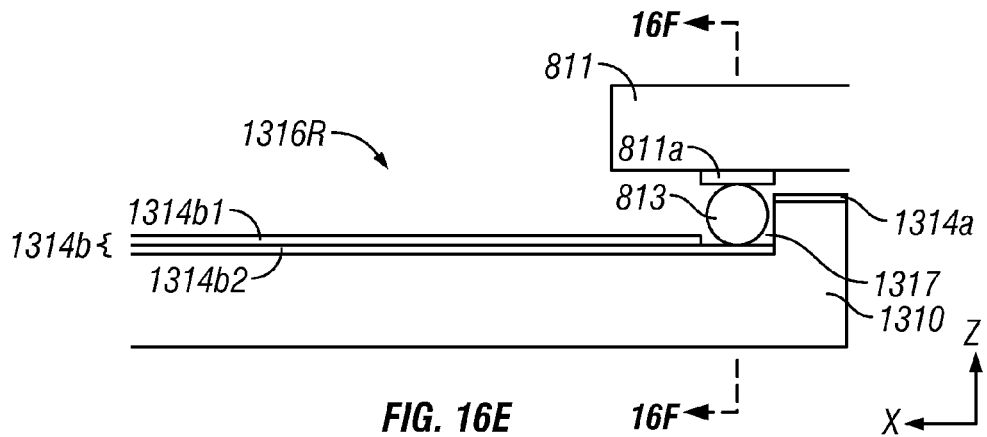
FIG. 16E is a cross section of the row routing structure of FIG. 16B and a row driver with an anisotropic conductive film interposed therebetween according to one embodiment.

FIG. 16E is a cross section of the bare front substrate 1310 of FIG. 16C after processing to form the optical stacks 1314a, 1314b with a row driver 811 mounted thereon. The driver 811 includes a plurality of electrical leads 811a facing downward as shown in FIG. 16E. The illustrated portion of the front substrate 1310 includes the row routing trench 1316R and the contact trench 1317. The front substrate 1310 also includes optical stacks 1314a, 1314b on top of the peripheral region and on the bottom of the row routing trench 1316R. The optical stack 1314b on the bottom of the row routing trench 1316R includes a dielectric layer 1314b1 and an underlying conductive layer 1314b2. The configuration of the optical stack 1314b may be as described above with respect to the optical stacks 1014 of FIG. 10. The conductive layer 1314b2 extends into the contact trench 1317 while the dielectric layer 1314b1 does not. This configuration exposes the conductive layer 1314b2 in the contact trench 1317, and thus allows electrical connection between the conductive layer 1314b2 and a corresponding one of the leads 811a of the row driver 811. A variety of techniques can be used for exposing the conductor 1314b2 in the contact trench 1317, including shadow mask techniques described below with respect to FIGS. 20 and 21.

In the illustrated embodiment, the electrical connection is provided by an anisotropic conductive film (ACF). The ACF includes conductive particles 813 dispersed in a polymeric or organic film (not shown). In establishing the electrical connection, the ACF is interposed between the pad formed by the conductive layer 1314b2 in the contact trench 1317 and the lead 811a of the driver 811. Then, the driver 811 is pressed against the front substrate 1310, optionally with heat to at least partially cure the film. One or more of the conductive particles 813 in the polymeric film provide electrical connection by contacting both the conductive layer 1314b2 and the lead 811a of the driver 811. But between contact trenches 1317 (see plan view of FIG. 16A), the conductive particles across the ACF are insulated from one another by the polymeric matrix, preventing driver leads 811a or contact pads in regions 1317 from shorting to one another. A skilled artisan will appreciate that various types of ACFs may be adapted for providing the electrical connection. A skilled artisan will also appreciate that various other bonding techniques may also be used for providing the electrical connection.

Figure 17A:
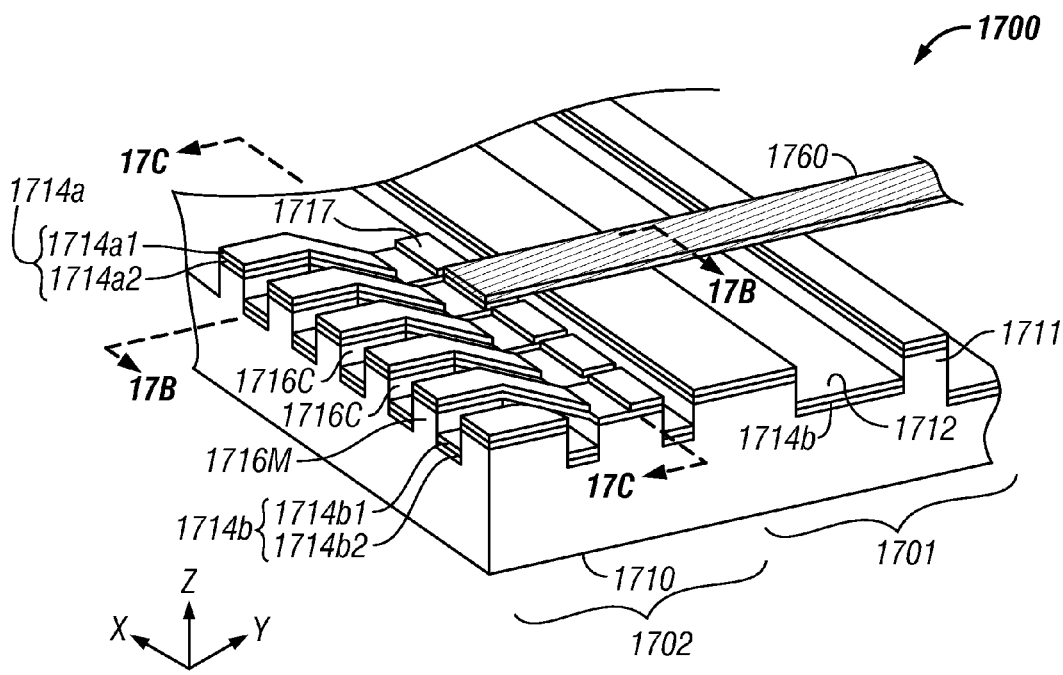
FIG. 17A is a partial perspective view of one embodiment of a routing structure for movable electrodes.

FIG. 17A illustrates one embodiment of a column routing structure of an interferometric modulator display device 1700. The illustrated display device 1700 includes a front substrate 1710 having rails 1711 and troughs 1712 in its display region or array 1701 and column isolation trenches 1716C in its peripheral region 1702. The illustrated portion of the peripheral region 1702 of the front substrate 1710 has a top surface at a higher level relative to the bottom of the troughs 1712. The top surface of the peripheral region 1702 may be at the same level as those of the rails 1711.

The front substrate 1710 also includes optical stacks 1714a, 1714b that have been simultaneously deposited on the top surface of the peripheral region 1702 and on the bottom of the isolation trenches 1716C and the troughs 1712. The optical stacks 1714a, 1714b include a dielectric layer 1714a1, 1714b1 and a conductive layer 1714b1, 1714b2 underlying the dielectric layer 1714a1, 1714b1. The configuration of the optical stacks 1714a, 1714b may be as described above with respect to the optical stacks 1014 of FIG. 10. It will be understood that the optical stacks 1714b in the troughs 1712 serve as stationary electrodes for the MEMS device.

The device 1700 also includes movable electrodes 1760 overlying the front substrate 1710 and extending substantially perpendicular to the troughs 1712. The movable electrodes 1760 extend from the display region 1701 to an elevated portion of the peripheral region 1702.

The column isolation trenches 1716C define a plurality of lands or mesas 1716M alternating with the trenches 1716C. The trenches 1716C extend from near the display region 1701 to a driver chip region (not shown) for a column driver (not shown) distal from the display region 1701. The column isolation trenches 1716C are configured to provide electrical isolation between the optical stacks 1714a on top of the mesas 1716M without additional patterning. Each of the trenches 1716C completely surrounds a corresponding one of the mesas 1716M. The column isolation trenches 1716C also have a depth sufficient to allow the optical stacks 1714a, 1714b to be discontinuous between the mesas 1716M and the column isolation trenches 1716C when optical stack materials are deposited across the shaped front substrate 1710 as described above with respect to FIG. 12D. The conductive layer 1714a2 of each of the optical stacks 1714a on the mesas 1716M provides electrical connection between one of the movable electrodes 1760 and a corresponding one of the pads of the column driver (not shown). The conductive layers 1714a2 electrically isolated from one another on the mesas 1716M may be referred to as "routing traces" or "conductive traces."

In one embodiment, the column isolation trenches 1716C may have a depth greater than the depth of the troughs 1712. However, it will be appreciated that the depth of the column isolation trenches 1716C may vary widely depending on the other dimensions of the front substrate 1710, conformality of the stationary electrode deposition, and other components of the interferometric modulator display device 1700.

Figure 17B:
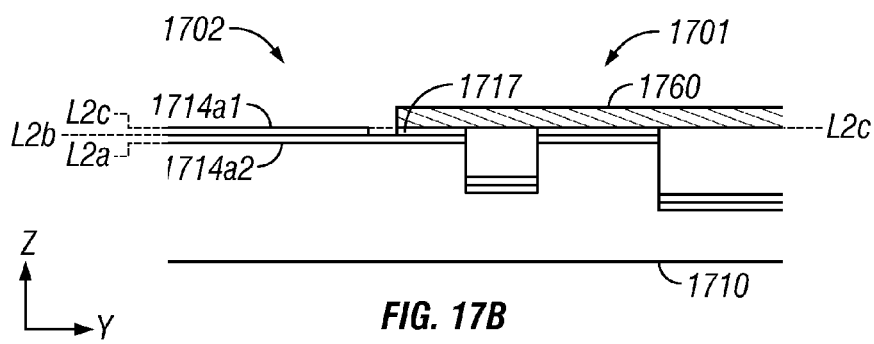
FIG. 17B is a cross section of the routing structure of FIG. 17A, taken along lines 17B-17B.

FIG. 17B is a cross section of the device 1700, taken along lines 17B-17B of FIG. 17A. In the illustrated embodiment, the conductive traces 1714a2 are formed on the top surface of the front substrate 1710 at level L2a. The top surface of the conductive traces 1714a2 is at level L2b. The dielectric layer 1714a1 is formed on the conductive traces 1714a2 while exposing portions of the conductive traces 1714a2 so as to permit electrical connection between the conductive traces 1714a2 and end portions of the movable electrodes 1760 extending to the peripheral region 1702.

In order to expose the portions of the conductive traces 1714a2, the overlying dielectric layer 1714a1 may be patterned using any suitable process. In one embodiment, the dielectric layer 1714a1 may be patterned using photolithography and etching. In another embodiment, a shadow mask may be used to cover the portions of the conductive traces 1714a2 when depositing the dielectric layer 1714a1 such that no dielectric layer is formed on the portions of the conductive traces 1714a2. The details of using shadow masks are described in more detail below with respect to FIGS. 20, 21, 44A-44E. The movable electrodes 1760 have bottom surfaces at level L2c which is higher than the level L2b. Thus, there exists a gap between the bottom surfaces of the movable electrodes 1760 at the level L2c and the top surface of the conductive traces 1714a2 at the level L2b. The gap may interfere with reliable electrical connection between the conductive traces 1714a2 and the movable electrodes 1760, particularly when the movable electrodes are laminated onto the front substrate 1710.

In the illustrated embodiment, gap-fillers 1717 are provided to fill the gap between the conductive traces 1714a2 and the movable electrodes 1760, and establish electrical connection therebetween. The gap-fillers 1717 may be formed of a conductive adhesive material. Thus, the gap-fillers 1717 may also serve to attach the movable electrodes 1760 to the conductive traces 1714a2. The adhesive material may be a cold-weld material which may be weldable at a relatively low temperature. Examples of the material include, but are not limited to, antimony (Sb), indium (In), or tin (Sn). The material may be soft and deformable. A skilled artisan will appreciate that various other materials (e.g., an ACF) may also be used for the gap-fillers 1717.

Figure 17C:
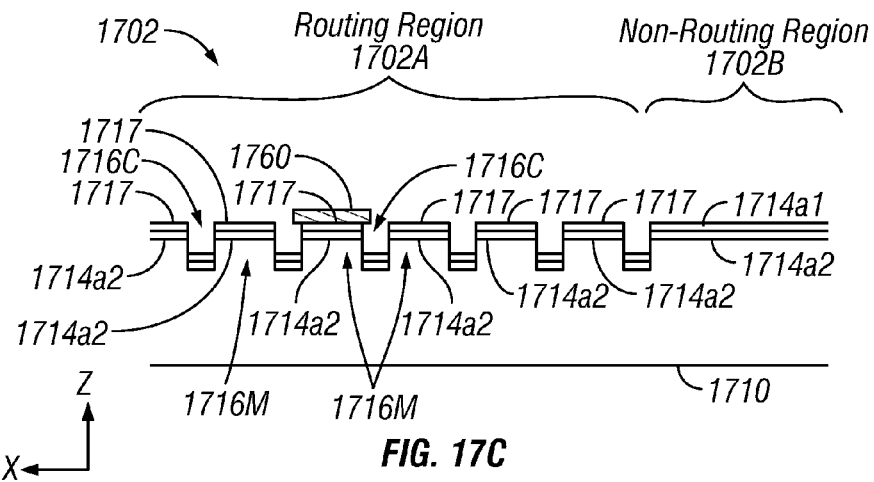
FIG. 17C is a cross section of the routing structure of FIG. 17A, taken along lines 17C-17C.

FIG. 17C is a cross section of the device 1700, taken along lines 17C-17C of FIG. 17A. FIG. 17C shows a routing region 1702A and a non-routing region 1702B of the peripheral region 1702 of the device 1700. The illustrated cross section specifically shows a portion of the routing region 1702A where the movable electrodes 1760 (one shown) are connected to the conductive traces 1714a2. In the routing region 1702A, the column isolation trenches 1716C are formed to define the mesas 1716M. On top of the conductive layer 1714a2 on the mesas 1716M are the gap-fillers 1717. On the other hand, in the non-routing region 1702B which has no column isolation trenches, both a conductive layer 1714a2 and a dielectric layer 1714a1 are stacked on top of the front substrate 1710.

Figure 12D:
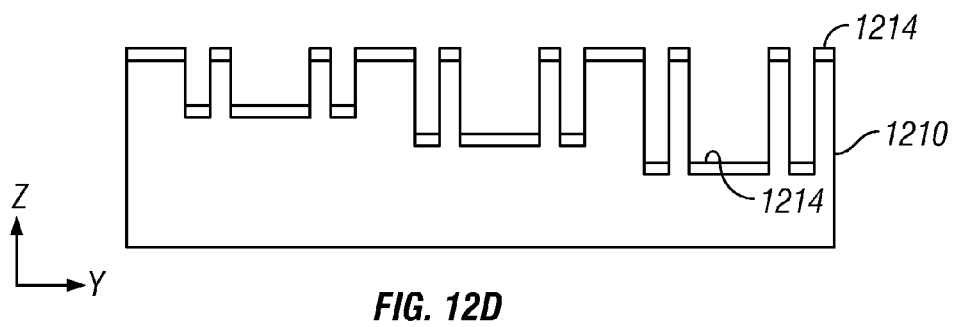
Figure 18A:
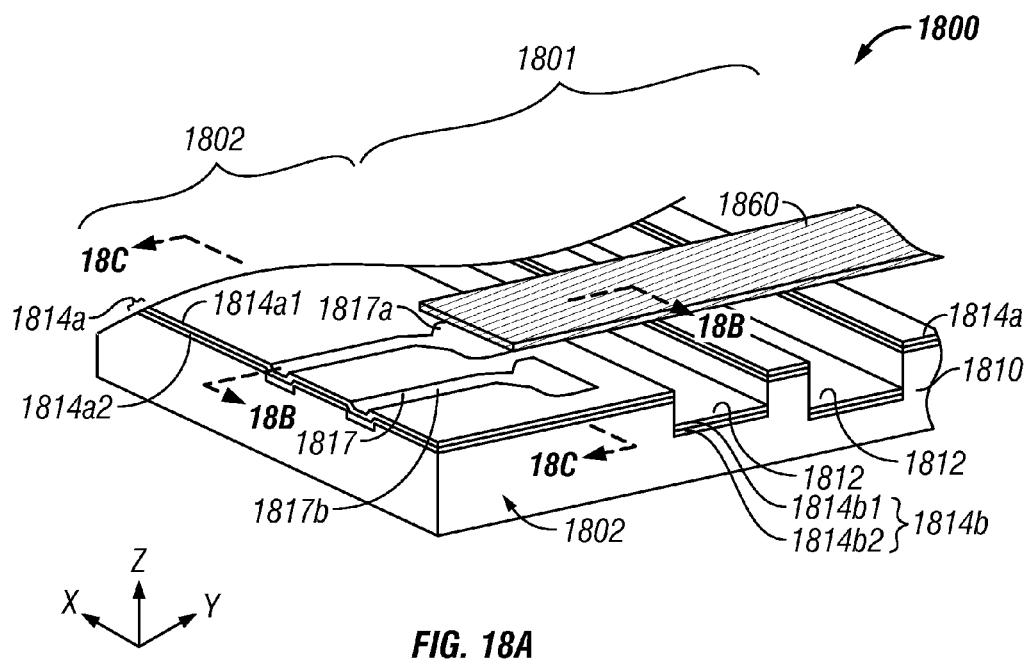
FIG. 18A is a partial perspective view of another embodiment of a routing structure for movable electrodes.

FIG. 18A illustrates another embodiment of a column routing structure of an interferometric modulator display device 1800. The display device 1800 includes a front substrate 1810 having troughs 1812 in its display region 1801, but no column isolation trenches in the peripheral region 1802 thereof. The front substrate 1810 also includes optical stacks 1814a, 1814b formed thereon. The optical stacks 1814a, 1814b include a dielectric layer 1814a1, 1814b1 and a conductive layer 1814a1, 1814b1 underlying the dielectric layer 1814a1, 1814b1. The optical stacks 1814a, 1814b may be blanket deposited across the front substrate 1810 as illustrated in FIG. 12D.

Figure 18B:
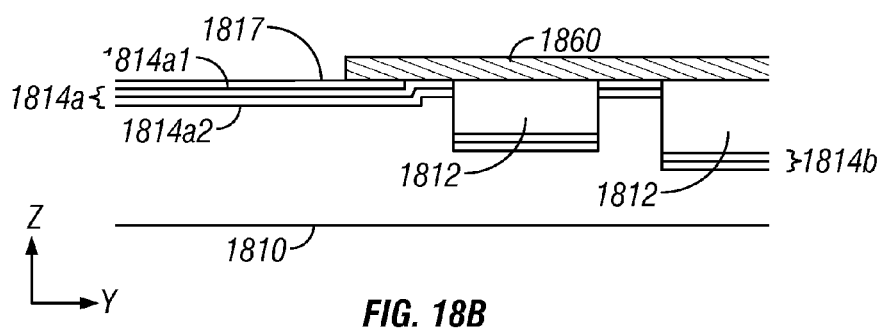
FIG. 18B is a cross section of the routing structure of FIG. 18A, taken along lines 18B-18B.
Figure 18C:
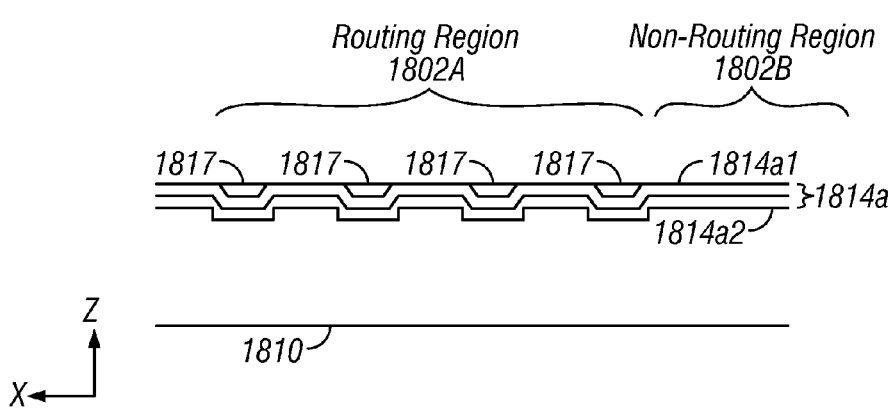
FIG. 18C is a cross section of the routing structure of FIG. 18A, taken along lines 18C-18C.

The front substrate 1810 further includes column routing traces 1817 on the dielectric layer 1814a1 in the peripheral region 1802. The routing traces 1817 are configured to electrically connect movable electrodes 1860 to the pads of a column driver (not shown). Each of the routing traces 1817 includes a contact portion 1817a and a routing portion 1817b. In the illustrated embodiment, the contact portion 1817a is wider than the routing portion 1817b to facilitate electrical contact with a movable electrode 1860. Although not shown, the distal end of the routing traces 1817 may have contact pad portions shaped similar to the contact portion 1817a. Unlike the conductive traces 1714a2 of FIG. 17B, the routing traces 1817 are on top of the optical stack 1814a. Therefore, no gap-filler is employed for electrical connection between the routing traces 1817 and the movable electrodes 1860. Referring to FIG. 18C, the routing traces 1817 are formed only in the routing region 1802A of the peripheral region 1802 of the front substrate 1810, but not in the non-routing region 1802B thereof. The routing traces 1817 may be formed by any suitable method, for example, screen or Gravue printing or photolithography and etching. Column routing is provided at a higher level (the substrate level of supports and the substrate level of the movable electrodes). This configuration allows the movable electrodes to easily make contact with the routing traces, particularly when laminating the front substrate with a carrier carrying the movable electrodes.

Figure 19:
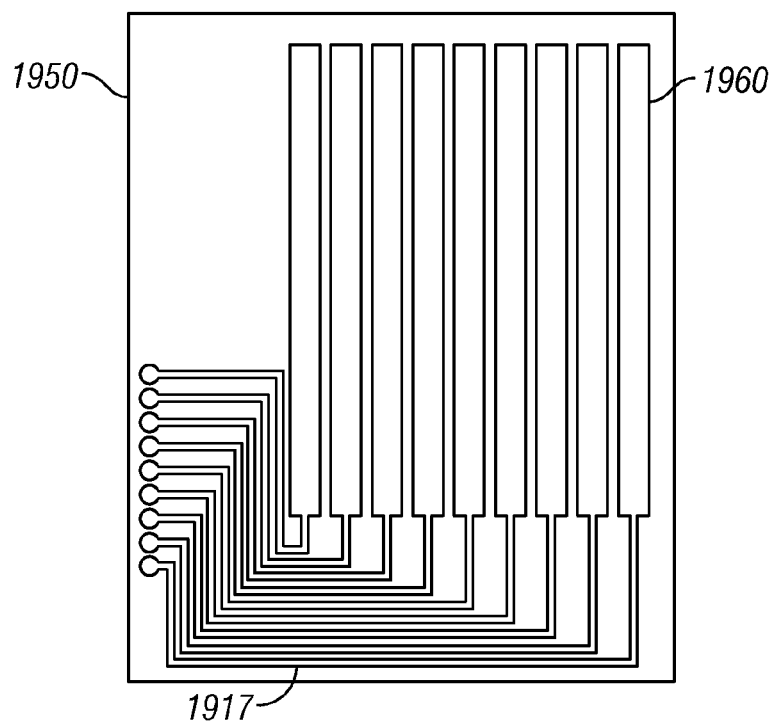
FIG. 19 is a top plan view of one embodiment of a carrier having routing traces for movable electrodes for joining with a front substrate having stationary electrodes.

FIG. 19 illustrates yet another embodiment of a column routing structure for an interferometric modulator display device. In the illustrated embodiment, a carrier 1950, configured for joining to a front substrate that has stationary electrodes patterned on it, is provided with movable electrodes (or strips) 1960 and column routing traces 1917. The column routing traces 1917 may be formed simultaneously with the movable electrodes 1960 on the carrier 1950. Then, the carrier 1950 is placed onto a shaped front substrate (not shown) such that the movable electrodes 1960 and the column routing traces 1917 are interposed therebetween. Subsequently, the carrier 1950 is removed, leaving the movable electrodes 1960 and the column routing traces 1917 on the front substrate. Then, the column routing traces 1917 may be used to electrically connect the movable electrodes 1960 to the leads or contacts of a column driver (not shown).

Figure 20:
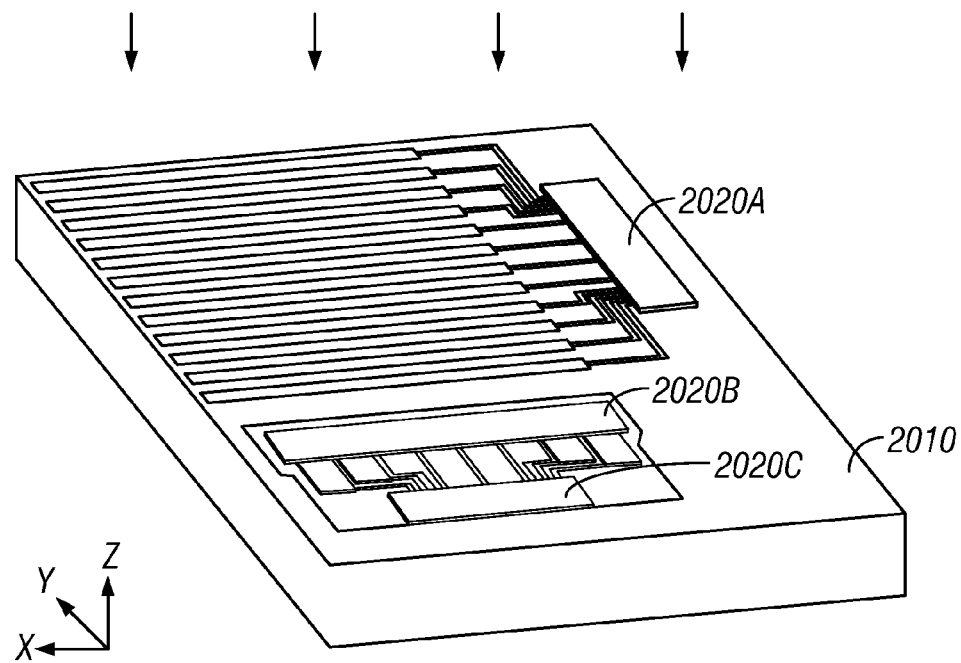
FIG. 20 is a schematic perspective view illustrating one embodiment of a method of forming an optical stack on a shaped front substrate using a shadow mask.

FIG. 20 illustrates one embodiment of a method employing shadow masking for depositing an optical stack on a shaped front substrate 2010. Referring back to FIG. 16E, the dielectric layer 1314b1 is patterned and etched, or deposited through a shadow mask, to expose the underlying conductive layer 1314b2 for electrical connection between the conductive layer 1314b2 and the lead 811a of the row driver 811. Referring back to FIG. 17B, the dielectric layer 1714a1 is patterned and etched, or deposited through a shadow mask, to expose the underlying conductive traces 1714a2 for electrical connection between the conductive traces 1714a2 and the corresponding movable electrodes 1760. Although not shown in FIG. 17B, the dielectric layer 1714a1 may also be patterned and etched, or deposited through a shadow mask, to expose the underlying conductive traces 1714a2 for electrical connection between the conductive traces 1714a2 and the leads or contacts of a column driver (not shown).

Referring again to FIG. 20, the structures described above may be formed by first blanket depositing a conductive layer across the shaped front substrate 2010. The conductive layer is deposited on different elevations with poor conformality. Thus, the conductive layer is discontinuous over sidewalls of supports and mesas. As a result, row electrodes are patterned in trenches while column routing traces are patterned on mesas. Then, shadow masks 2020a-2020c are placed on portions of the front substrate 2010 where the conductive layer is to be exposed in order to make contact with other elements to be mounted (e.g., column/row drivers, laminated movable electrodes). Then, a dielectric material is blanket deposited across the front substrate 2010. This shadow masking method may also be used for the embodiment shown in FIGS. 18A-18C to expose the conductive layer of the optical stack in the troughs for connection between the conductive layer and the pads of a row driver. In such an embodiment, only one shadow mask will be required in region 2020a (FIG. 20) because the routing traces 1817 are formed on the dielectric layer 1814a1 and thus are already exposed to the movable electrodes 1860 and the leads of the column driver. It will be appreciated that various other patterning techniques may also be employed for forming the structures described above.

Figure 21:
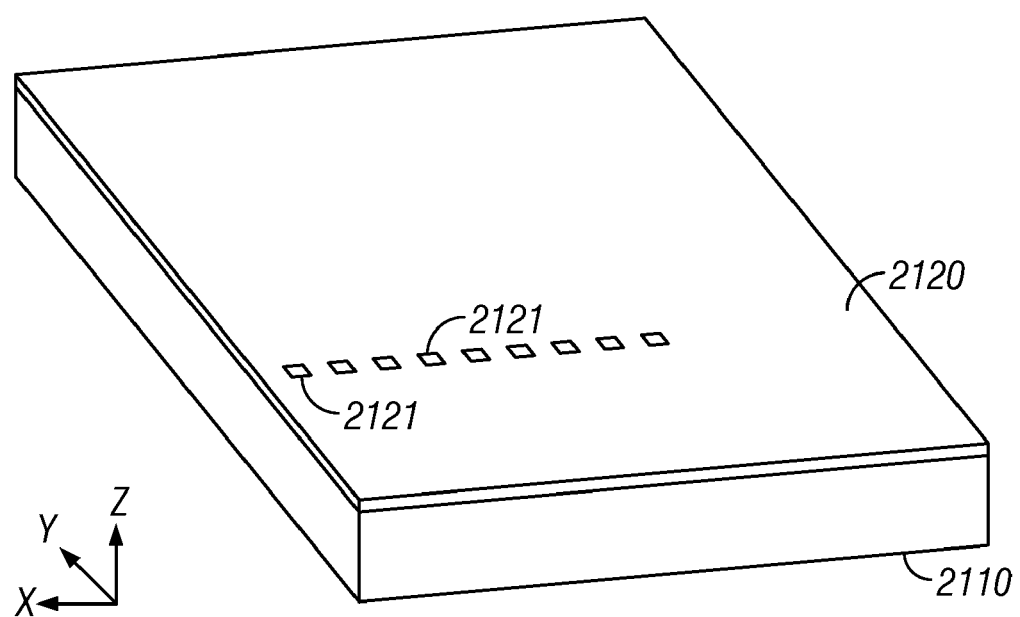
FIG. 21 is a schematic perspective view illustrating a method of forming the routing structure of FIG. 17A using a shadow mask according to one embodiment.

FIG. 21 illustrates one embodiment of a method of forming the gap-fillers 1717 of FIG. 17B. After the dielectric material is deposited on the front substrate 2010 as described above with reference to FIG. 20, the shadow masks 2020a-2020c are removed. Then, another shadow mask 2120 is provided over the front substrate 2010, as shown in FIG. 21. This shadow mask 2120 includes a plurality of openings 2121 for exposing regions where the gap-fillers are to be formed. Then, a conductive adhesive material is deposited through the openings 2121 on the front substrate 2010, thereby forming the gap-fillers. It will be appreciated that various other methods may be used for forming the gap-fillers.

2. Formation of Patterned Front Substrate

Figure 22A:
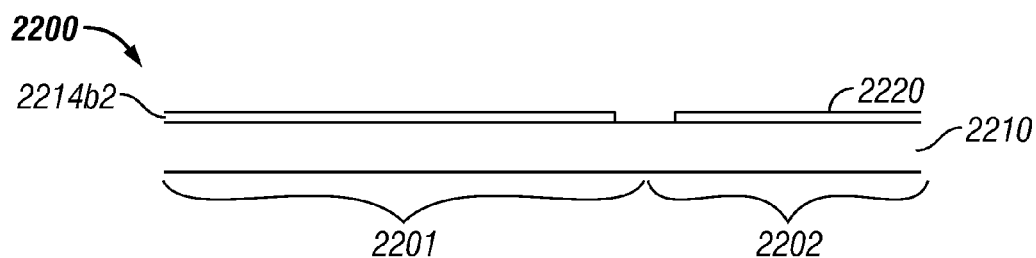
FIGS. 22A-22C illustrate one embodiment of a method of making a front substrate using conventional depositing and patterning techniques.
Figure 22B:
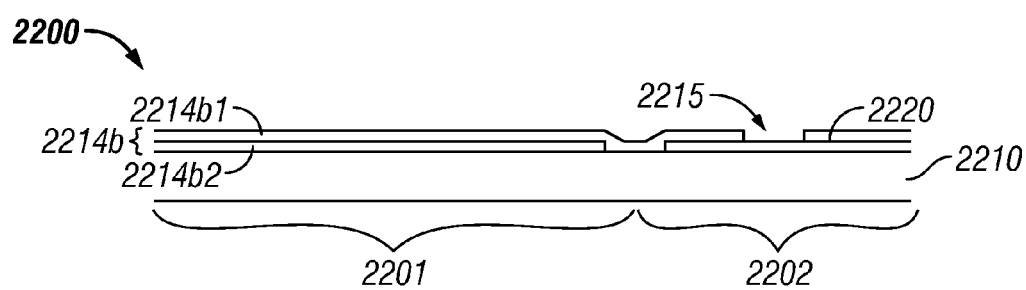
Figure 22C:
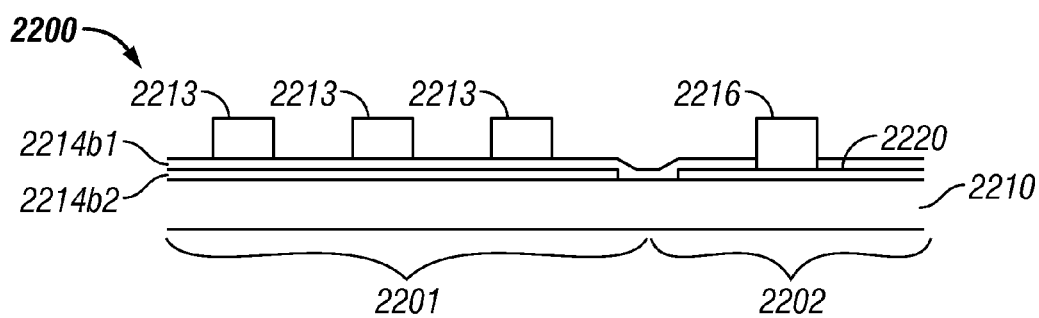

FIGS. 22A-22C are schematic cross sections illustrating a method of making a patterned front substrate according to one embodiment. In the illustrated embodiment, a substantially flat substrate 2210 is provided. Subsequently, a conductive layer 2214b2 is first deposited on the front substrate 2210, and then is patterned to define row electrodes in the display region 2201 of the front substrate 2210, as shown in FIG. 22A. The row electrodes can also be patterned to extend continuously to a row driver mounted on a portion of the peripheral region 2202 of the front substrate. In addition, the conductive layer 2214b2 in the peripheral region 2202 is patterned to provide column routing traces 2220 for electrical connection between movable electrodes (not shown) and the leads of a column driver (not shown). In another embodiment, this step may be carried out using shadow masks similar to those shown in FIGS. 20 and 21.

Then, a dielectric layer 2214b1 is formed across the front substrate over the conductive layer 2214b2, as shown in FIG. 22B. The conductive layer 2214b2 and the dielectric layer 2214b1 together form an optical stack 2214. The dielectric layer 2214b1 may be patterned after deposition to provide through-holes or vias 2215 to expose the underlying conductive layer 2214b2, particularly in the peripheral column routing trace region 2220. This step may alternatively be carried out using shadow masks similar to those shown in FIGS. 20 and 21 when the dielectric layer 2214b1 is deposited on the conductive layer 2214b2.

Subsequently, insulating posts 2213 are formed on the optical stack 2214 in the display region 2201. The insulating posts 2213 in the display region are formed of an insulating material and will serve to support the movable electrodes. After or prior to forming the insulating posts 2213, conductive posts 2216 are formed through the through-holes 2215 in the peripheral region 2202, as shown in FIG. 22C. The conductive posts 2216 will provide electrical connection between the movable electrodes (not shown) and the column routing traces 2220, which are at different levels. It will be appreciated that the patterned front substrate 2200 may be prepared using any suitable deposition and etching techniques.

In another embodiment, an elevated land may be formed in the peripheral region 2202 of the front substrate 2210 to raise the column routing traces to the level of the movable electrodes. The elevated land may be formed by forming a patterned insulating material, such as by deposition, photolithography and etching, or depositing using a shadow mask, prior to depositing the column routing traces. In such an embodiment, no conductive posts are required. A skilled artisan will appreciate that various other techniques may be used for the routing of the patterned front substrate.

3. Formation of Preformed Support Front Substrate

Figure 23A:
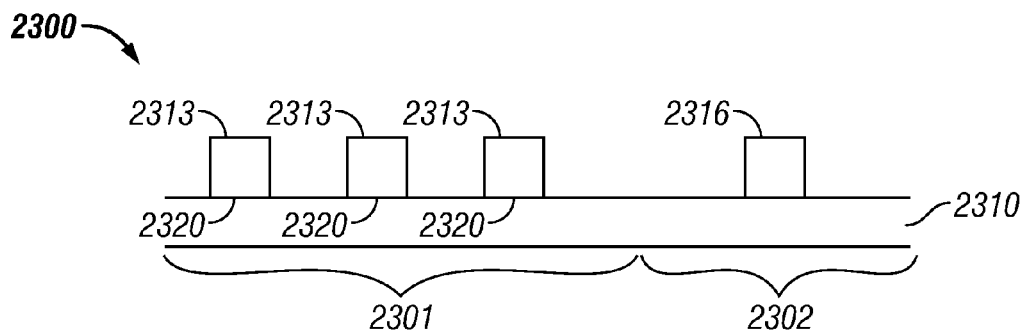
FIGS. 23A-23C illustrate one embodiment of a method of making a front substrate having deposited preformed supports that are patterned prior to depositing lower electrode and dielectric layers.
Figure 23B:
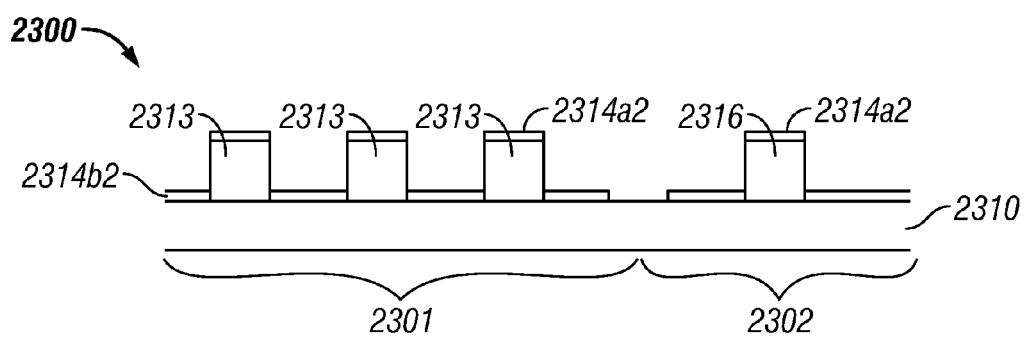
Figure 23C:
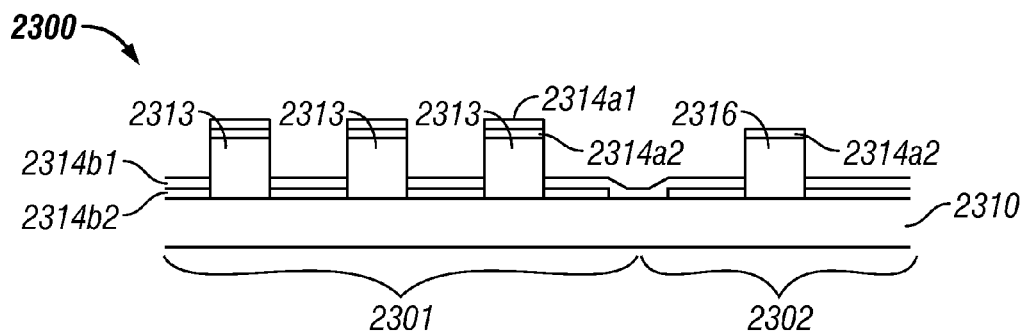

FIGS. 23A-23C are schematic cross sections illustrating a method of making a preformed support front substrate 2300 according to one embodiment. In one embodiment, a substantially flat substrate 2310 is provided. Then, insulating supports 2313 are formed directly on the substrate 2310 in the array or display region 2301. The insulating supports 2313 are formed of an insulating material, and may take the shape of posts, rails, walls, etc. The insulating supports 2313 will serve to support the movable electrodes (not shown). In one embodiment, the insulating supports 2313 may be formed by blanket depositing a spin-on-glass (SOG) material or oxide and patterning and etching, such as by conventional photolithography. After or prior to forming the insulating supports 2313, conductive supports 2316 are formed in the peripheral region 2302. The front substrate with the supports 2313, 2316 is shown in FIG. 23A. While the insulating posts 2313 can be formed of an oxide material similar to that of the glass substrate, the posts 2313 material will generally be distinguishable from the substrate 2310 and an identifiable interface 2320 is formed between the insulating posts 2313 and the substrate 2310.

Then, an optical stack 2314 is formed across the front substrate 2310. In forming the optical stack 2314, a conductive layer 2314b2 is first deposited on the front substrate 2310, and then is patterned to define row electrodes in the display region 2301 of the front substrate 2310, as shown in FIG. 23B. The row electrodes can also be patterned to extend continuously to a row driver mounted on a portion of the peripheral region 2232 of the front substrate 2310. In addition, the conductive layer 2314b2 in the peripheral region 2302 is patterned to provide column routing traces for electrical connection between movable electrodes (not shown) and the pads for mounting the column driver (not shown). In addition, a conductive layer 2314a2 is formed on the insulating supports 2313 and the conductive supports 2316.

Then, dielectric layers 2314a1, 2314b1 are formed across the substrate 2310 over the conductive layers 2314a2, 2314b2, as shown in FIG. 23C. The formation of a dielectric layer on top of the conductive supports 2316 may be avoided by using any suitable technique, e.g., shadow masking. This configuration allows the conductive layer 2314a2 on top of the conductive supports 2316 to interconnect with mechanical layers (not shown). A skilled artisan will appreciate that the preformed support front substrate 2300 may be prepared using any suitable deposition and etching techniques.

In an interferometric modulator display device structure resulting from the method described in connection with FIGS. 23A-23C, the insulating supports are on the front substrate without an intervening optical stack (conductor and/or dielectric). The insulating supports are neither integral with nor formed of the same material as the substrate.

In another embodiment, an elevated land may be formed in the peripheral region 2302 of the front substrate 2310 to raise the column routing traces to the level of the movable electrodes, as discussed with respect to the shaped substrate of FIG. 18A. The elevated land of a preformed support front substrate may be formed by depositing an insulating material using a shadow mask. In such an embodiment, no conductive posts are employed. A skilled artisan will appreciate that various other techniques may be used for the routing of the preformed support front substrate.

4. Other Column Routing Structures

Figure 24A:
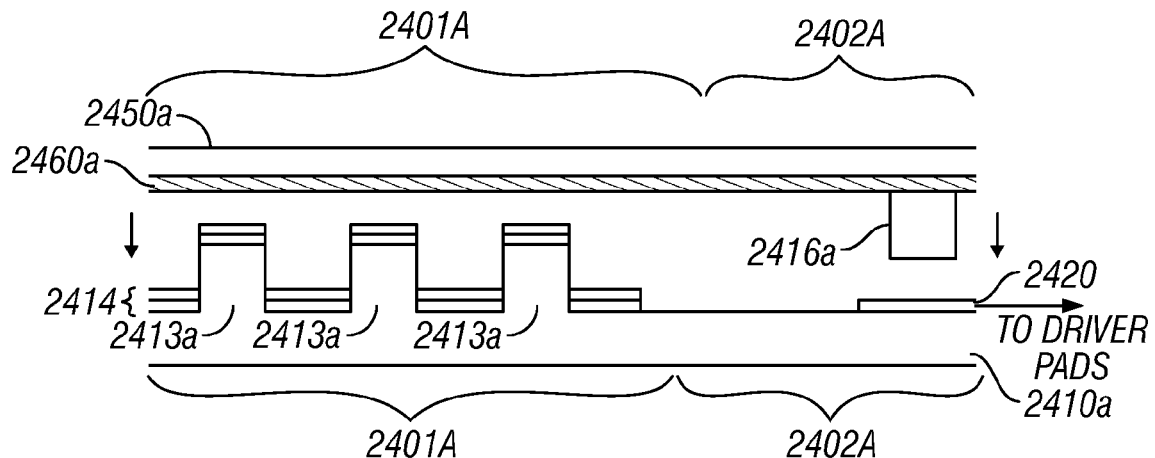
FIGS. 24A and 24B are cross sections of routing structures for movable electrodes on a carrier for joining with a front substrate having stationary electrodes, according to one embodiment.
Figure 24B:
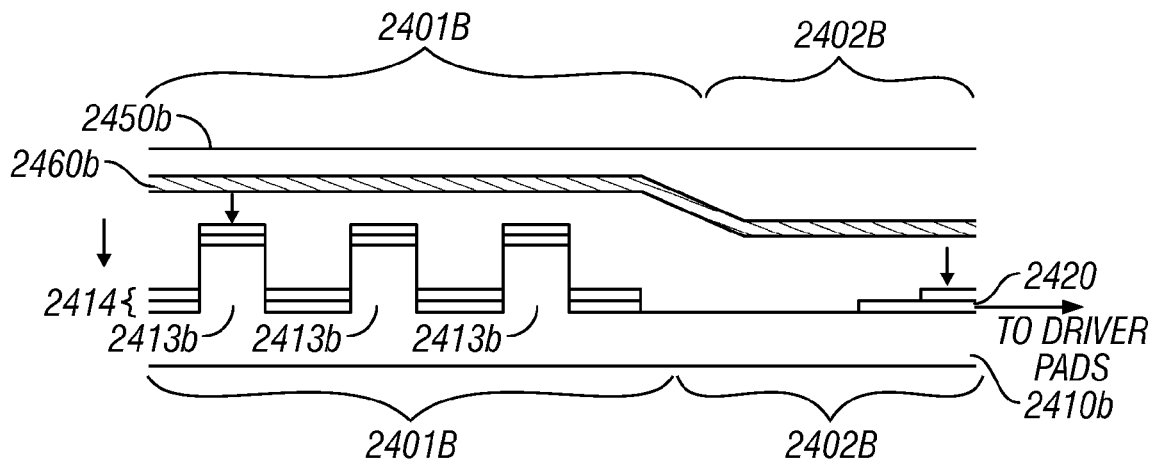

FIGS. 24A and 24B illustrate other embodiments of column routing structures for either a patterned or a preformed support front substrate. In the illustrated embodiments, the front substrates can be formed similar to the methods described above with reference to FIGS. 22A-22C and 23A-23C except that the conductive posts are not formed in the peripheral regions of the front substrates.

Referring to FIG. 24A, a carrier 2450a, configured to join with a front substrate having stationary electrodes, is provided with movable electrodes 2460a. In addition, conductive posts 2416a are formed on the movable electrodes 2460a. The conductive posts 2416a may be formed using any suitable technique, including but not limited to, photolithography and etching, printing, and sputtering. The carrier can be removable or sacrificial, existing to transfer the movable electrodes to the front substrate, or can serve as a permanent backplate for the MEMS device. The carrier 2450a is laid over a front substrate 2410a such that the conductive posts 2416a are interposed between the movable electrodes 2460a on the carrier 2450a and the routing traces 2420 of the front substrate 2410a. The front substrate 2410a may be either a patterned front substrate or a preformed support front substrate which has insulating posts 2413a in the display region 2401A, and stationary electrodes in the form of optical stacks 2414.

Referring to FIG. 24B, the carrier 2450b is shaped to be thicker in the peripheral region 2402B than in the display region 2401B, protruding toward a front substrate 2410b. The front substrate 2410b may be either a patterned front substrate or a preformed support front substrate which has insulating posts 2413b in the display region 2401B. Movable electrodes 2460b are formed on the carrier 2450b. Then, the carrier 2450b is laid over the front substrate 2410b such that the movable electrodes 2460b are interposed between the front substrate 2410b and the carrier 2450b. Because of the thicker portion in the periphery 2402B of the carrier 2450b, the movable electrodes 2460b contact routing traces 2420 in the peripheral region 2402B of the front substrate 2410b. A skilled artisan will appreciate that various other configurations of column routing structures are also possible.

III. Formation of Back Carriers

In making the interferometric modulator display device described above, movable electrodes may be formed in various ways. In many of the embodiments described herein, the movable electrodes are formed on a carrier backplate or removable carrier and then transferred to the front substrate of the device.

In one embodiment, the movable electrodes are formed on a carrier backplate, and then are transferred to the front substrate. The term "carrier backplate" refers to a plate that both serves as a carrier that transfers a movable electrode layer for the electrostatic MEMS to a front substrate having stationary electrodes, and also forms the backplate of the interferometric modulator display device. In other embodiments, a removable carrier may be used only as a carrier to provide the movable electrodes to the front substrate. The term "removable carrier" refers to a temporary or sacrificial substrate which is removed after transferring the movable electrodes onto the front substrate. When a removable carrier is used, after removal of the carrier, a permanent backplate is further provided to seal the interferometric modulator display device. In the embodiments described above, the movable electrodes may be formed by patterning a movable electrode material on the carrier backplate or removable carrier, using any suitable technique, e.g., photolithography and etching, or screen printing.

In other embodiments, the carrier may be shaped to have a preformed pattern corresponding to that of the movable electrodes before depositing a movable electrode material thereon. Preformed patterns may be provided by, e.g., embossing, inscribing, or depositing/etching rails and/or posts such that the movable electrode layers can be discontinuously deposited thereon. This technique permits movable electrode formation without additionally patterning and etching the movable electrode material after deposition. In the context of this document, the carrier backplate and removable carrier with the preformed pattern are referred to as a "shaped carrier backplate" and a "shaped removable carrier," respectively. The shaped carrier backplate and the shaped removable carrier may be collectively referred to as "shaped carriers."

1. Shaped Carriers

Figure 25:
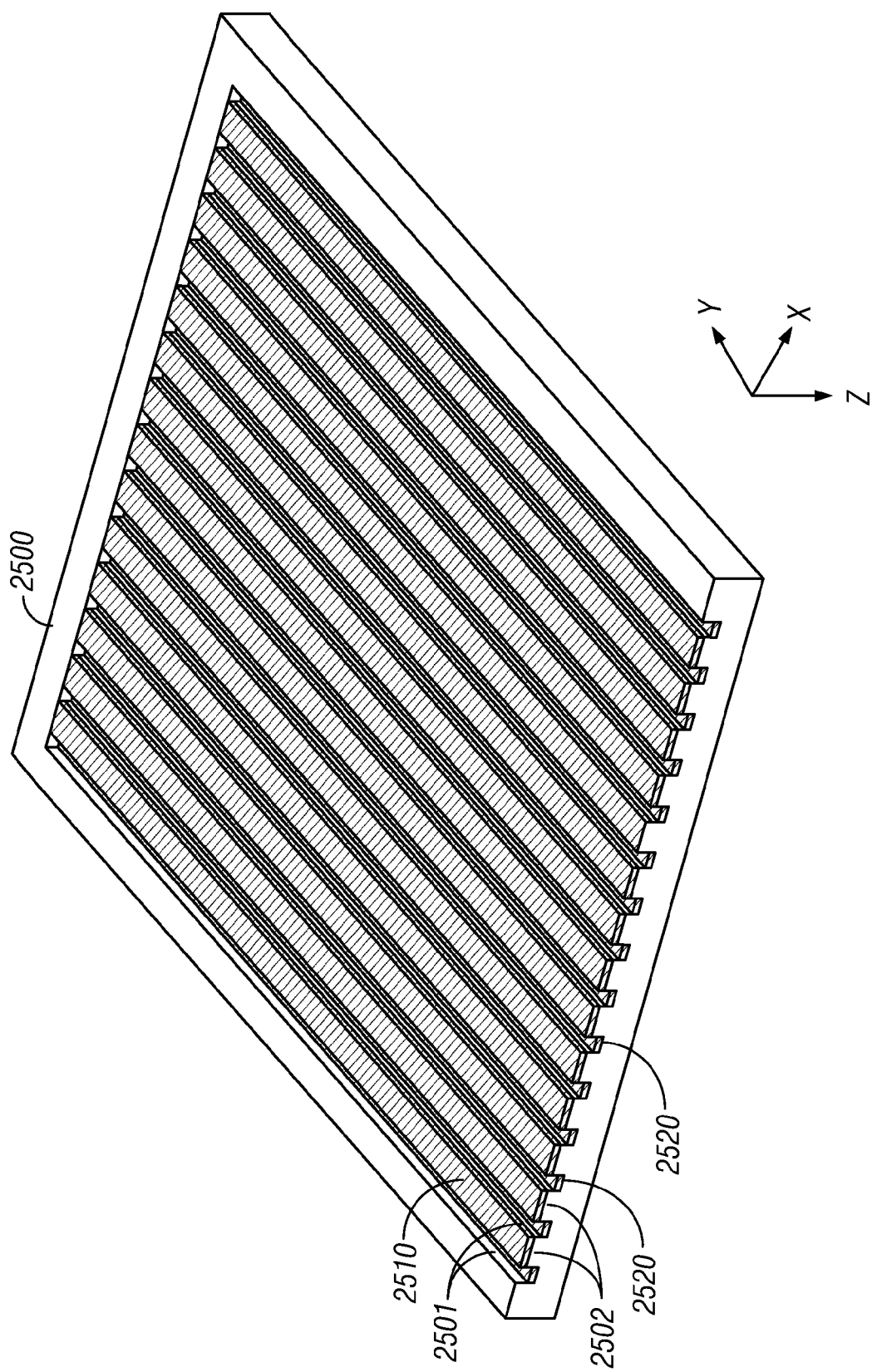
FIG. 25 is a perspective view of a shaped carrier for joining with a front substrate having stationary electrodes, according to one embodiment.

FIG. 25 is a schematic perspective view of a shaped carrier 2500. The shaped carrier 2500 may be either a permanent carrier backplate or a removable carrier. As shown in FIG. 25, the shaped carrier 2500 has elongated recesses 2501 extending substantially parallel to one another. The depth of the recesses depends in part upon the thickness of material to be deposited and the conformality of the deposition technique. In one embodiment, the depth of the recesses is at least 3 times the thickness of the material to be deposited. Desirably, layers to be deposited (e.g., movable electrode layers) are discontinuous due to the depth of the recesses. In one embodiment, the elongated recesses 2501 may have a depth from about 2,000 Å to about 12,000 Å, and particularly from about 3,000 Å to about 6,000 Å. The recesses 2501 define elongated mesas 2502 alternating with the recesses 2501. The shaped carrier 2500 also includes movable electrodes 2510 formed on the mesas 2502. The shaped carrier 2500 further includes excess movable electrode material 2520 in the elongated recesses 2501. As will be better understood from description below, the shaped carrier will be laid over a front substrate such that the movable electrodes 2510 face the front substrate.

Figure 26A:
FIGS. 26A-26E are schematic cross sections illustrating one embodiment of a method of making a shaped carrier for joining with a front substrate having stationary electrodes.

FIGS. 26A-26D are cross sections illustrating a method of making a shaped carrier according to one embodiment. The illustrated method uses embossing for shaping the carrier. In the illustrated embodiment, a substantially flat substrate 2600 is provided, as shown in FIG. 26A. In an embodiment in which the carrier is a permanent backplate, the substrate 2600 may be formed of a metal (e.g., stainless steel), glass, or a polymeric material (e.g., polyethylene terephthalate, polyethylene, polycarbonate, and polymethyl methacrylate). In certain embodiments, the carrier backplate may have two sublayers including a metallic sublayer and a polymeric sublayer laminated to each other. In other embodiments in which the carrier is a removable carrier, the substrate 2600 may be formed of a polymeric material. Examples of the polymeric material will be described below.

Figure 26B:
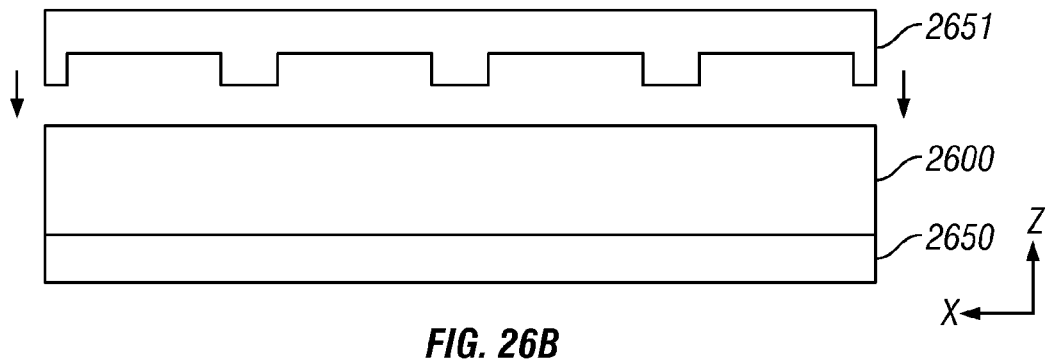

Then, as shown in FIG. 26B, the substrate 2600 is placed on a platen 2650. The illustrated platen 2650 may be formed of a metallic material. The substrate 2600 may be heated such that the substrate 2600 is soft enough to impress at a subsequent embossing step. The substrate 2600 may be heated to a temperature which varies depending on the material used for the substrate 2600.

Figure 26C:
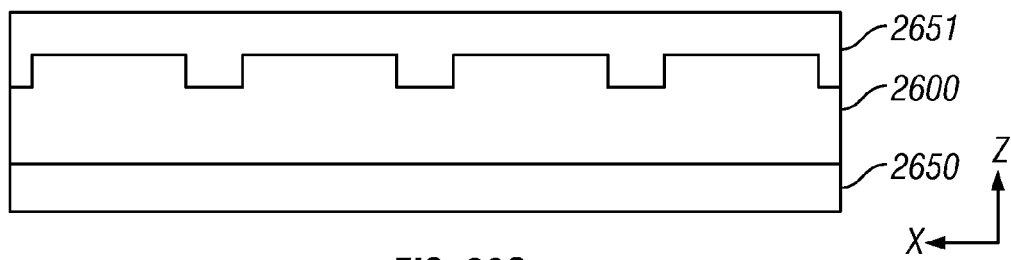

Then, an embossing plate 2651 is pressed onto the substrate 2600, as shown in FIG. 26C. The embossing plate 2651 has recesses and protrusions shaped to produce elongated recesses 2601 (FIG. 26D) on the substrate 2600. The embossing plate 2651 may be formed of a metallic material. At least one of the platen 2650 and the embossing plate 2651 may be in a form of a rotating cylinder. A skilled artisan will appreciate that various other configurations of embossing techniques may also be adapted for embossing the substrate.

Figure 26D:
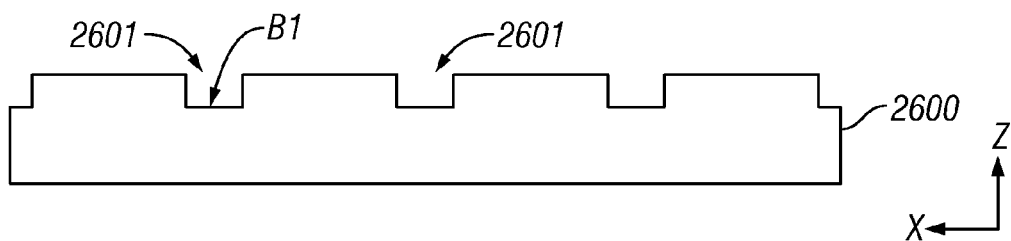
Figure 26E:
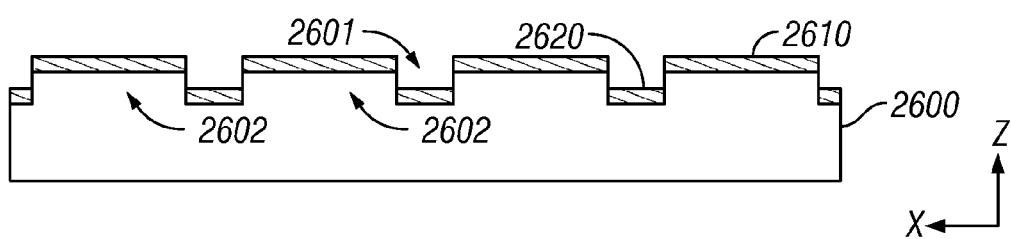

Then, the embossing plate 2651 is removed from the substrate 2600. Subsequently, the substrate 2600 is removed from the platen 2650. The resulting carrier 2600 with the elongated recesses 2601 is shown in FIG. 26D. In another embodiment, the substrate may be patterned using photolithography and etching. In yet another embodiment, the substrate may be patterned by first inscribing predetermined portions and then selectively etching the portions. Inscribing may be conducted using various techniques, e.g., machining or laser-inscribing. It will be appreciated that various other techniques may also be used for shaping carriers.

Subsequently, a movable electrode material is deposited on the top surface of the shaped carrier 2600 and into the elongated recesses 2601. The deposited movable electrode material 2610, 2620 is discontinuous between the recesses 2601 and mesas 2602 defined by the recesses 2601. The configuration of the movable electrodes 2610 may be as described above with respect to the movable electrodes of FIG. 25.

a. Shaped Carrier Backplate

Figure 27A:
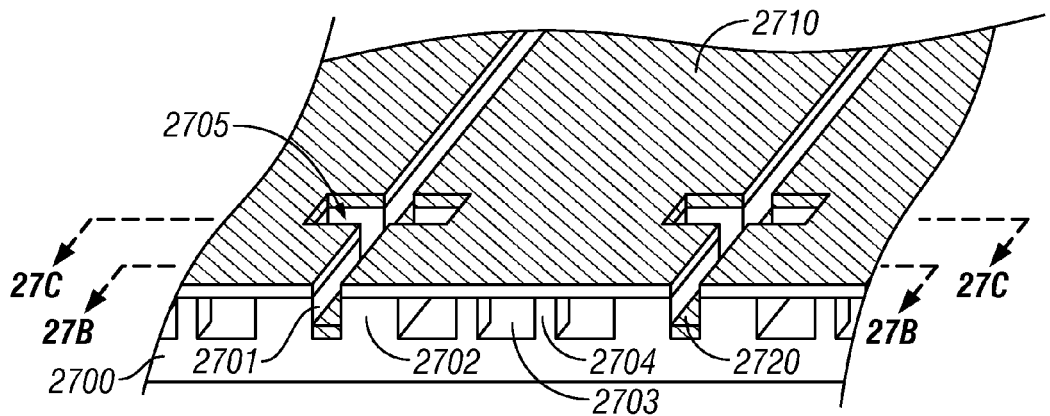
FIG. 27A is a partial perspective view of a shaped carrier backplate having edge rails and posts according to one embodiment.

FIG. 27A is a schematic perspective view of a shaped carrier backplate 2700 according to one embodiment. The illustrated shaped carrier backplate 2700 includes elongated recesses 2701, edge rails 2702, rail trenches 2703, and posts 2704. The edge rails 2702 may include lateral etch holes 2705 which represent gaps in the rails. The etch holes 2705 are configured to permit fluid communication between the rail trenches 2703 and the elongated recesses 2701. The shaped carrier backplate 2700 also includes movable electrodes 2710 supported on the edge rails 2702 and the posts 2704. In certain embodiments, the posts 2704 may be omitted.

The elongated recesses 2701, the edge rails 2702, the rail trenches 2703, the posts 2704, and the etch holes 2705 may be formed by embossing the carrier backplate 2700 as described above with reference to FIGS. 26A-26E. The backplate 2700 may be formed of any material suitable for embossing. Examples of such a material include, but are not limited to, glass and metal (e.g., stainless). In other embodiments, the backplate 2700 may be shaped or preformed using photolithography and etching, or inscribing. A skilled artisan will appreciate that various other methods may be used for shaping the backplate 2700.

Figure 27B:
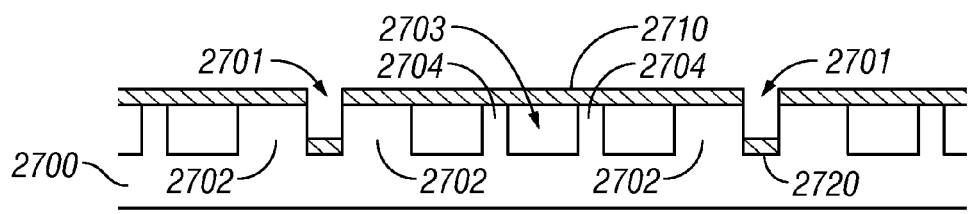
FIG. 27B is a cross-section of the shaped carrier backplate of FIG. 27A, taken along lines 27B-27B.

Referring to FIG. 27B, two of the edge rails 2702 define a corresponding one of the rail trenches 2703 therebetween while supporting the same movable electrode 2710. In addition, two of the neighboring edge rails 2702 define a corresponding one of the elongated recesses 2701 therebetween while each supporting one of two neighboring movable electrodes 2710. The rails trenches 2703 are vacant as will be better understood from description below. The shaped carrier backplate 2700 may also have excess movable electrode material 2720 in the elongated recesses 2701.

Referring still to FIG. 27B, the posts 2704 extend upwards from the bottom of the rail trenches 2703. Referring also to FIG. 27D, two columns of posts 2704 are arranged in a direction parallel to the elongated recesses 2701. It will be appreciated that various other arrangements of the posts are also possible. The posts 2704 have substantially the same height as the edge rails 2702 so that they can support the movable electrodes 2710.

Figure 27C:
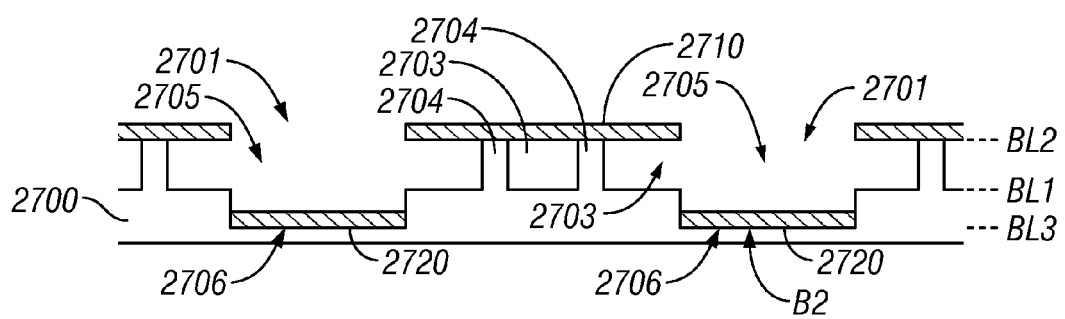
FIG. 27C is a cross-section of the shaped carrier backplate of FIG. 27A, taken along lines 27C-27C.
Figure 27D:
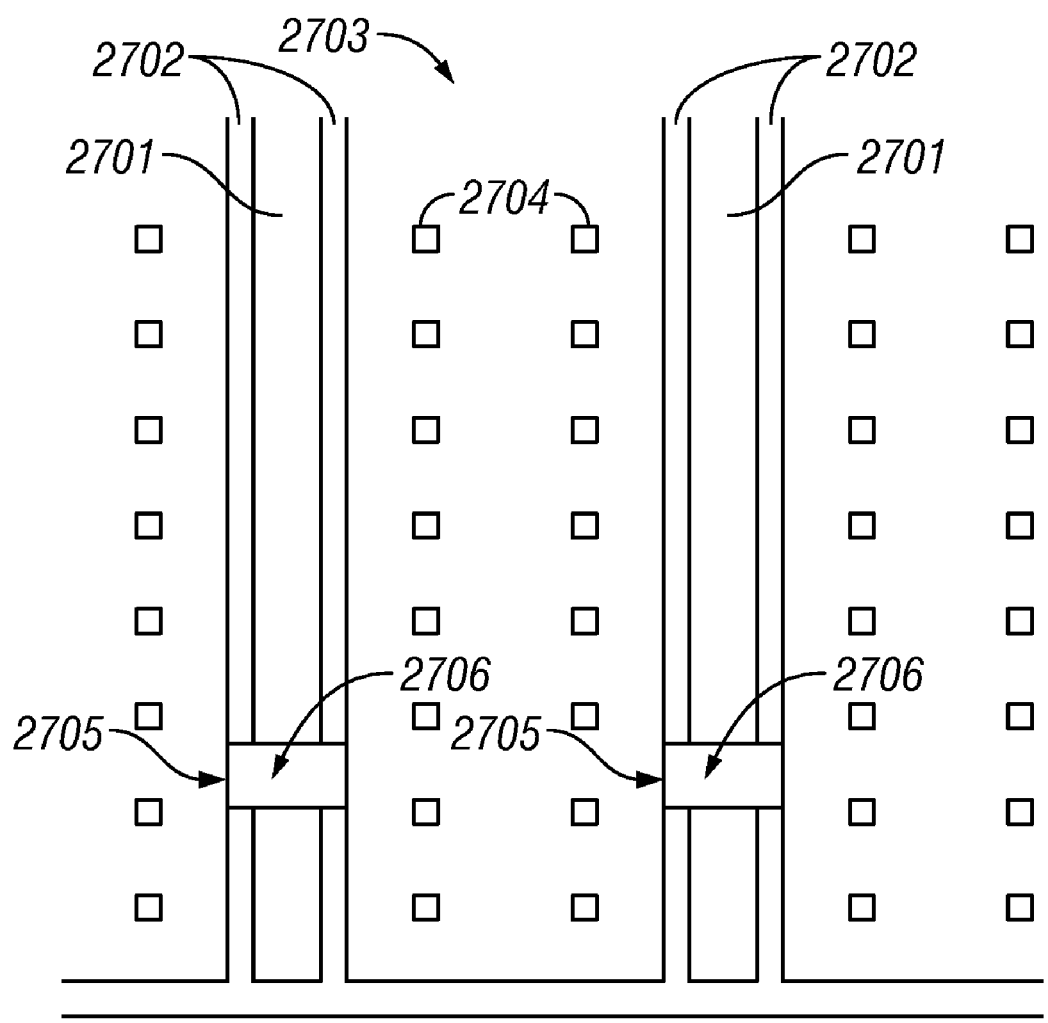
FIG. 27D is a top plan view of the shaped carrier backplate of FIG. 27A.

FIG. 27C is a cross section of the shaped carrier backplate 2700 of FIG. 27A, taken along lines 27C-27C. The illustrated cross section of the shaped carrier backplate 2700 shows the etch holes 2705 in the edge rails 2702. The etch holes 2705 are configured to permit fluid communication between the rail trenches 2703 and the elongated recesses 2701. The etch holes 2705 allow an etchant to contact sacrificial material in the rail trenches 2703 so that the sacrificial material can be removed from the rail trenches 2703 during a manufacturing step, as will be better understood from description below. The etch holes 2705 have a bottom surface 2706 lower than those of the elongated recesses 2701. The lower bottom surface 2706 of the edge holes 2705 prevents the excess movable electrode material 2720 from blocking the etch holes 2705. A top plan view of the shaped carrier backplate 2700 without the movable electrodes 2710 is shown in FIG. 27D.

Referring still to FIG. 27C, the carrier backplate 2700 can have three different levels BL1, BL2, and BL3. The bottoms of the elongated recesses 2701 and the rail trenches 2703 are at a first level BL1. The tops of the edge rails 2702 and the posts 2704 are at a second level BL2 which is higher than the first level BL1. The bottom surface 2706 of the etch holes 2705 is at a third level BL3 which is lower than the first level BL1. A height difference between the first and second levels BL1, BL2 allows the movable electrode material to be discontinuous between two of the edge rails 2702 so as to define the movable electrodes 2710 in strips. A height difference between the first and third levels BL1, BL3 prevents the excess movable electrode material 2720 from blocking the etch holes 2705.

Figure 28:
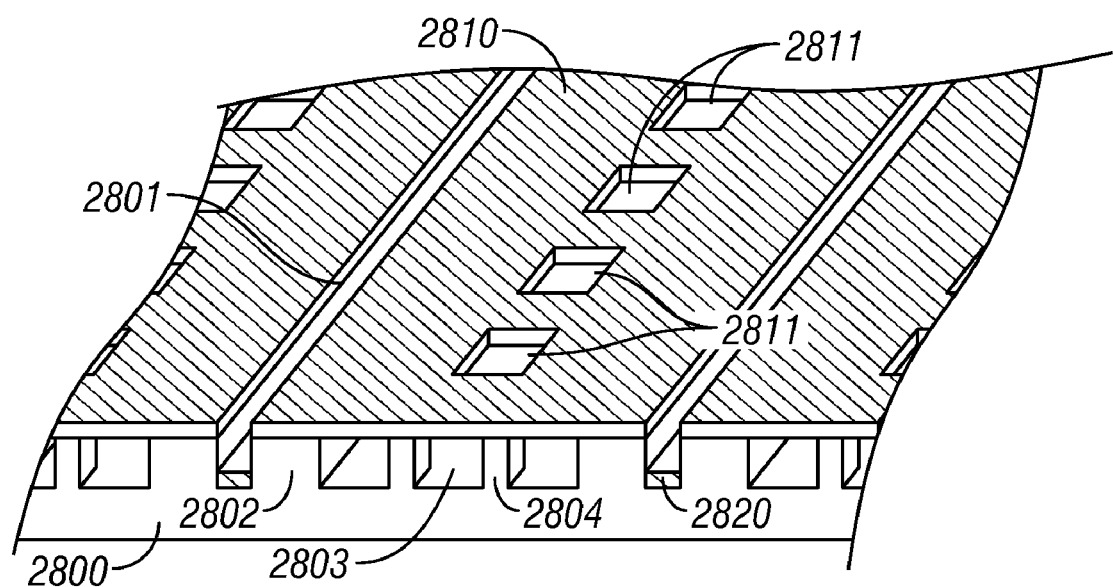
FIG. 28 is a partial perspective view of a shaped carrier backplate having movable electrodes with etch holes according to another embodiment.

FIG. 28 is a schematic perspective view of a shaped carrier backplate according to another embodiment. The illustrated shaped carrier backplate 2800 includes elongated recesses 2801, edge rails 2802, rail trenches 2803, and posts 2804. Unlike the shaped carrier backplate 2700 of FIG. 27A, the edge rails 2802 do not include etch holes configured to permit fluid communication between the rail trenches and the elongated recesses. The shaped carrier backplate 2800 also includes movable electrode 2810 supported on the edge rails 2802 and the posts 2804, and excess movable electrode material 2820 in the elongated recesses 2801. The movable electrodes 2810 include through-holes 2811 configured to permit fluid communication between regions above and below the movable electrodes 2810. The through-holes 2811 allow an etchant to contact a sacrificial material in the rail trenches 2803 so that the sacrificial material can be removed from the rail trenches 2803 during a manufacturing step, as will be better understood from description below. The through-holes 2811 may be formed using any suitable technique, for example, photolithography and etching.

Figure 29A:
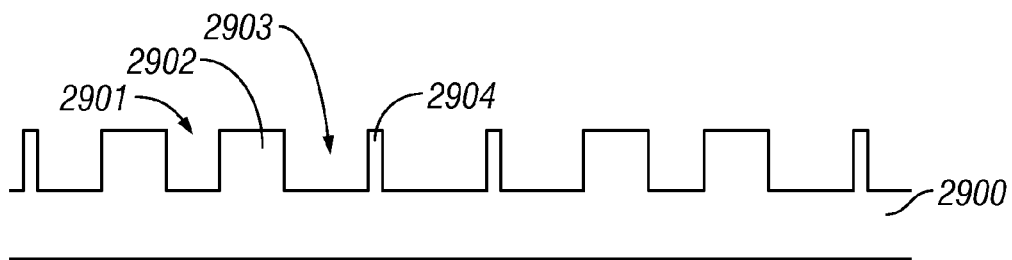
FIGS. 29A-29D are a series of schematic cross-sections illustrating one embodiment of a method of making a shaped carrier backplate.

FIGS. 29A-29D illustrate one embodiment of a method of forming movable electrodes on a shaped carrier backplate. In FIG. 29A, a shaped carrier backplate 2900 is provided. Similar to the shaped carrier backplates 2700, 2800 of FIGS. 27A and 28, the illustrated shaped carrier backplate 2900 includes elongated recesses 2901, edge rails 2902, rail trenches 2903, and posts 2904. In one embodiment, the shaped carrier backplate 2900 have etch holes (not shown) for lateral gas transmission through the rails 2902, similar to the etch holes 2705 of the backplate 2700 of FIG. 27A. In other embodiments, the shaped carrier backplate 2900 may have through-holes 2811 of FIG. 28.

Figure 29B:
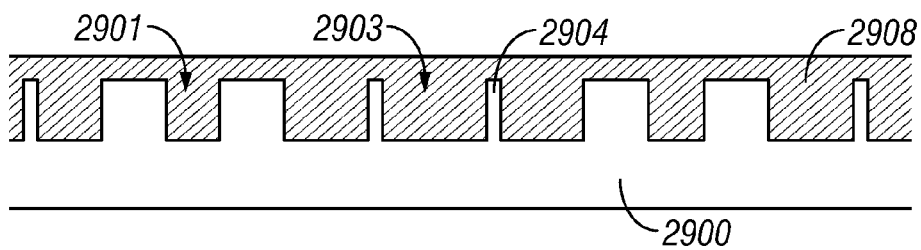

Then, a sacrificial material 2908 is blanket-deposited over the shaped carrier backplate 2900, overfilling the elongated recesses 2701 and the rail trenches 2903, as shown in FIG. 29B. In one embodiment, the sacrificial material 2908 may be a photoresist or a polymeric material such as polyimide. In another embodiment, the sacrificial material 2908 may be a metallic material such as molybdenum, silicon (non-metallic), tungsten, or titanium, which is selectively etchable by a fluorine-based etchant, particularly, $XeF_2$. This step may be carried out using any suitable process, for example, a spin coating (spin-on) or sputtering process. In one embodiment, a metallic sacrificial material may be formed conformally on the backplate 2900. In other embodiments, a photoresist or polymeric sacrificial material may be planar as deposited on the backplate 2900.

Figure 29C:
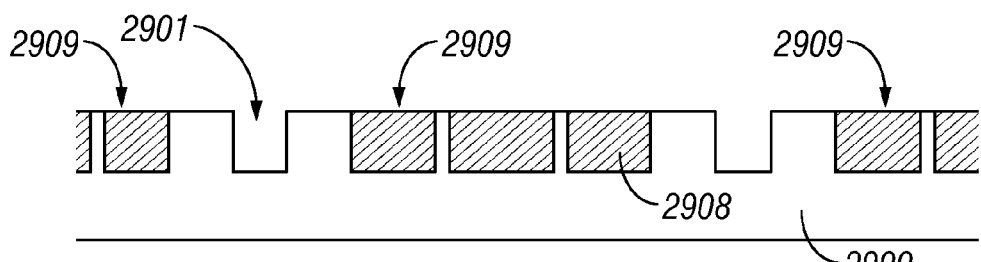

The sacrificial material 2908 is removed such that the sacrificial material 2908 does not protrude beyond the top points of the edge rails 2902 and the posts 2904. This step may be carried out using any suitable process, e.g., chemical mechanical polishing (CMP). This step provides mesas 2909 having a substantially flat top surface and alternating with the elongated recesses 2901, as shown in FIG. 29C. Subsequently, portions of the sacrificial material 2908 are removed from the elongated recesses 2901 using any suitable process, for example, photolithography and etching. In certain embodiments, the elongated recesses 2901 may be deeper than the rail trenches 2903. In such embodiments, the portions of the sacrificial material 2908 within the elongated recesses 2901 may be maintained therein without being removed, thus avoiding a mask step.

Figure 29D:
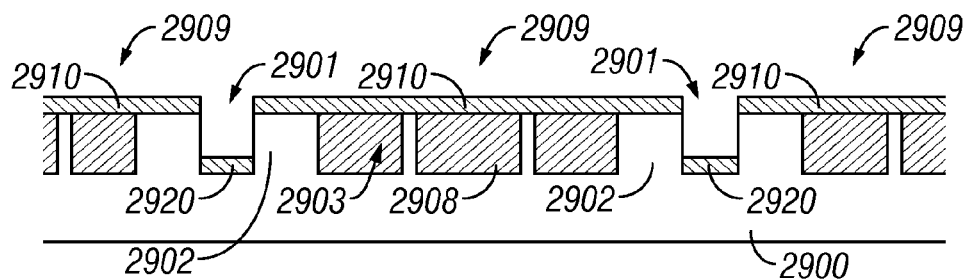

Next, a movable electrode material is deposited on the shaped carrier backplate 2900, as shown in FIG. 29D. The movable electrode material forms movable electrodes 2910 in strips which extend parallel to one another on the mesas 2909. In addition, an excess movable electrode material 2920 remains in the elongated recesses 2901.

In certain embodiments, a bonding agent is deposited on the movable electrodes 2910 in selected locations where it is to make physical and electrical contact to other elements in a mounting or lamination process. Selective application to desired locations can be achieved by deposition, patterning, and etching, or by sputtering or PVD through a shadow mask. Particularly, the bonding agent may be applied to portions (e.g., contact pads) of the movable electrodes 2910 which will contact column routing traces formed on a front substrate. In another example, a column driver can be directly mounted on the carrier backplate. In the final device structure, the portions of the movable electrodes 2910 may oppose portions of the front substrate from which an insulating material has been removed or shielded so as to expose an underlying conductive layer or trace, as described above with respect to FIGS. 20 and 21.

The bonding agent facilitates adhesion between the movable electrodes and the routing traces. The bonding agent may be formed of a conductive adhesive material. The adhesive material may be a cold-weld material which may be weldable at a relatively low temperature. Examples of the material include, but are not limited to, antimony (Sb), indium (In), or tin (Sn). The material may be soft and deformable. In some embodiments, the bonding agent can serve as a gap-filler 1717 as described above with respect to FIG. 17A-17C. The bonding agent described herein may apply to any of embodiments described below with respect to carrier backplates or removable carriers.

Although not shown, the shaped carrier backplate 2900 is then attached to a front substrate such that the movable electrodes 2910 are interposed between the shaped carrier backplate 2900 and the front substrate. Subsequently, the sacrificial material 2908 is removed from the rail trenches 2903. In certain embodiments, the sacrificial material 2908 may be removed prior to attaching the carrier backplate 2900 to the front substrate. In one embodiment in which the backplate 2900 includes etch holes in the edge rails 2902 similar to those of FIG. 27A, the sacrificial material 2908 may be removed through the etch holes. In another embodiment in which the backplate does not have etch holes, the movable electrodes may be patterned to have through-holes similar to the through-holes 2811 of FIG. 28. Then, the sacrificial material 2908 may be removed through the through-holes.

FIGS. 30A-30D illustrate another embodiment of a method of forming movable electrodes on a shaped carrier backplate. In FIG. 29A, a shaped carrier backplate 3000 is provided. Similar to the shaped carrier backplates 2700, 2800 of FIGS. 27A and 28, the illustrated shaped carrier backplate 3000 includes elongated recesses 3001, edge rails 3002, rail trenches 3003, and posts 3004. In one embodiment, the shaped carrier backplate 3000 has etch holes (not shown) in the rails 3002, similar to those of the backplate 2700 of FIG. 27A. In other embodiments, the shaped carrier backplate 3000 may not have etch holes.

Figure 30A:
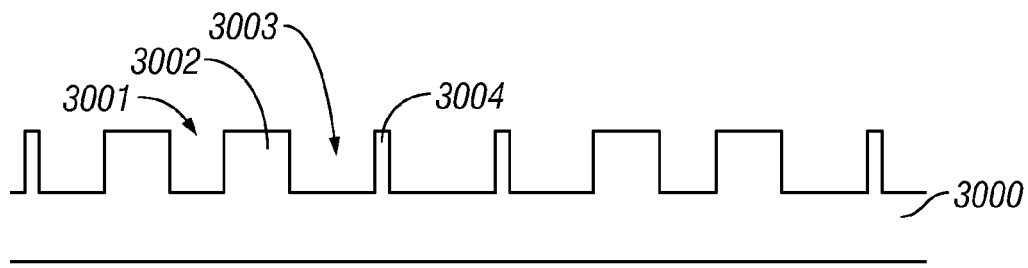
FIGS. 30A-30D illustrate another embodiment of a method of making a shaped carrier backplate.
Figure 30B:
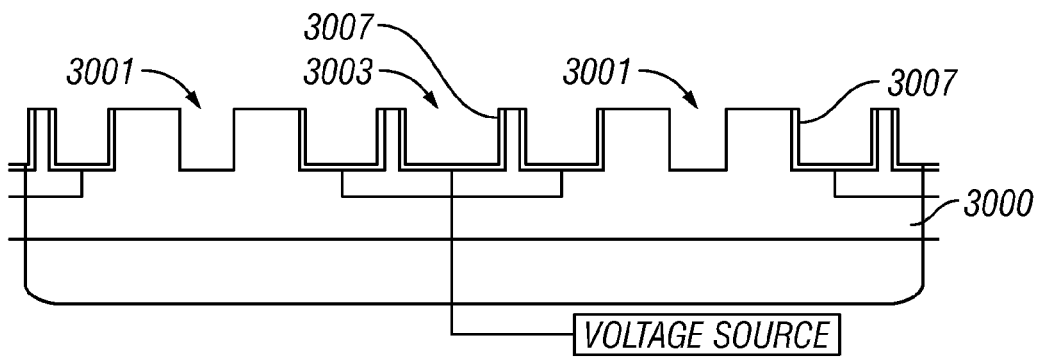
Figure 30C:
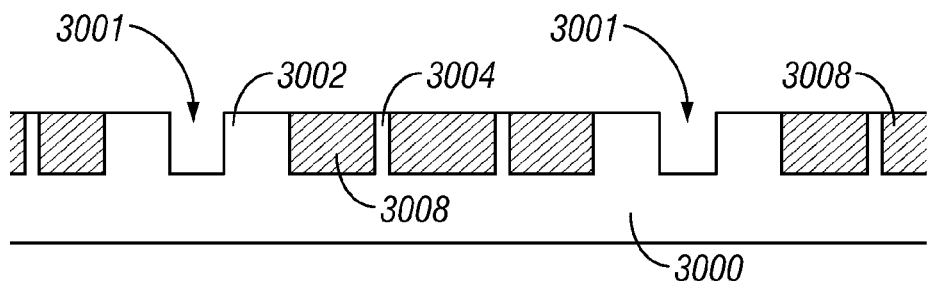
Figure 30D:
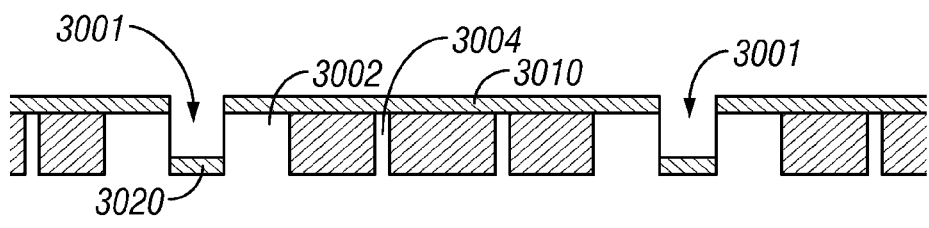

Next, seed layers 3007 are selectively deposited on portions of the backplate 3000 on which a sacrificial material is to be deposited. Such portions may include at least the bottom surfaces of the rail trenches 3003. The seed layers 3007 can be selectively deposited through a shadow mask (not shown). Then, the seed layers 3007 are electrically connected to a voltage source for electroplating, as shown in FIG. 30B. For electroplating, the backplate 3000 may be immersed in a solution containing the sacrificial material. The sacrificial material may be a metallic material suitable for electroplating, for example, tungsten, molybdenum, or titanium, which is etchable by a fluorine-based etchant, particularly, $XeF_2$. Then, an electric potential is applied between the seed layers and an electrode also immersed in the solution. The resulting backplate 3000 with the selectively plated sacrificial material 3008 is shown in FIG. 30C. In certain embodiments, an overburden or excess sacrificial material may be removed using any suitable process, for example, chemical mechanical polishing (CMP), to leave the planarized structure of FIG. 30C.

Next, a movable electrode material is deposited over the shaped carrier backplate 3000. The movable electrode material forms movable electrodes 3010 in strips which extend parallel to one another. In addition, an excess movable electrode material 3020 remains in the elongated recesses 3001. After laminating the backplate 3000 with a front substrate, the sacrificial material 3008 is removed from the rail trenches 3003. In certain embodiments, the sacrificial material 3008 may be removed prior to attaching the carrier backplate 3000 to the front substrate. The details of this step may be as described above with respect to the sacrificial material removal step (FIG. 29D).

Figure 31A:
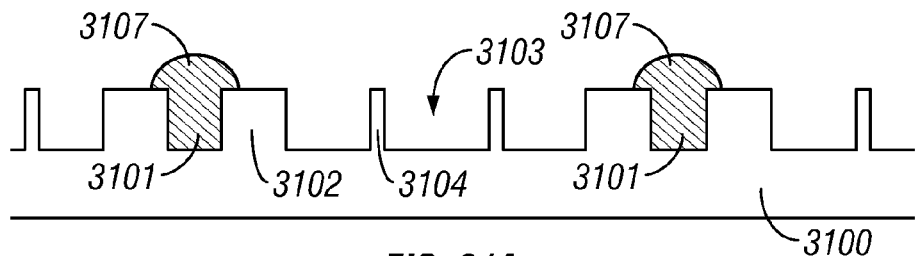
FIGS. 31A-31D illustrate yet another embodiment of a method of making a shaped carrier backplate.

FIGS. 31A-31D illustrate yet another embodiment of a method of forming movable electrodes on a shaped carrier backplate. In FIG. 31A, a shaped carrier backplate 3100 is provided. Similar to the shaped carrier backplates 2700, 2800 of FIGS. 27A and 28, the illustrated shaped carrier backplate 3100 includes elongated recesses 3101, edge rails 3102, rail trenches 3103, and posts 3104. In one embodiment, the shaped carrier backplate 3100 has etch holes (not shown) in the rails 3102 similar to those of the backplate 2700 of FIG. 27A. In other embodiments, the shaped carrier backplate 3100 may not have etch holes. The shaped carrier backplate 3100 is provided with blocking masks 3107 over the elongated recesses 3101. In one embodiment, the blocking masks 3107 may be formed by screen printing or shadow masking.

Figure 31B:
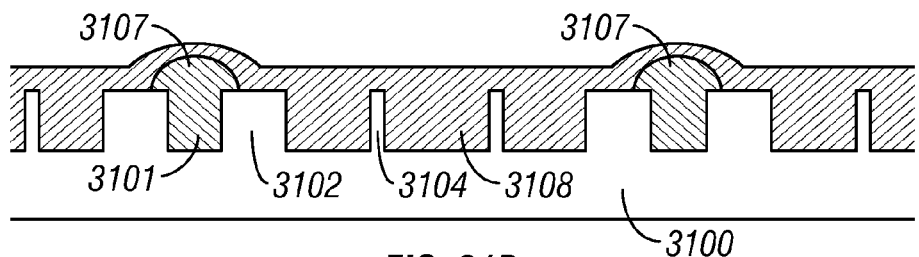

Then, a sacrificial material 3108 is blanket-deposited over the shaped carrier backplate 3100, overfilling the rail trenches 3103, as shown in FIG. 31B. The blocking masks 3107 prevent the sacrificial material 3108 from being deposited in the elongated recesses 3101. The details of this step may be as described above with reference to FIG. 29B.

Figure 31C:
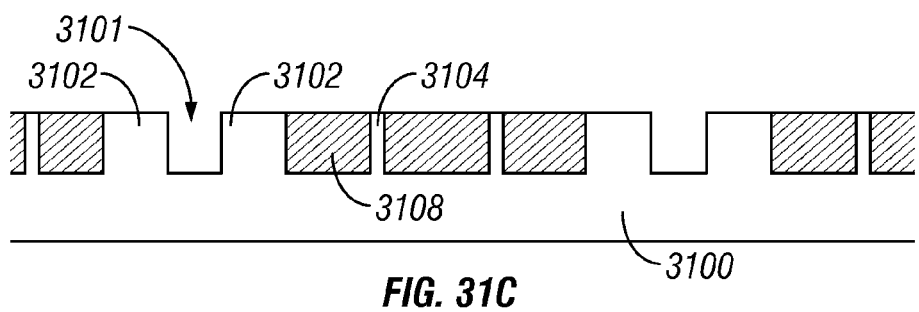
Figure 31D:
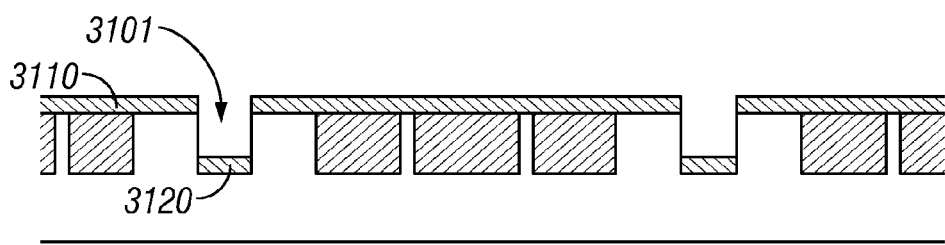

Subsequently, an excess or overburden sacrificial material 3108 is removed such that the sacrificial material 3108 does not protrude beyond the top points of the edge rails 3102 and the posts 3104. This step may be carried out using any suitable planarization process, e.g., chemical mechanical polishing (CMP). Then, the blocking masks 3107 are removed from the elongated recesses 3101 by, for example, an ashing process, as shown in FIG. 31C. In other embodiments, the blocking masks 3170 may be selectively removed using any suitable technique, for example, masking and etching.

Next, a movable electrode material is deposited over the shaped carrier backplate 3100. The movable electrode material forms movable electrodes 3110 in a strip form which extend parallel to one another. In addition, an excess movable electrode material 3120 remains in the elongated recesses 3101. After laminating the backplate 3010 with a front substrate, the sacrificial material 3108 is removed from the rail trenches 3103. The details of this step may be as described above with respect to the sacrificial material removal step (FIG. 29D).

Figure 32A:
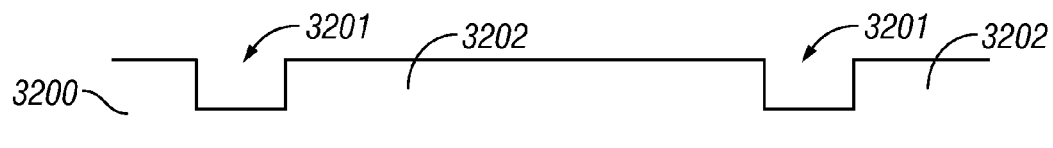
FIGS. 32A-32C are schematic cross sections of embodiments of shaped carrier backplates.

FIG. 32A illustrates yet another embodiment of a shaped carrier backplate. The illustrated shaped carrier backplate 3200 has elongated recesses 3201 extending substantially parallel to one another. The recesses 3201 define elongated mesas 3202 alternating with the recesses 3201.

Figure 32B:
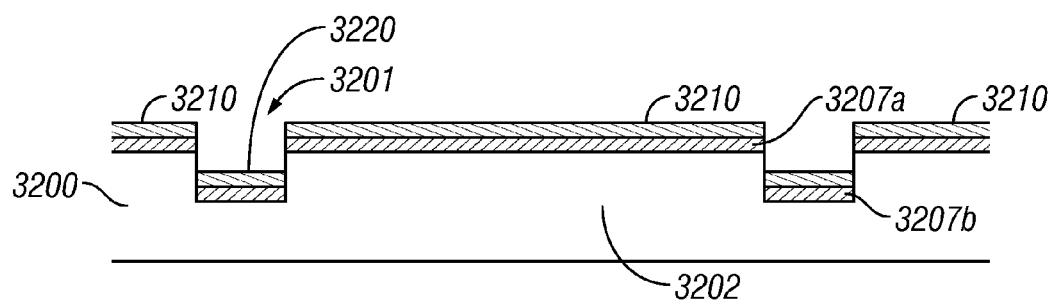

Referring to FIG. 32B, a sacrificial material 3207b may be deposited across the backplate 3200 so as to be discontinuous between the elongated recesses 3201 and the mesas 3202. Subsequently, a movable electrode material is deposited across the backplate 3200, forming movable electrodes 3210 on the mesas 3202 and excess mechanical layers 3220 in the elongated recesses 3201, as shown in FIG. 32B. The movable electrodes 3210 on the mesas 3202 and the excess mechanical layers 3220 in the recesses 3201 are discontinuous with one another. In one embodiment, the overall thickness of the movable electrode material 3220 and the sacrificial material 3207b is equal to or less than a half of the depth of the elongated recesses 3201. This configuration provides electrical isolation between the movable electrodes 3210.

As will be better understood from description below, the sacrificial material 3207a on the mesas 3202 will be removed after attaching the backplate 3200 to a front substrate (not shown). This sacrificial material removal step will release the movable electrodes 3210 from the backplate 3200 onto the front substrate. However, the sacrificial material 3207b in the elongated recesses 3201, if sealed from release etch, will still remain after the sacrificial material removal step. The sacrificial material 3207b in the elongated recesses 3201 will hold the excess mechanical layers 3220 in place in the completed interferometric modulator display device.

Figure 32C:
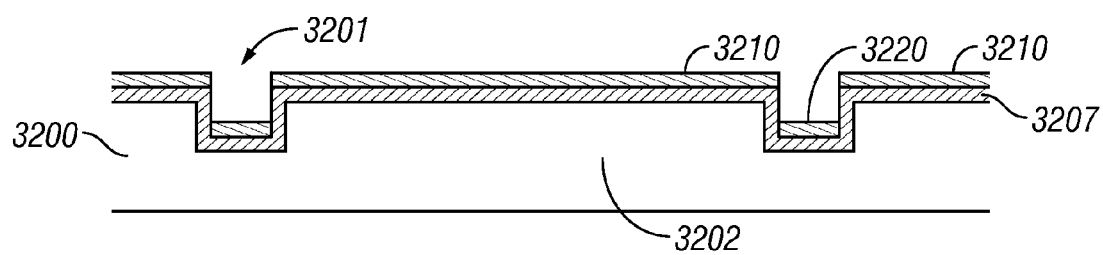

FIG. 32C illustrates a cross section of another embodiment of a method of forming movable electrodes on a shaped removable carrier. Referring to FIG. 32C, a release layer 3207 may be deposited conformally across the backplate 3200 so as to be continuous between the elongated recesses 3201 and the mesas 3202. Subsequently, a movable electrode material is deposited across the backplate 3200, forming movable electrodes 3210 on the mesas 3202 and excess mechanical layers 3220 in the elongated recesses 3201. The movable electrodes 3210 on the mesas 3202 and the excess mechanical layers 3220 are discontinuous with one another. This configuration provides electrical isolation between the movable electrodes 3210.

As will be better understood from description below, the release layer 3207 will be removed after attaching the backplate 3200 to a front substrate (not shown). This removal step will release the movable electrodes 3210 from the backplate 3200 onto the front substrate. The excess mechanical layers 3220 will be supported by excess mechanical layer supports extending from the front substrate, as will be better understood from description below of FIGS. 34A-34D.

Figure 32D:
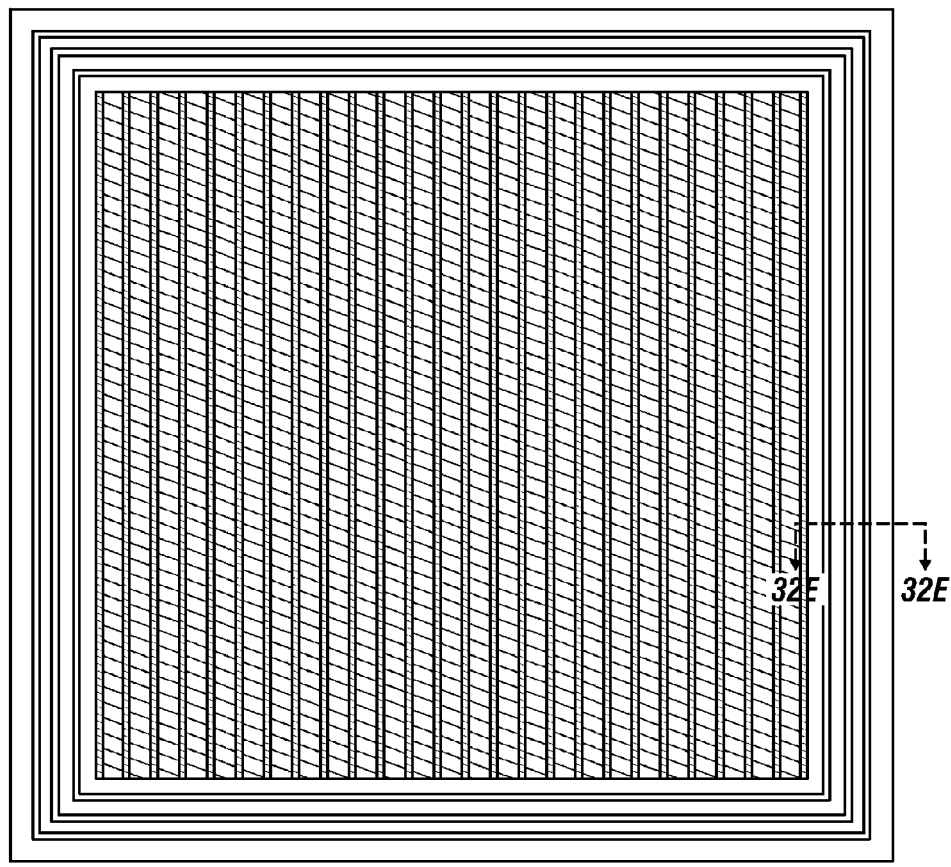
FIG. 32D is a schematic top plan view of the shaped carrier backplate of FIG. 32B.
Figure 32E:
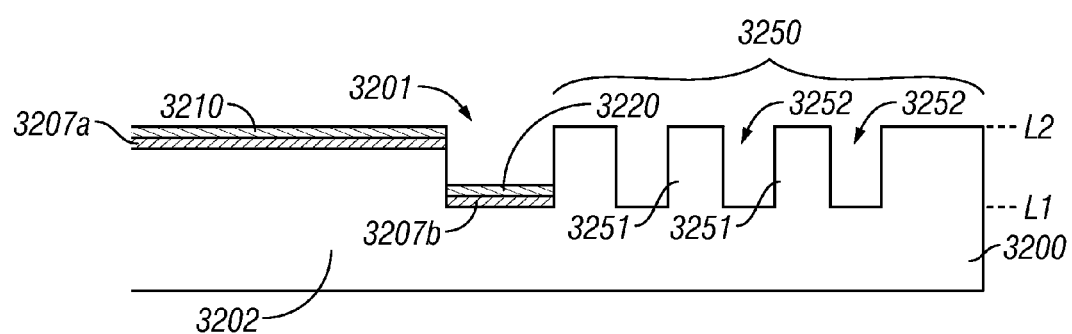
FIG. 32E is a schematic cross section of an edge portion of the shaped carrier backplate of FIG. 32D.

FIG. 32D is a top plan view of the shaped carrier backplate 3200 of FIG. 32B. FIG. 32E is a cross section of an edge portion 3250 of the shaped carrier backplate 3200 of FIG. 32D. The edge portion 3250 includes perimeter ridges 3251 extending along the edge of the backplate 3200. The perimeter ridges 3251 define recesses 3252 therebetween. A skilled artisan will appreciate that the number of the recesses 3252 can vary depending on the design of the carrier backplate.

In one embodiment, the perimeter ridges 3251 are taller than rails 3202, and may be covered by a shadow mask during deposition of a sacrificial material or mechanical layer. Thus, the edge portion 3250 may not include either a sacrificial material or an excess mechanical layer, while being configured to be attached to the front substrate with an intervening sealant such as frit or metal for hermetic seal. The perimeter ridges 3251 surround the display region of the resulting interferometric modulator display device to make a series of rings at the substrate level L2. The perimeter ridges 3251 seal the excess mechanical layer at level L1. In other embodiments, the edge portion 3250 may include a mechanical layer which can partly serve as a sealant. The perimeter ridges 3251 serve to prevent the sacrificial material 3207b in an elongated recess 3201 neighboring the edge portion 3250 from being removed during the sacrificial material removal step. This configuration allows the sacrificial material 3207b in the elongated recess 3201 to hold the excess mechanical layer 3220 in place in the completed display device.

In certain embodiments, the carrier backplate 3200 may have a sacrificial material blanket-deposited on the surfaces thereof, including the sidewalls of the perimeter ridges 3251. In such embodiments, the recesses 3252 may be filled with a sealant such that the sacrificial material is not etched during a sacrificial layer removal step.

Figure 33A:
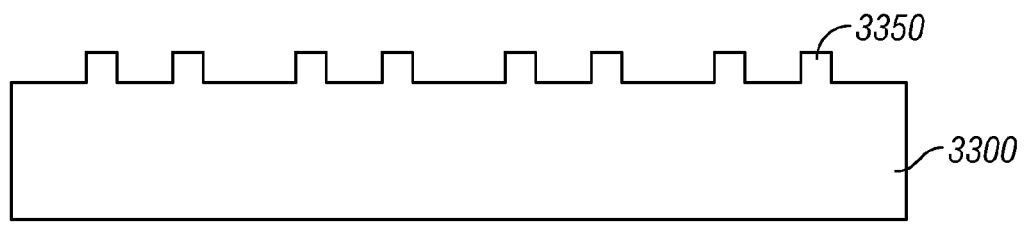
FIGS. 33A-33D illustrate yet another embodiment of a method of making a shaped carrier backplate having patterned movable electrodes.

FIGS. 33A-33D are cross sections illustrating a method of making a shaped carrier backplate having patterned movable electrodes according to another embodiment. In the illustrated embodiment, a carrier backplate 3300 is shaped to have a plurality of posts or connectors 3350, as shown in FIG. 33A. The posts 3350 may be shaped using any suitable process such as embossing, inscribing, or photolithography and etching, the last of which provides preformed posts. Embossing or inscribing forms the posts 3350 integrally with and of the same material as the backplate 3300.

Figure 33B:
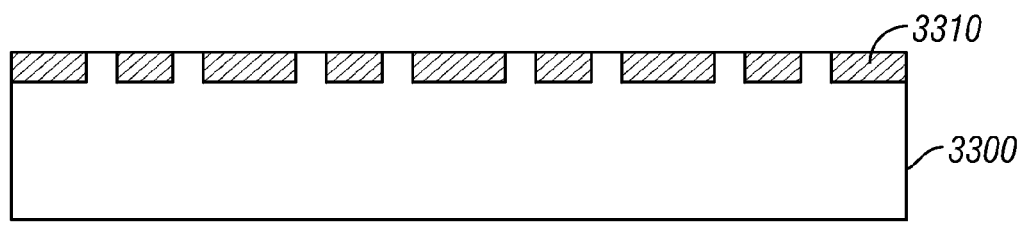

Subsequently, a sacrificial material 3310 is deposited over the backplate 3300. Then, the sacrificial material 3310 is etched back to expose the posts 3350, as shown in FIG. 33B. The sacrificial material 3310 may be planarized using any suitable technique, including but not limited to, chemical mechanical polishing (CMP).

Figure 33C:
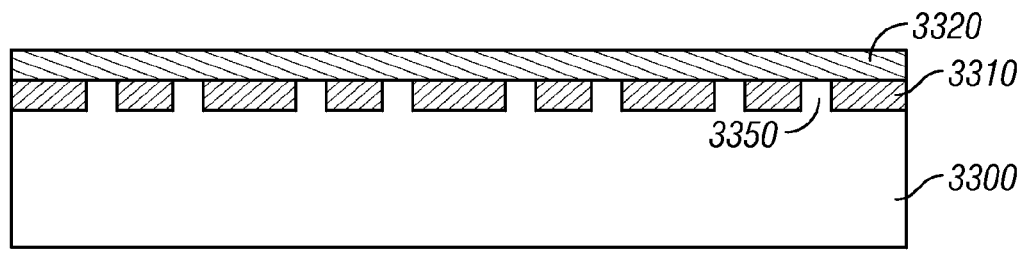
Figure 33D:
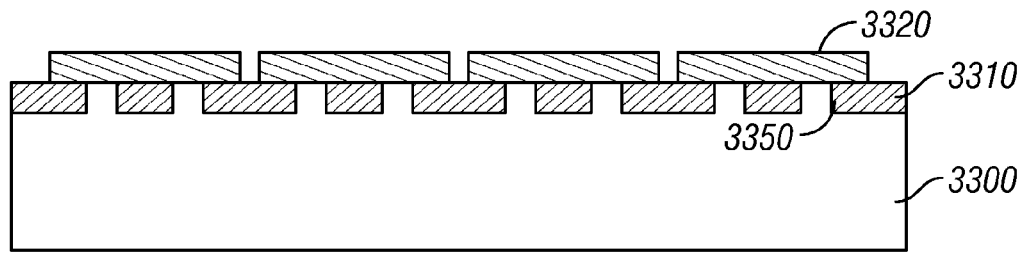

Next, a movable electrode material 3320 is deposited across the backplate 3300, as shown in FIG. 33C. Then, the movable electrode material 3320 is patterned using any suitable technique, for example, photolithography and etching. The resulting movable electrodes 3320 are shown in FIG. 33D. The movable electrodes 3320 are supported on the posts 3350 and also partially on the sacrificial material 3310. In one embodiment, the movable electrodes 3320 may be patterned to separate the electrodes 3320 and provide release holes as described above with respect to FIG. 28 to facilitate removing the underlying sacrificial material at a removal step described below. In certain embodiments, a bonding agent may be deposited on the movable electrodes 3320 in selected locations before or after patterning the movable electrodes 3320. Details of the bonding agent is described above with respect to FIGS. 29A-29D.

Next, the carrier backplate 3300 is attached to a front substrate (not shown) so that the movable electrodes 3320 are interposed therebetween. Then, the sacrificial material 3310 is removed. In certain embodiments, the sacrificial material 3310 may be removed prior to attaching the carrier backplate 3300 to the front substrate. The movable electrodes 3320 are supported by rails and posts of the front substrate.

Figure 34A:
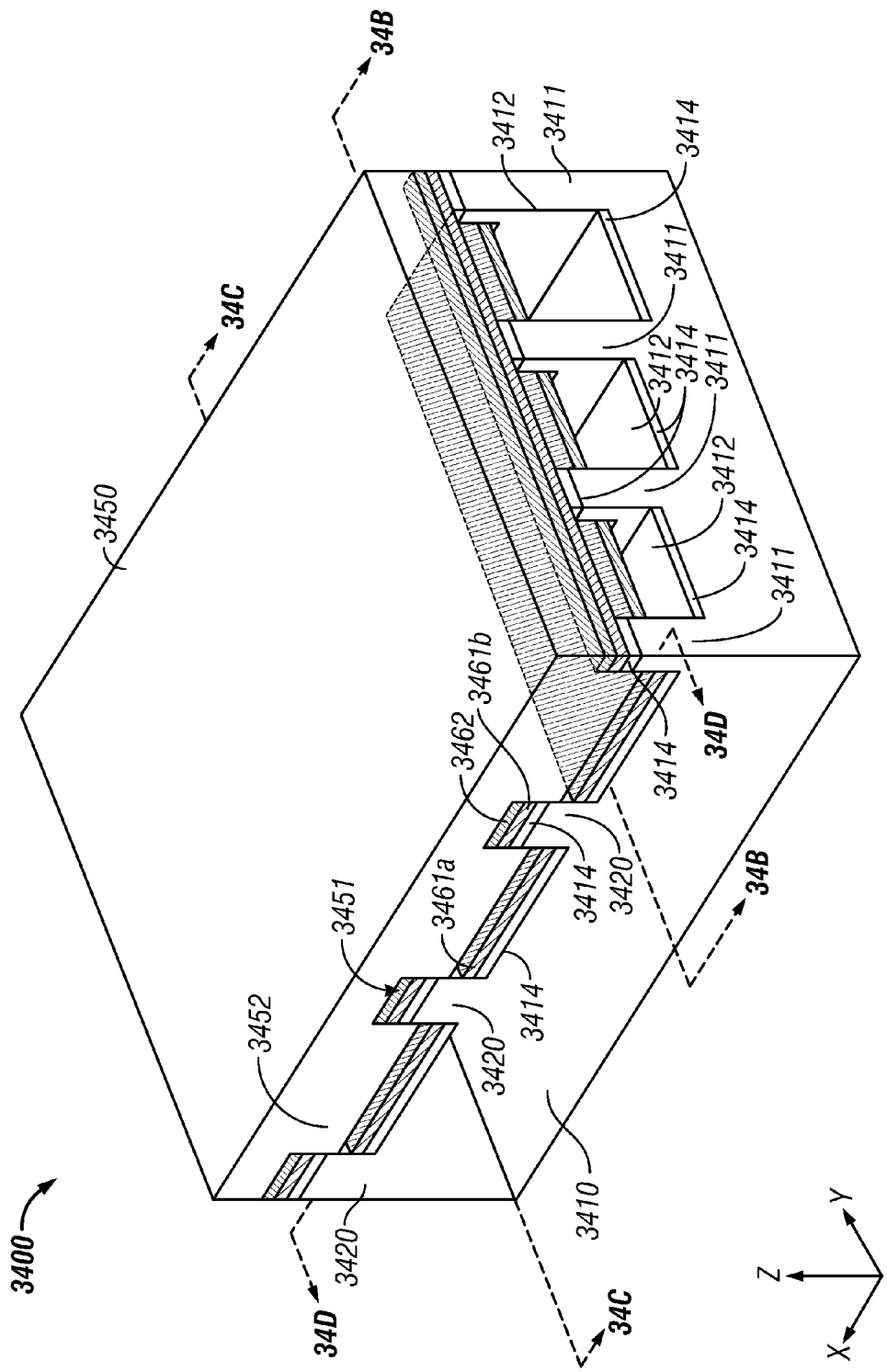
FIG. 34A is a schematic partial perspective view of an interferometric modulator display device having excess mechanical layer supports elevated between movable electrode strips according to one embodiment.

FIG. 34A is a schematic perspective view of a partially fabricated interferometric modulator display device 3400 according to one embodiment. The illustrated portion of the device is a display region of the device 3400. The device 3400 includes a shaped front substrate 3410 and a shaped carrier backplate 3450 attached to each other with movable electrodes 3461a interposed therebetween.

The shaped front substrate 3410 includes rails 3411 extending parallel to one another, troughs 3412 defined by the rails 3411, and optical stacks 3414 on the bottom of the troughs 3412 and on top of the rails 3411. The shaped front substrate 3410 further includes excess mechanical layer supports 3420 formed on the rails 3411. The configurations of the rails 3411, the troughs 3412, and the optical stacks 3414 may be as described above with respect to those of FIG. 10.

The shaped carrier backplate 3450 includes elongated recesses 3451 and mesas 3452 defined by the elongated recesses 3451. The shaped carrier backplate 3450 also includes excess mechanical layers 3461b and sacrificial layers 3462 in the elongated recesses 3451. The sacrificial layers 3462 are enclosed by the excess mechanical layers 3461b, the elongated recesses 3451, rings of perimeter ridges (not shown) as discussed with respect to FIGS. 32D and 32E. The configurations of the elongated recesses 3451, the mesas 3452, the excess mechanical layers 3461b, and the sacrificial layers 3462 may be as described above with respect to those of FIG. 32B.

Figure 34B:
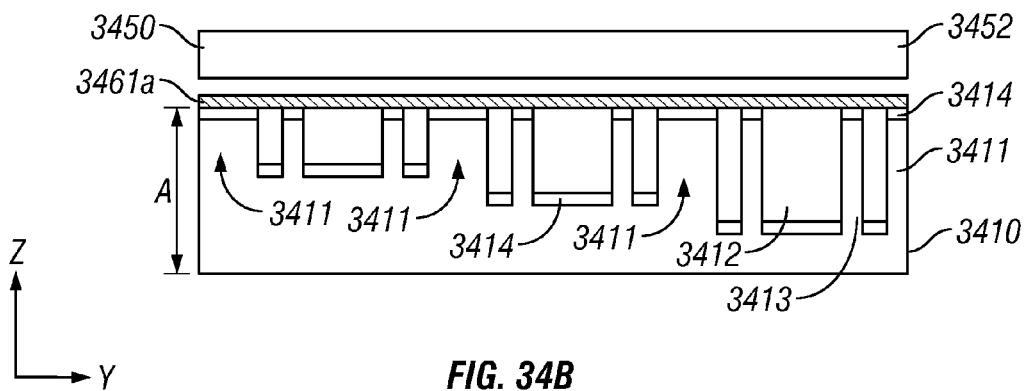
FIGS. 34B-34D are schematic cross sections of the interferometric modulator display device of FIG. 34A, taken along lines 34B-34B, 34C-34C, and 34D-34D, respectively.

The movable electrodes 3461a are interposed between the mesas 3452 of the backplate 3450 and the optical stack 3414 on top of the rails 3411 of the front substrate 3410. As described above with reference to FIG. 32B, a sacrificial material which had been interposed between the movable electrodes 3461a and the mesas 3452 has now been removed, releasing the movable electrodes 3461a from the backplate 3450. Referring to FIG. 34B, the movable electrodes 3461a are now supported on the optical stack 3414 on top of the rails 3411 while spaced from the mesas 3452 due to the removed sacrificial layer.

Figure 34C:
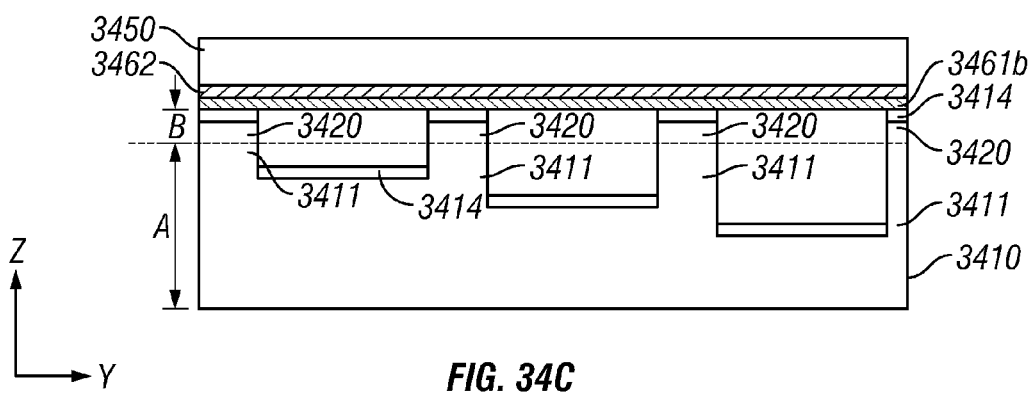
Figure 34D:
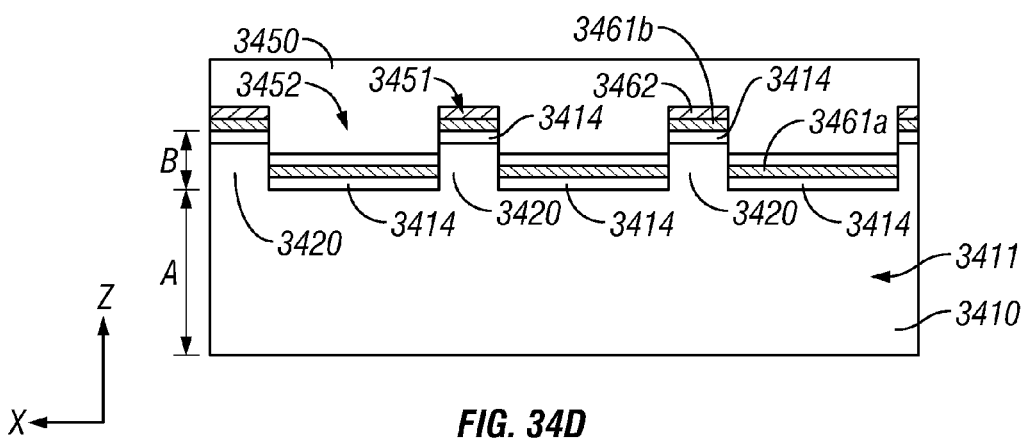

In the illustrated embodiment, the shaped front substrate 3410 further includes excess mechanical layer supports 3420. Referring to FIGS. 34C and 34D, the excess mechanical layer supports 3420 protrude or extend upwards from the rails 3411. In addition, the optical stacks 3414 are formed on top of the excess mechanical layer supports 3420. The excess mechanical layer supports 3420 are configured to support the excess mechanical layers 3461b in the elongated recesses 3451 of the backplate 3450. The excess mechanical layer supports 3420, together with the sacrificial layers 3462, hold up the excess mechanical layers 3461b to the backplate 3450. In some embodiments (for example, the backplate of FIG. 32C) in which the backplate 3450 does not have a sacrificial material in the elongated recesses 3451, only the excess mechanical layer supports 3420 may serve to hold up the excess mechanical layers 3461b to the backplate 3450. This can happen if the sacrificial layer is removed in the recesses at the same time as on mesas of the carrier backplate (e.g., no rings of perimeter ridges).

b. Shaped Removable Carrier

Figure 35A:
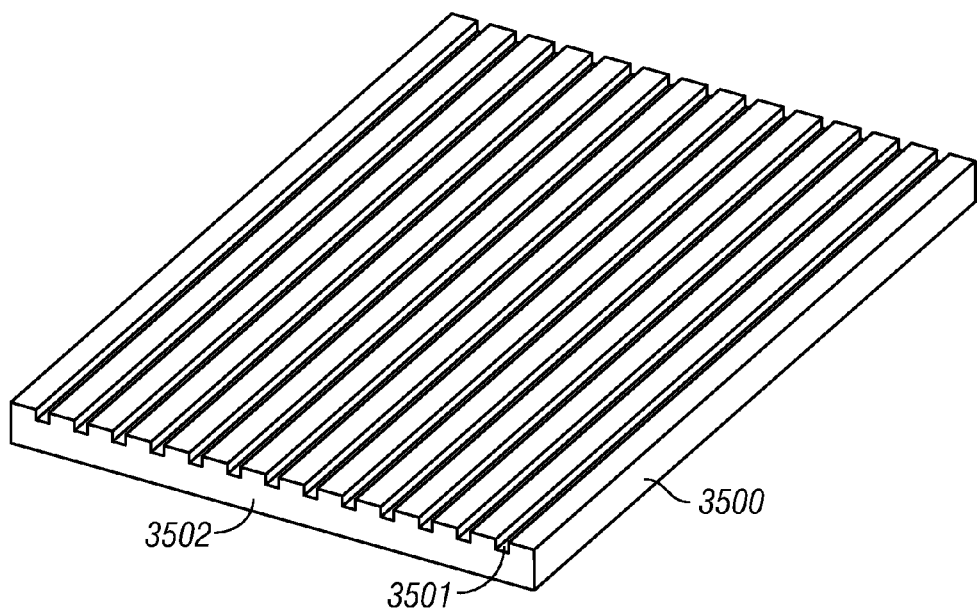
FIGS. 35A and 35B are schematic, perspective views illustrating one embodiment of a method of making a removable carrier for transferring a movable electrode to a front substrate.
Figure 35B:
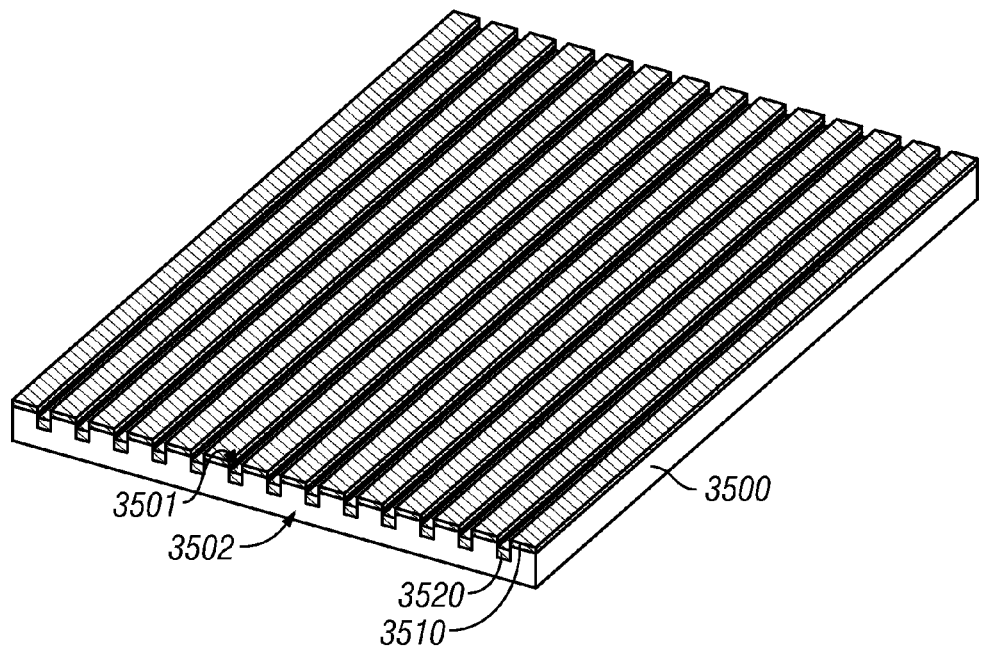

FIG. 35A is a schematic perspective view of a shaped removable carrier 3500 according to one embodiment. The illustrated shaped removable carrier 3500 includes elongated recesses 3501 running parallel to one another, and elongated mesas 3502 defined by the recesses 3501. The carrier 3500 may carry movable electrodes 3510 formed on the mesas 3502, as shown in FIG. 35B. The carrier 3500 may also carry excess mechanical layers 3520 in the recesses 3501, which will be removed together with the carrier 3500 after transferring the movable electrodes 3510 to a front substrate. The recesses 3501 are deep enough to ensure that the desired thickness of the movable electrodes 3510 deposited on the carrier 3500 is discontinuous between the mesas 3502 and the recesses 3501.

In one embodiment, the shaped removable carrier 3500 may be formed of a polymeric material. The polymeric material may be dissolved, ashed, or evaporated after transferring the movable electrodes to a front substrate. In other embodiments, the removable carrier 3500 may be physically lifted or peeled from the front substrate, while leaving the movable electrodes on the front substrate. In such embodiments, the movable electrodes may be formed directly on the removable carrier 3500 without an intervening sacrificial layer.

In another embodiment, the shaped removable carrier 3500 may be a recyclable carrier. The recyclable carrier may be formed of a polymeric material, such as a polyimide film. An exemplary polyimide film is formed of poly(4,4'-oxydiphenylene-pyromellitimide) (KAPTON® available from E. I. du Pont de Nemours and Company).

Figure 35C:
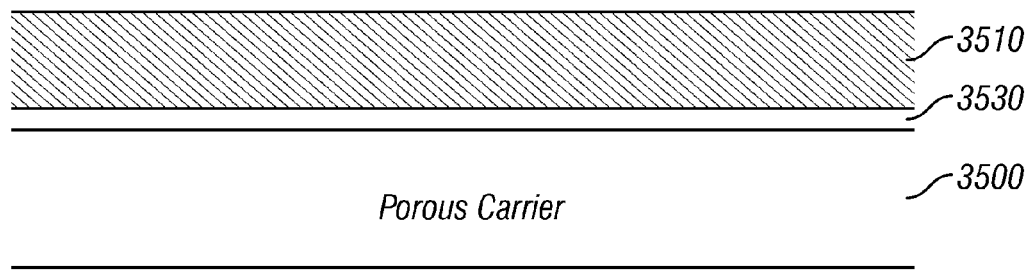
FIGS. 35C and 35D are schematic cross sections illustrating one embodiment of a method of making an interferometric modulator display device using a removable carrier.

In yet another embodiment, the recyclable carrier may be formed of a porous polymeric material. Referring to FIG. 35C, in such an embodiment, before forming the movable electrodes 3510 on the carrier 3500, a release layer 3530 is formed on the carrier 3510. Then, the movable electrodes 3510 are formed on the release layer 3530. The release layer 3530 may be as thin as a single atomic layer as long as it is a continuous film intervening at all locations between the carrier 3500 and the movable electrode layer 3510, 3520. In one embodiment, the release layer 3530 may be formed of molybdenum.

Figure 35D:
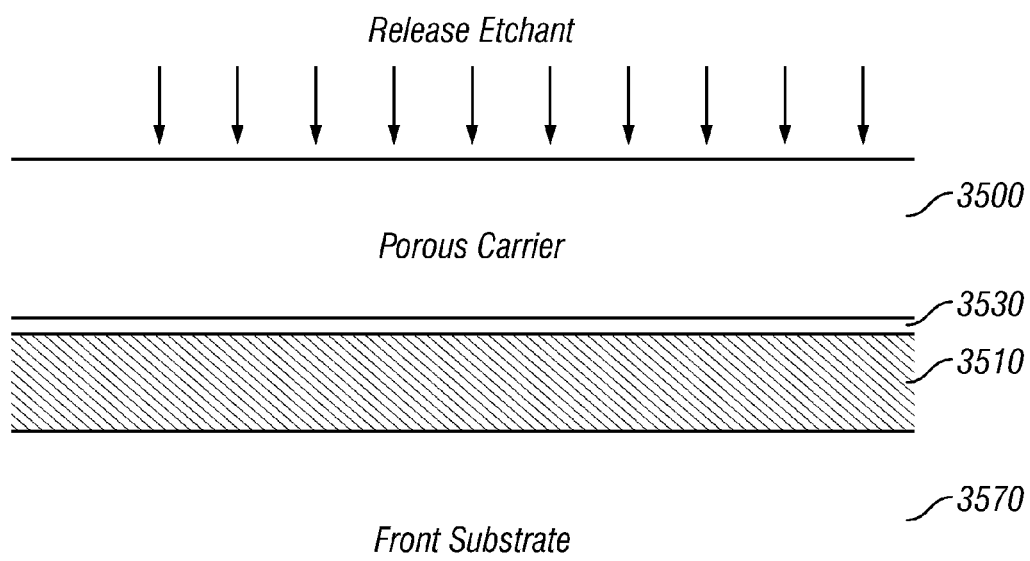

Referring to FIG. 35D, in order to transfer the movable electrodes 3510 to a front substrate 3570, a release etchant is provided through the porous carrier 3500. The release etchant is able to travel through the porous carrier 3500 to reach and remove the release layer 3530, thereby releasing the movable electrodes 3510 from the recyclable carrier 3500. The recyclable carrier 3500 may be recycled for manufacturing other interferometric modulator display devices.

Referring back to FIG. 19, the shaped carriers of the embodiments described above with respect to FIGS. 25-35D may have additional structures to form routing traces 1917 connected to the movable electrodes 1960. A skilled artisan will appreciate that the additional structures may include various configurations of trenches and mesas depending on the configuration of the routing traces, with the higher elevation features representing locations to receive functional conductive layers to be transferred to the substrate and lower elevation features representing isolation between the functional conductive layers. In other embodiments in which a front substrate provides routing traces similar to those shown in FIG. 17 or 18, the shaped carrier may only have structures for the movable electrodes without additional structures for the routing traces.

2. Carriers with Patterned Movable Electrodes

In some embodiments, unlike the movable electrodes on the shaped carriers described above, movable electrodes may be patterned on a carrier. Such a carrier may be either a permanent carrier backplate or a removable carrier. The carrier may have a substantially planar surface. In other embodiments, the carrier may have connectors or posts to support movable electrodes.

a. Carrier Backplate with Patterned Movable Electrodes

Figure 36A:
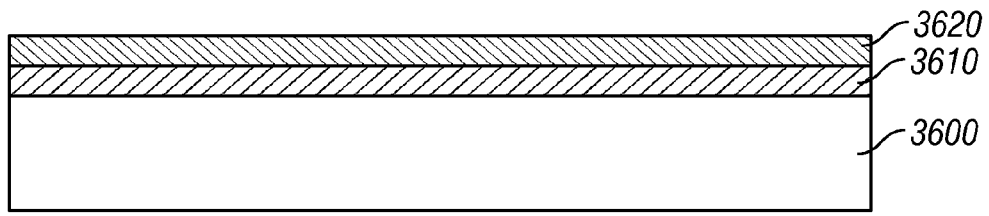
FIGS. 36A-36E are schematic cross sections illustrating one embodiment of a method of making a carrier with patterned movable electrodes.

FIGS. 36A-36E are cross sections illustrating a method of patterning movable electrodes on a carrier backplate according to one embodiment. In the illustrated embodiment, a substantially planar carrier backplate 3600 is provided, as shown in FIG. 36A. Then, a sacrificial material 3610 is deposited on the backplate 3600. Subsequently, a movable electrode material 3620 is deposited on the sacrificial material 3610.

Figure 36B:
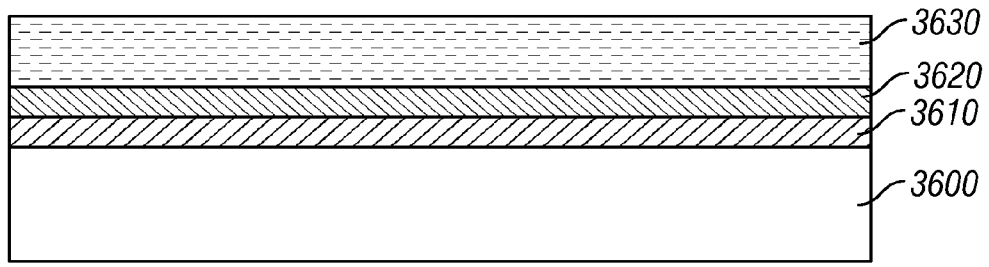
Figure 36C:
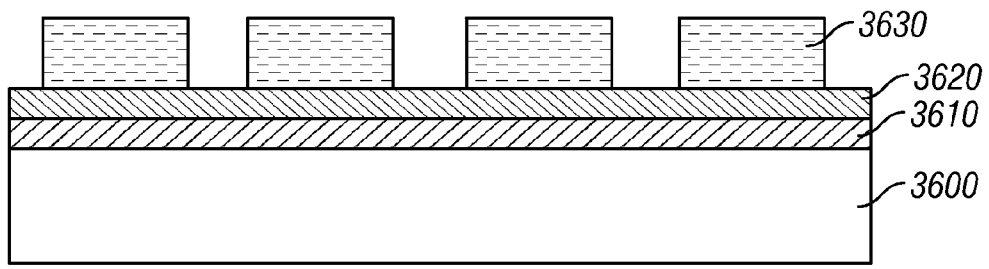

Referring to FIG. 36B, a photoresist layer 3630 is formed on the movable electrode material 3620. Then, the photoresist layer 3630 is patterned to provide a mask for use in etching the movable electrode material 3620 and the sacrificial material 3610, as shown in FIG. 36C.

Figure 36D:
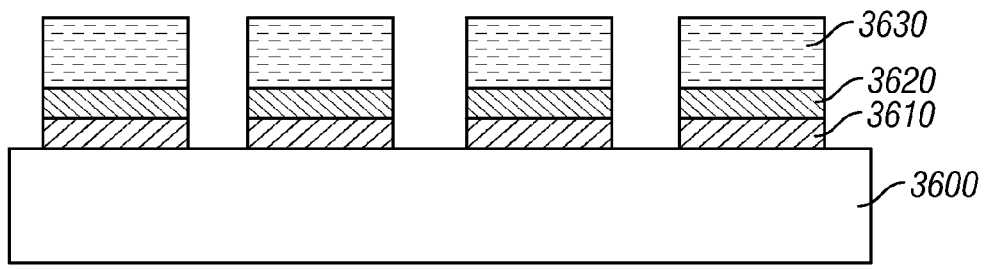
Figure 36E:
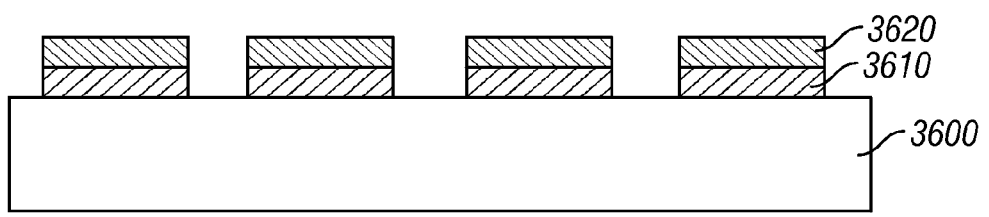

Subsequently, the movable electrode material 3620 and the sacrificial material 3610 are etched using any suitable etchants, as shown in FIG. 36D. The movable electrode material 3620 can be etched by either a wet or dry etch process. In an embodiment in which the sacrificial material 3610 is molybdenum, the sacrificial material 3610 may be etched by a phosphoric/acetic/nitric acid or "PAN" etchant. Finally, the photoresist layer 3630 is removed from the carrier backplate 3600.

As described above with respect to the shaped carrier backplate, the carrier backplate is then attached to a front substrate (not shown) having stationary electrodes, such that the movable electrodes 3620 are interposed therebetween. Then, the sacrificial material 3610 is removed to release the movable electrodes from the backplate 3600. The movable electrodes 3620 are supported by rails and posts of the front substrate, while being movable toward the front substrate. The carrier backplate 3600 stays as a backplate, forming part of the completed interferometric modulator display device. The details of attaching the backplate 3600 to the front substrate will be described below with reference to FIGS. 43A-43C.

Figure 37A:
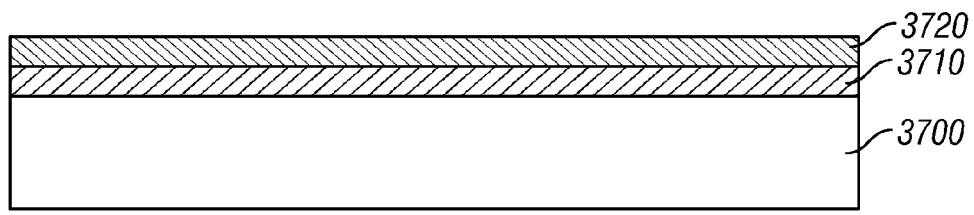
FIGS. 37A-37E illustrate another embodiment of a method of making a carrier with patterned movable electrodes.

FIGS. 37A-37E are cross sections illustrating a method of patterning movable electrodes on a carrier backplate according to another embodiment. In the illustrated embodiment, a substantially planar carrier backplate 3700 is provided, as shown in FIG. 37A. Then, a sacrificial material 3710 is deposited on the backplate 3700. Subsequently, a movable electrode material 3720 is deposited on the sacrificial material 3710.

Figure 37B:
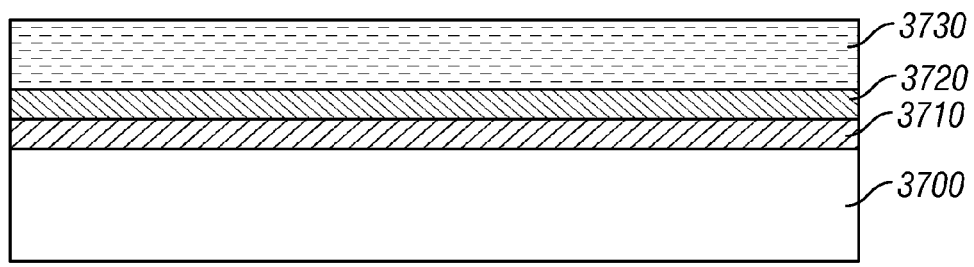
Figure 37C:
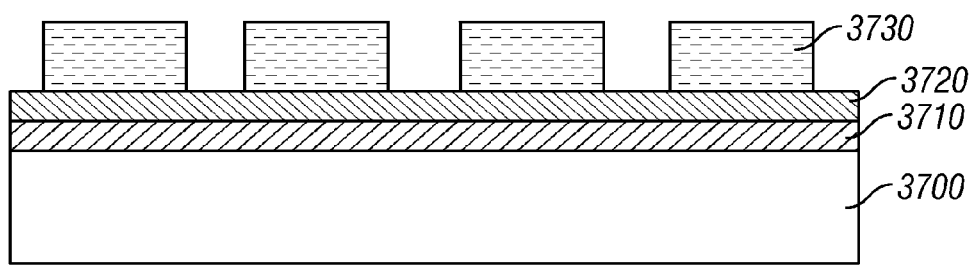
Figure 37D:
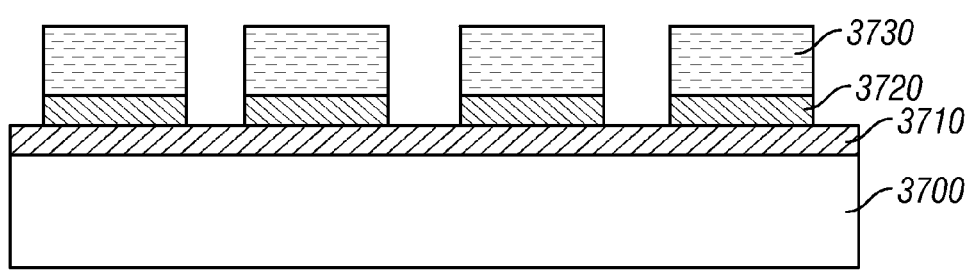
Figure 37E:
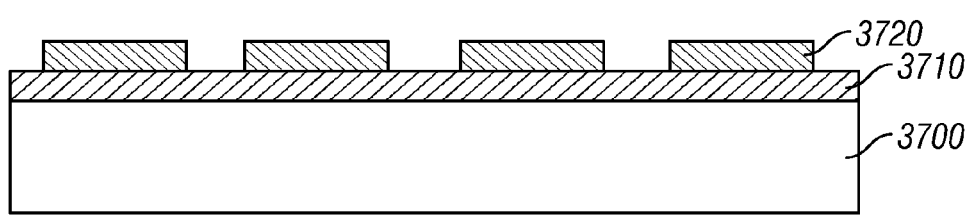

Referring to FIG. 37B, a photoresist layer 3730 is formed on the movable electrode material 3720. Then, the photoresist layer 3730 is patterned to provide a mask for use in etching the movable electrode material 3720, as shown in FIG. 37C. Subsequently, the movable electrode material 3720 is etched using any suitable etchant, as shown in FIG. 37D. The movable electrode material 3720 can be etched by either a wet or dry etch process. Then, the photoresist layer 3730 is removed as shown in FIG. 37E.

Then, the carrier backplate 3700 is attached to a front substrate (not shown) having stationary electrodes, such that the movable electrodes 3720 are interposed therebetween. Then, the sacrificial material 3710 is removed to release the movable electrodes from the backplate 3700. The movable electrodes 3720 are supported by rails and posts of the front substrate. Thus, the sacrificial or release layer 3710 of this embodiment need not be patterned. The carrier backplate 3700 stays as a backplate in the final product. The details of attaching the backplate 3700 to the front substrate will be described below with reference to FIGS. 43A-43C.

Figure 38A:
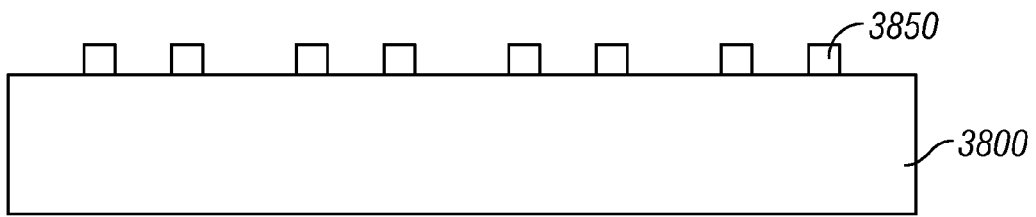
FIGS. 38A-38D illustrate yet another embodiment of a method of making a carrier with patterned movable electrodes.

FIGS. 38A-38D are cross sections illustrating a method of patterning movable electrodes on a carrier backplate according to yet another embodiment. In the illustrated embodiment, a substantially planar carrier backplate 3800 is provided, as shown in FIG. 38A. Then, connectors 3850 are formed on the carrier backplate 3800. The connectors 3850 may be formed using any suitable process such as photolithography and etching. The connectors 3850 may be formed of a polymeric material such as polyimide or photoresist or an inorganic material such as silicon oxide ($SiO_2$). In one embodiment, the connectors 3850 may be formed using a spin-on-glass technique. In another embodiment, the connectors 3850 may be formed by embossing the backplate. In such an embodiment, the connectors 3850 are formed integrally with and of the same material as the backplate 3800.

Figure 38B:
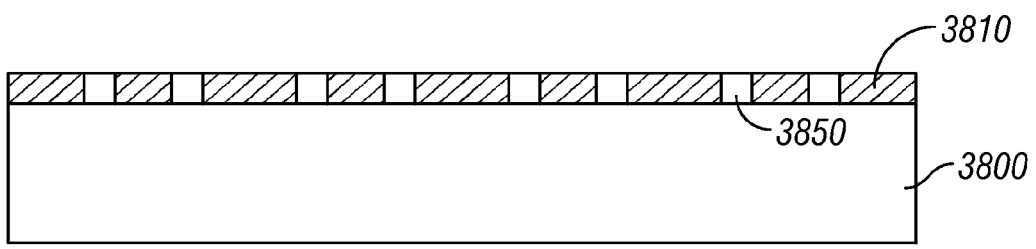

Subsequently, a sacrificial material 3810 is deposited over the backplate 3800. Then, the sacrificial material 3810 is etched back to have a thickness the same as that of the connectors 3850, as shown in FIG. 38B. The sacrificial material 3810 may be planarized using any suitable technique, including but not limited to, chemical mechanical polishing (CMP).

Figure 38C:
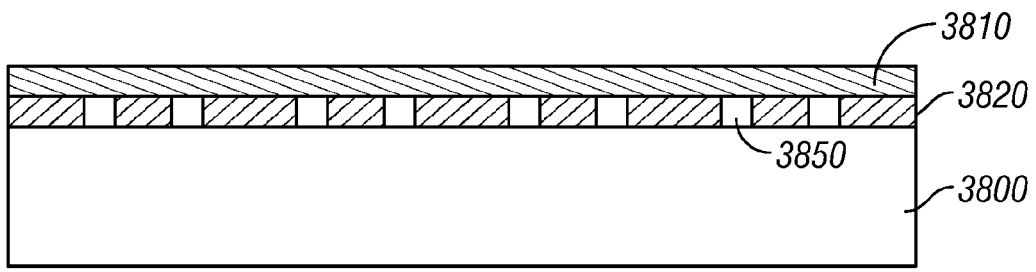
Figure 38D:
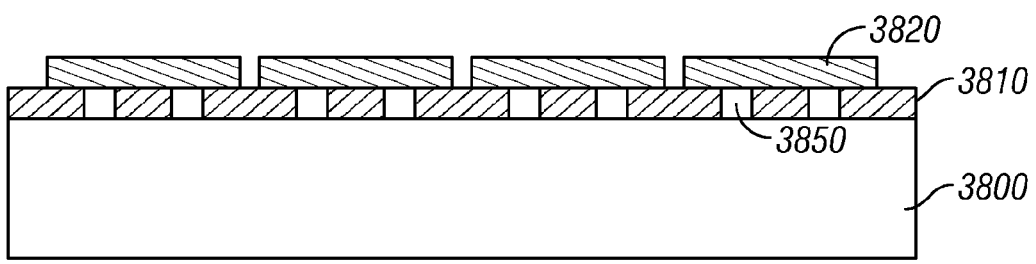

Next, a movable electrode material 3820 is deposited across the backplate 3800, as shown in FIG. 38C. Then, the movable electrode material 3820 is patterned using any suitable technique, for example, photolithography and etching. The resulting movable electrodes 3820 are shown in FIG. 38D. The movable electrodes 3820 are supported on the connectors 3850 and also partially on the sacrificial material 3810.

Next, the carrier backplate 3900 is attached to a front substrate (not shown) so that the movable electrodes 3820 are interposed therebetween. Then, the sacrificial material 3810 is removed. The movable electrodes 3820 are supported by rails and posts of the front substrate.

Referring to FIGS. 19 and 36-38, the movable electrode material may be patterned to have routing traces 1917 connected to the movable electrodes 1960. A skilled artisan will appreciate that the routing traces 1917 may be formed simultaneously with or separately from patterning the movable electrodes 1960. In other embodiments in which a front substrate provides routing traces similar to those shown in FIGS. 17 and 18, the carrier backplate may only carry the movable electrodes without the routing traces.

Figure 39A:
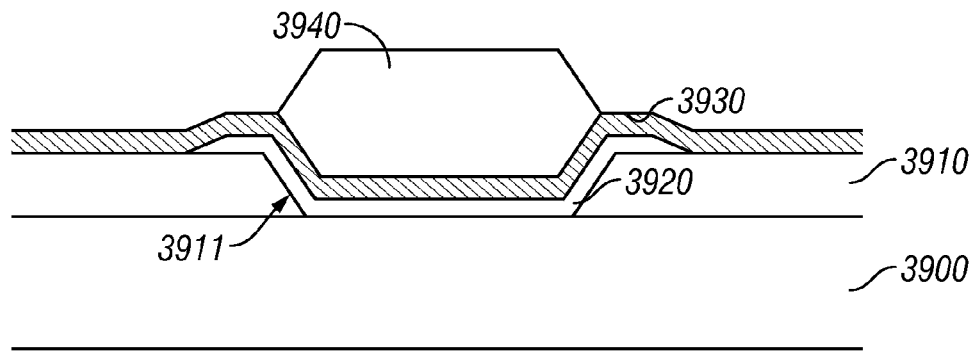
FIG. 39A is a schematic cross section of a carrier for joining with a front substrate, the carrier having a rivet support structure according to one embodiment.

FIG. 39A illustrates a partial cross section of a carrier backplate with patterned movable electrodes and rivets. The term "rivet" refers to a structure configured to support and stiffen the movable electrodes from on top of the electrodes in a depression during the operation of the resulting interferometric modulator display device.

The illustrated portion of the carrier backplate 3900 includes a sacrificial layer 3910, a rivet supporting structure 3920, a movable electrode 3930, and a rivet 3940. The sacrificial layer 3910 is formed on the backplate 3900, and has a recess 3911 for partially accommodating the rivet supporting structure 3920, the movable electrode 3930, and the rivet 3940. The rivet supporting structure 3920 is formed conformally in and around the recess 3911. The rivet supporting structure 3920 may be formed of an inorganic material such as silicon oxide. In certain embodiments, the rivet supporting structure 3920 may be omitted. The movable electrode 3930 is formed conformally in the recess 3911, in the illustrated embodiment on the rivet supporting structure 3920 and on exposed portions of the sacrificial layer 3910. Then, the rivet 3940 is formed on the movable electrode 3930, overfilling the recess 3911. Suitable materials for use in the rivet 3940 include, but are not limited to, aluminum, $AlO_x$, silicon oxide, $SiN_x$, nickel and chromium. Alternate materials which may be used to form the rivet 3940 include other metals, ceramics, and polymers. The thickness of the rivet 3940 will vary according to the mechanical properties of the material used.

Figure 39B:
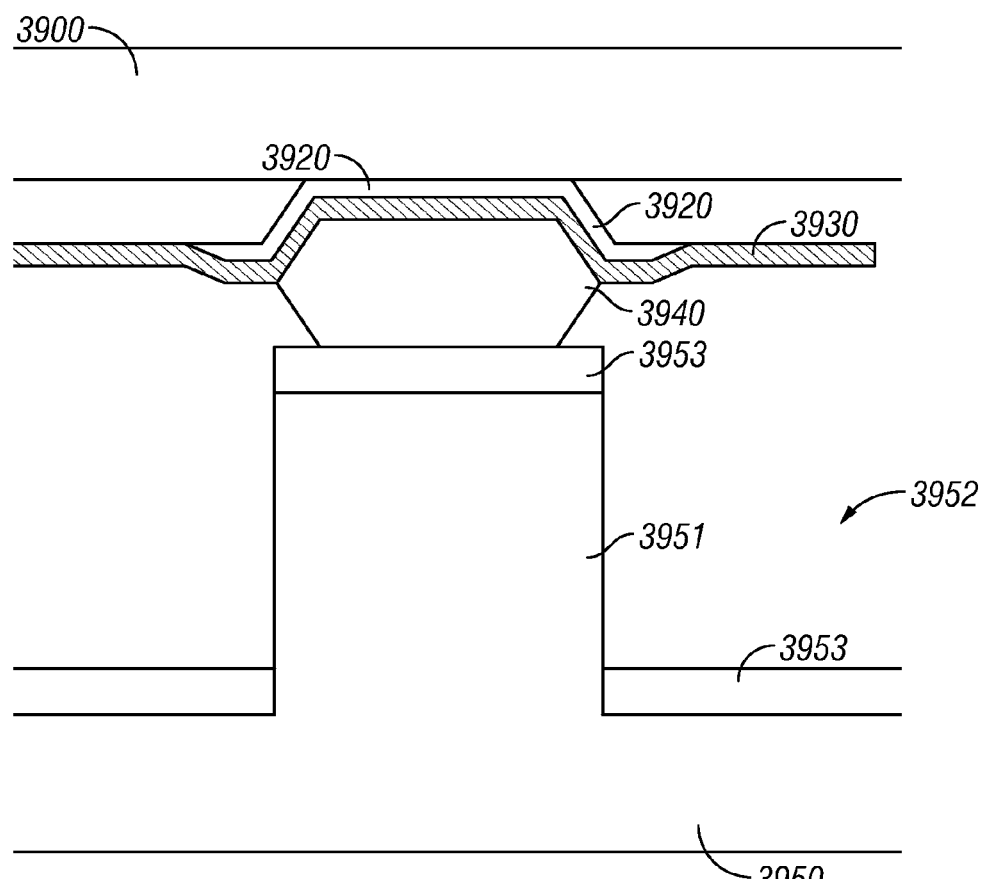
FIG. 39B is a schematic cross section of an interferometric modulator display device having the rivet support structure of FIG. 39A inverted over a front substrate support structure according to one embodiment.

FIG. 39B is a cross section of an interferometric modulator display device having rivets on a carrier backplate according to one embodiment. The illustrated portion of the device includes a front substrate 3950 and a carrier backplate 3900.

The front substrate 3950 includes rails 3951, troughs 3952 defined by the rails 3951, and optical stacks 3953 on the bottom of the troughs 3952 and on top of the rails 3951. The configuration of the backplate 3900 is identical to that of the backplate 3900 of FIG. 39A except that the sacrificial layer 3910 has been removed. The backplate 3900 opposes the front substrate 3950 with the movable electrodes 3930 interposed therebetween. The rivets 3940 are interposed between the movable electrodes 3930 and the optical stack 3953 on the rails 3951. The rivets 3940 serve to support and stiffen the movable electrodes 3930 during operation of the interferometric modulator display device. In another embodiment, the front substrate 3950 may have posts in the troughs 3952, and the backplate 3900 may further include rivets opposing the posts. In yet another embodiment, an interferometric modulator display device may have the rail/rivet structures described above to support movable electrodes while having no post on the front substrate 3950. A skilled artisan will appreciate that various configurations of rivets can be combined with the supports of the front substrate.

b. Removable Carrier with Patterned Movable Electrodes

In some embodiments, a removable carrier with patterned movable electrodes may be used instead of a permanent carrier backplate to provide movable electrodes to a front substrate. The removable carrier may be formed of a polymeric material. The polymeric material may be dissolvable or ashable after transferring the movable electrodes to a front substrate. In other embodiments, the removable carrier may be physically lifted or peeled from the front substrate, while leaving the movable electrodes on the front substrate. In another embodiment, the removable carrier may be a recyclable carrier. The recyclable carrier may be formed of a porous polymeric material. In such an embodiment, before forming movable electrodes on the carrier, a release layer may be formed on the carrier similar to the release layer 3530 of FIG. 35C. Then, a movable electrode material is deposited and patterned on the release layer. The release layer may be a single atomic layer. In one embodiment, the release layer may be formed of molybdenum. The details of patterning the movable electrodes may be as described above with reference to FIGS. 36 and 37. A skilled artisan will appreciate that various configurations of removable carriers can be used to carry patterned electrodes.

Then, the removable carrier is placed on the front substrate such that the patterned movable electrodes are interposed therebetween. Subsequently, the removable carrier is removed, for example, as described above with reference to FIG. 35D. After the removable carrier is removed, a permanent backplate, e.g., a glass plate, is further provided to seal the interferometric modulator display device. In some embodiments, a desiccant is provided between the front substrate and the permanent backplate to prevent moisture damage to the display device.

IV. Lamination

Some of the embodiments described above provide three different types of front substrates having stationary electrodes: a shaped front substrate, a patterned front substrate (characterized by support structures being formed independently from patterning of the stationary electrodes), and a preformed support front substrate. In addition, the other embodiments described above provide four different types of carriers: a shaped carrier backplate, a carrier backplate with patterned movable electrodes, a shaped removable carrier, and a removable carrier with patterned movable electrodes. One of the types of front substrates may be combined with one of the types of the carriers to form a partially fabricated or complete interferometric modulator display device. In another embodiment, movable electrodes may be formed directly on a shaped front substrate, not being transferred from a carrier. Possible combinations of the front substrates and carriers are shown below in Table 1. Various embodiments based on the combinations will also be described below. Each number in Table 1 indicates the heading number of each embodiment described below.

TABLE 1

|  | Shaped Front Substrate | Patterned Front substrate | Preformed Support Front Substrate |
|---|---|---|---|
| Shaped Carrier Backplate | 1 | 2 | 3 |
| Shaped Removable Carrier | 4 | 5 | 6 |
| Carrier Backplate with Patterned Movable Electrodes | 7 | 8 | 9 |
| Removable Carrier with Patterned Movable Electrodes | 10 | 11 | 12 |
| Traditional Deposition of Movable Electrodes and Attachment of Backplate | 13 | N/A | N/A |

1. Shaped Carrier Backplate and Shaped Front Substrate

A. Embodiment A

In one variant of combination 1 in Table 1 above, a shaped carrier backplate and a shaped front substrate may be combined with each other to form an interferometric modulator display device. The configuration of the shaped front substrate may be as described above with reference to one or more of FIGS. 10, 11A-11B, 16A-18C, and 34A-34D. The configuration of the shaped carrier backplate may be as described above with reference to one of FIGS. 27A-27D, 28, and 32A-33D. The combined structure of the front substrate and the backplate may be as described above with reference to one or more of FIGS. 8, 9, 13-15, 17A-18C, 34A-34D. The interferometric modulator display device made by the process described herein may have a relatively small gap (e.g., between about 6,500 Å and about 20 μm, and particularly between about 2 μm and about 15 μm or between about 10,000 Å and about 5 μm) between the front substrate and the backplate thereof.

In the embodiments described in this disclosure, a gap between a front substrate and a backplate generally refers to a gap between the bottom of the deepest trough of the front substrate (e.g., the bottom F1 of the deepest trough 1012c in FIG. 11A) and a backplate surface facing the front substrate when the backplate overlies the front substrate. The backplate surface is one which is most removed from the front substrate (e.g., an elongated recess bottom surface B1 which faces the front substrate in FIG. 26D, and the bottom surface B2 of an etch hole 2705 in FIG. 27C). Thus, for example, in FIGS. 34A and 34C, the gap between the front substrate and the backplate refers to a gap G between the bottom of the deepest trough and the ceiling surface of the elongated recess 3451 of the backplate 3450 when the backplate overlies the front substrate.

The display device includes movable electrodes between the front substrate and the backplate. The movable electrodes may be supported on rails and posts of the front substrate as shown in FIG. 13. In one embodiment, the movable electrodes may also be suspended from the backplate as shown in FIG. 27A-27D, 28, or 33D. In yet another embodiment, excess mechanical layers on the carrier backplate may be supported by excess mechanical layer supports as shown in FIGS. 34A-34D.

Figure 16F:
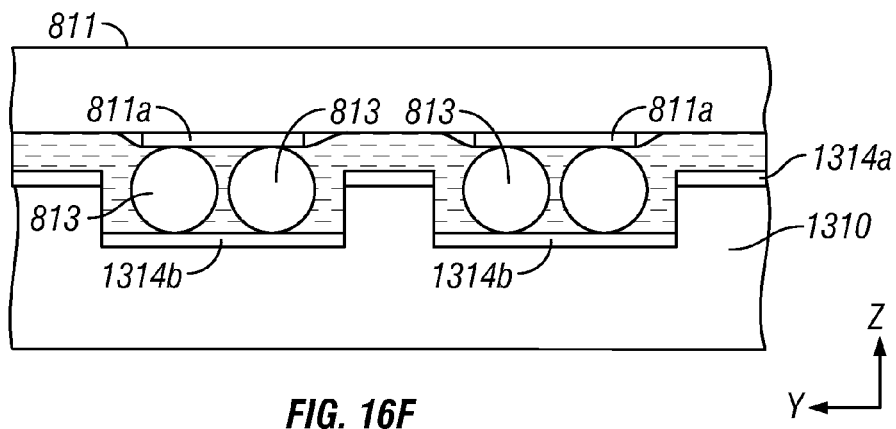
FIG. 16F is a cross section of the row routing structure of FIG. 16E, taken along lines 16F-16F.

In any of embodiments described below, electrical connection between electrodes (column and row electrodes) and routing structures/traces can be established using any suitable bonding technique. Such bonding techniques may involve using, for example, a shadow masks and a bonding agent (FIGS. 17A-17C, 20, and 21), conductive beads and insulating seal, or anisotropic conductive films (ACFs) (FIGS. 16E and 16F). Various routing and packaging structures and methods will be described below.

a. Routing Option 1

In one embodiment, the shaped front substrate may include a column routing structure for routing movable (column) electrodes as described above with reference to FIGS. 17A-17C. The shaped carrier backplate may carry movable electrodes, but no leads or routing traces extending from the movable electrodes. When the front substrate and the backplate are attached to each other, the end portions of the movable electrodes make contact with conductive routing traces on the front substrate. Referring back to FIGS. 17A-17C, gap-fillers 1717 may be interposed between the movable electrodes 1760 and the routing traces 1714a2. The column routing structure includes routing traces on mesas defined by column isolation trenches. The column routing structure also includes stationary electrode layers (including an ITO layer) in the trenches, as shown in FIGS. 17A-17C. Details of the column routing structure may be as described above with reference to FIGS. 17A-17C. The shaped front substrate may also include a row routing structure similar to that of FIGS. 16A-16E. In embodiments discussed below and shown in FIGS. 40-41C, routing structures may be all on a front substrate.

Figure 40:
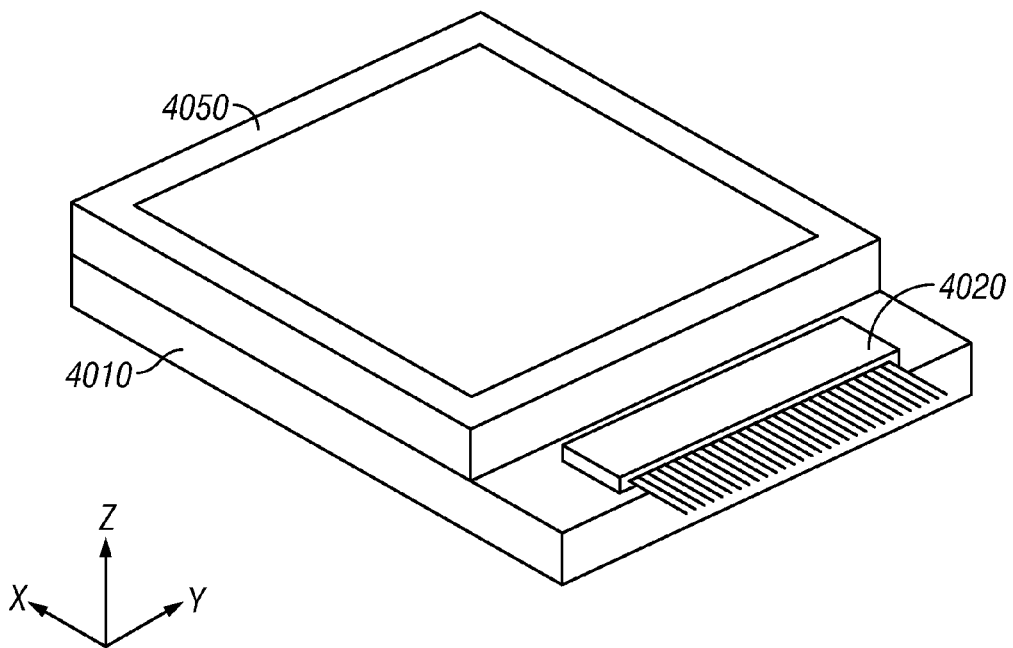
FIG. 40 is a schematic, perspective view of one embodiment of an interferometric modulator display device.

Referring now to FIG. 40, after the front substrate 4010 and the backplate 4050 are attached to each other, a driver 4020 may be mounted on the front substrate 4010. The driver may be a column driver for driving the movable (column) electrodes, a separate row driver for driving fixed (row) electrodes, or a combination of the two.

Figure 41A:
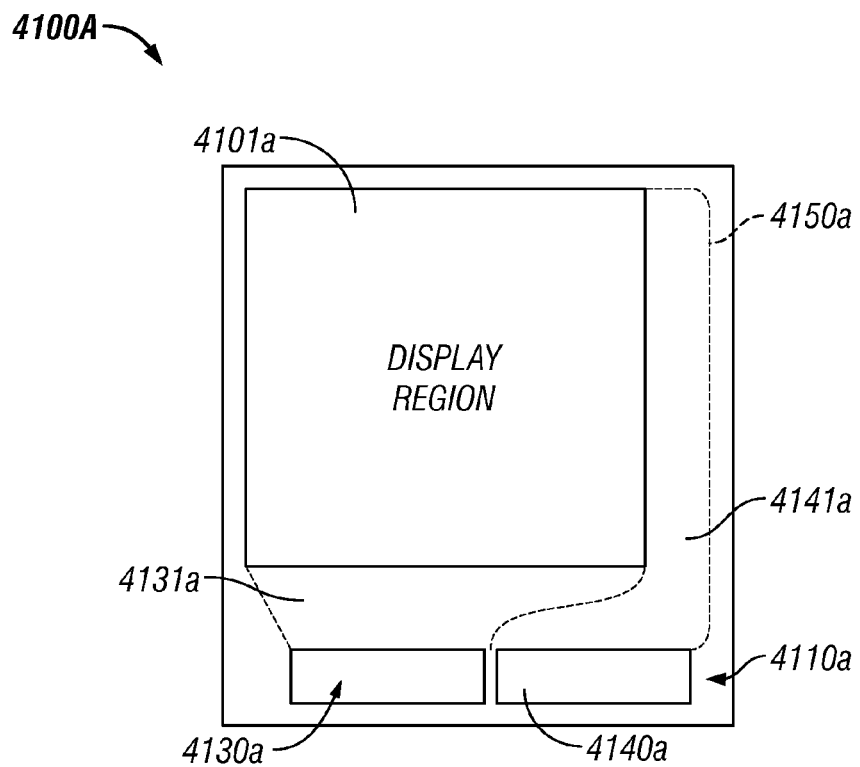
FIGS. 41A-41C schematically illustrate routing arrangements of interferometric modulator display devices according to various embodiments.
Figure 41B:
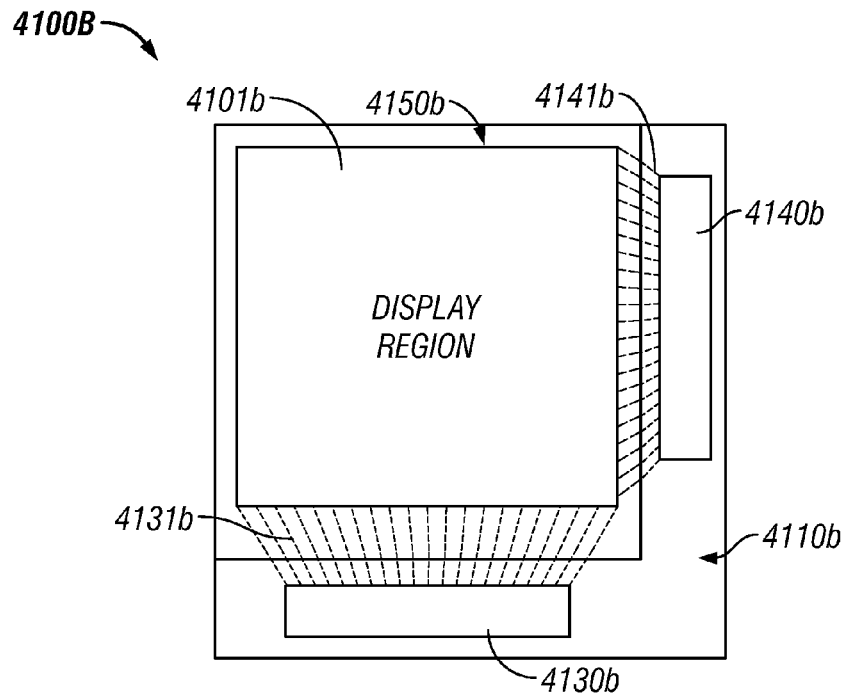
Figure 41C:
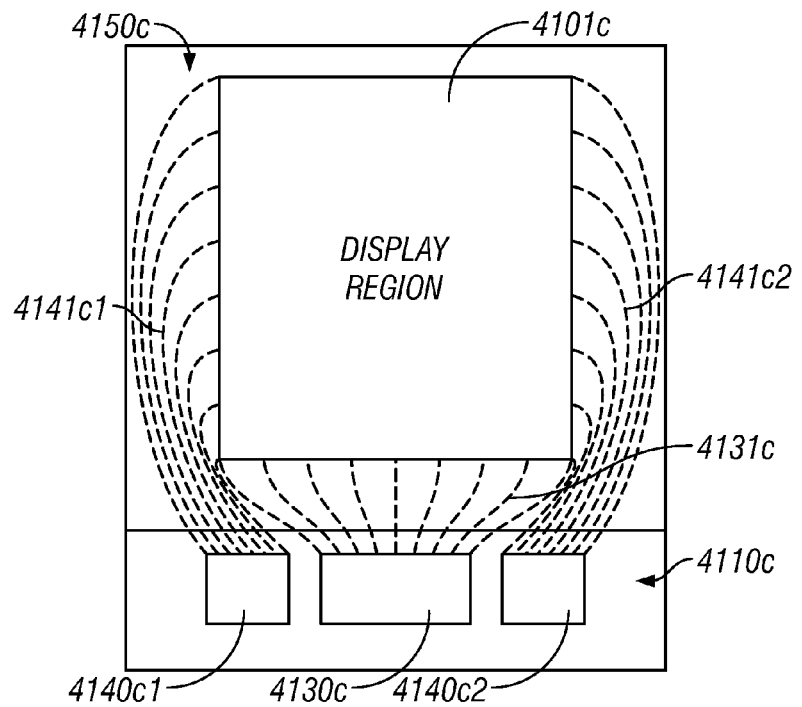

FIGS. 41A-41C illustrate various driver arrangements for an interferometric modulator display device. Referring to FIG. 41A, an interferometric modulator display device 4100A includes a shaped front substrate 4110a and a shaped carrier backplate 4150a mounted thereon. The device 4100A also includes a column driver 4130a and a row driver 4140a together mounted on the front substrate 4110a on the same side of the display region 4101a of the device 4100A. The front substrate 4110a also includes a column routing structure 4131a and a row routing structure 4141a which lead to the column and row drivers 4130a, 4140a, respectively, as shown in FIG. 41A. The configuration of the column routing structure 4131a may be as described above with reference to FIGS. 17A-17C. The configuration of the row routing structure 4141a may be as described above with reference to FIGS. 16A-16E. In the illustrated embodiment, exposed portions of the routing structures 4131a, 4141a may be covered with a capping material.

Referring to FIG. 41B, an interferometric modulator display device 4100B includes a shaped front substrate 4110b and a shaped carrier backplate 4150b. The device 4100B also includes a column driver 4130b and a row driver 4140b on the front substrate 4110b on two different sides of the display region 4101b of the device 4100B. The front substrate 4110b also includes a column routing structure 4131b and a row routing structure 4141b which lead to the column and row drivers 4130b, 4140b, respectively, as shown in FIG. 41B. The configuration of the column routing structure may be as described above with reference to FIGS. 17A-17C. The configuration of the row routing structure may be as described above with reference to FIG. 16. In the illustrated embodiment, exposed portion of the routing structures 4131b, 4141b may be covered with a capping material.

Referring to FIG. 41C, an interferometric modulator display device 4100C includes a shaped front substrate 4110c and a shaped carrier backplate 4150c. The device 4100C also includes a column driver 4130c, a first row driver 4140c1, and a second row driver 4140c2 on the front substrate 4110b on the same side of the display region 4101c of the device 4100C. The front substrate 4110c also includes a column routing structure 4131c, a first row routing structure 4141c1, and a second row routing structure 4141c2 which lead to the column and row drivers 4130c, 4140c1, 4140c2, respectively. In the illustrated embodiment, alternate rows can be routed from alternate sides, which creates more room for row routing traces. The configuration of the column routing structure 4131c may be as described above with reference to FIGS. 17A-17A. The configurations of the row routing structures 4141c1, 4141c2 may be as described above with reference to FIG. 16. In the illustrated embodiment, exposed portion of the routing structures 4131c, 4141c1, 4141c2 may be covered with a capping material.

In other embodiments, column and row drivers can be combined with each other, forming a single integrated column/row driver. In such embodiments, the interferometric display device may have a layout similar to those shown in FIGS. 41A and 41C. It will be appreciated that various other layouts are also possible.

b. Routing Option 2

In another embodiment, the shaped front substrate may include column routing traces for routing movable (column) electrodes as described above with reference to FIGS. 18A-18C. The shaped carrier backplate may carry movable electrodes, but no leads or routing traces extending from the movable electrodes. In addition, a bonding agent can be applied to ends of the movable electrodes so as to facilitate electrical contact and adhesion with the routing traces. When the front substrate and the shaped carrier backplate are attached to each other, the end portions of the movable electrodes make contact with the routing traces. Details of the column routing traces may be as described above with reference to FIGS. 18A-18C. The shaped front substrate may also include a row routing structure similar to that of FIGS. 16A-16E. In addition, the interferometric modulator display device may have various arrangements of drivers as described above with reference to FIGS. 41A-41C.

c. Routing Option 3

Figure 42A:
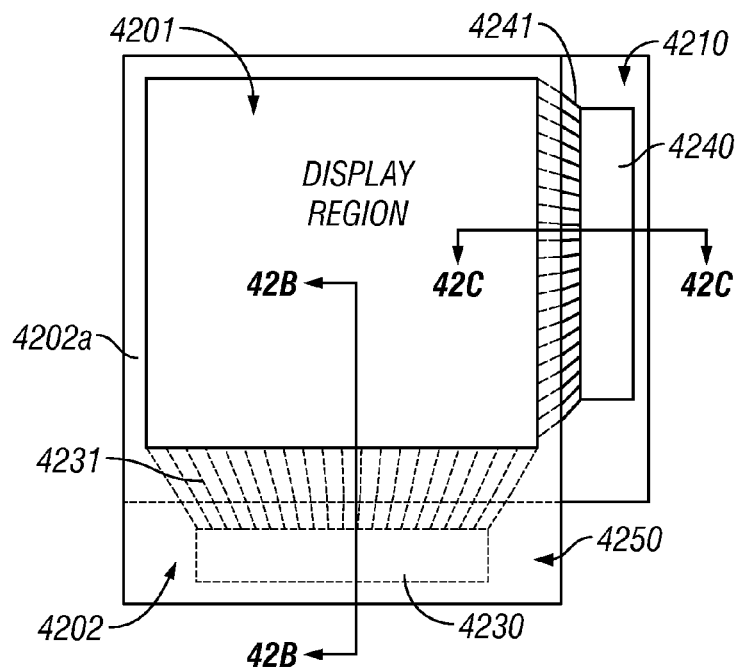
FIG. 42A illustrates a routing arrangement of an interferometric modulator display device according to another embodiment.

In yet another embodiment, a shaped front substrate 4210 includes a row driver 4240 while a shaped carrier backplate 4250 includes a column driver 4230, as shown in FIG. 42A. The shaped front substrate 4210 may have a row routing structure 4241 as described above with reference to FIGS. 16A-16E. The shaped carrier backplate 4250 may have column routing traces 4231 extending from movable electrodes, similar to the routing traces 1917 of FIG. 19. The column routing traces 4231 provide electrical connection between the movable electrodes and the column driver 4230.

Figure 42B:
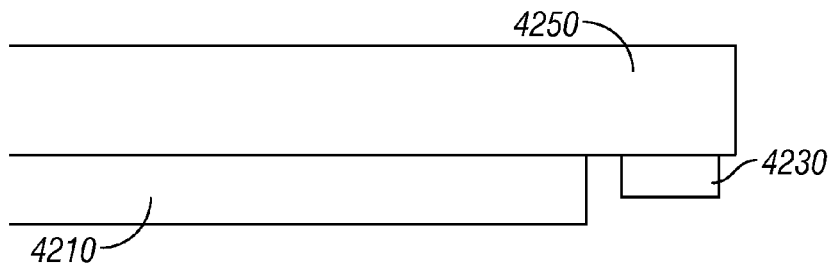
FIGS. 42B and 42C are cross sections of the interferometric modulator display device of FIG. 42A, taken along the lines 42A-42A and 42B-42B, respectively.
Figure 42C:
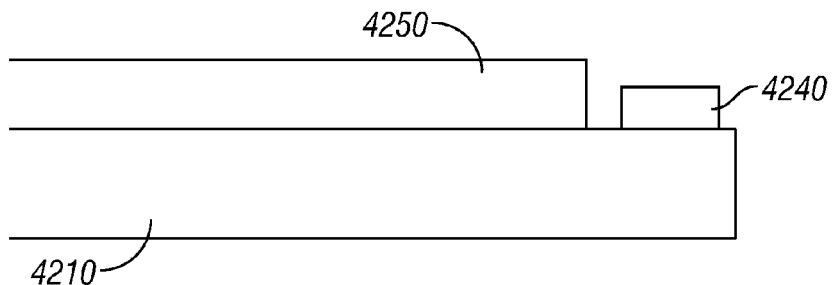

Referring to FIGS. 42A-42C, the front substrate 4210 and the backplate 4250 oppose each other only in the display region 4201 and a portion 4202a of the peripheral region 4202 surrounding the display region 4201. Each of the front substrate 4210 and the backplate 4250 has a driver chip region for the row or column driver 4230, 4240. The driver chip regions are exposed to allow the drivers 4230, 4240 to be attached thereto. In the illustrated embodiment, contact and bonding pads may not be aligned with each other. All of the movable electrodes and column routing traces can be on the backplate 4250 while all of stationary electrodes and row routing traces can be on the front substrate 4210. These routing structures can be formed by extension of trenches (rows) or mesas (columns) to simplify the lamination process. This configuration involves no contact/bonding pad match elevation issues while allowing full advantages of "pattern by elevation." A skilled artisan will appreciate that various other routing arrangements of the front substrate and the backplate are also possible.

d. Routing Option 4

In yet another embodiment, a shaped carrier backplate may carry movable electrodes and routing traces similar to those shown in FIG. 19. The routing traces are configured to extend from the movable electrodes to respective contact pads. A corresponding shaped front substrate includes a contact pad area. The contact pad area of the front substrate includes leads that are configured to make contact with the contact pads of the backplate. The contact pad area of the front substrate may also include leads connected to stationary (row) electrodes in its display region. The contact pads on the front substrate and backplate line up when the front substrate and backplate are attached to each other. The contact pads on the front substrate and backplate may be connected through an anisotropic conductive film (ACF).

e. Packaging and Sealing

Figure 43A:
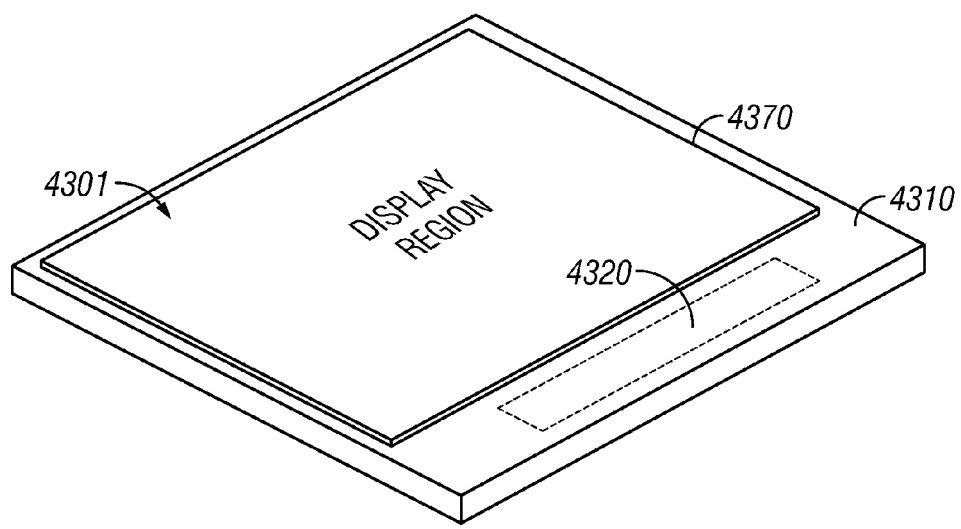
FIG. 43A is a schematic perspective view and FIGS. 43B-43C are schematic cross sections illustrating one embodiment of a method of making an interferometric modulator display device using a carrier that also serves as a backplate for the completed device.
Figure 43B:
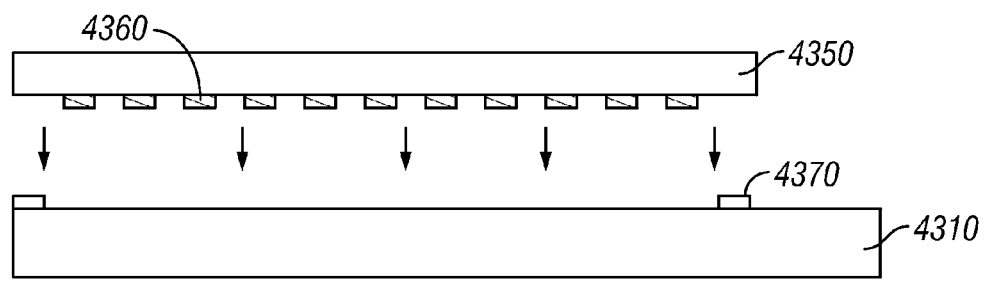
Figure 43C:
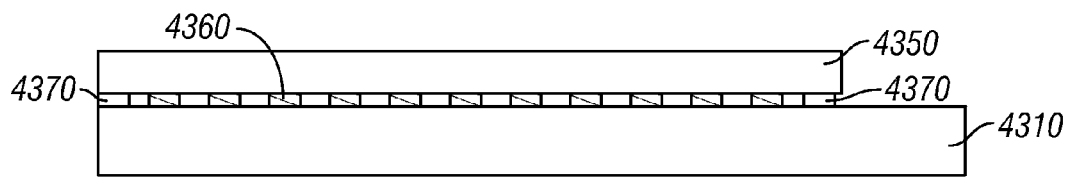

FIGS. 43A-43C illustrate a method of packaging and sealing an interferometric modulator display device according to one embodiment. Referring to FIG. 43A, a shaped front substrate 4310 having cavities and stationary electrodes (not shown) is provided with a sealant 4370. The details of the shaped front substrate 4310 are as described above with reference to one or more of FIGS. 10, 11A-11B, 16A-18C, and 34A-34D. The sealant 4370 is applied along the edges of the display region 4301 of the front substrate 4310. In certain embodiments, sealing beads can be placed on the edges of the backplate. The sealant 4370 is formed between the display region 4301 and the contact pad (or driver chip) region 4320 of the front substrate 4310. The sealant 3470 may be a hermetic sealant. In one embodiment, the sealant may be an electrically conductive material such as lead-based solder or non-lead-based solder. In such an embodiment, routing leads or traces contacting the conductive sealant need to be insulated. In another embodiment, the sealant may be an insulating material such as glass frit or epoxy polymer.

Then, a shaped carrier backplate 4350 with movable electrodes 4360 formed thereon is placed on the front substrate 4310 to cover the display region 4301 of the front substrate 4310, as shown in FIG. 43B. The resulting interferometric modulator display device is shown in FIG. 43C.

Referring back to FIGS. 17A-17C and 20, shadow masks may be used when depositing a dielectric material on a shaped front substrate. A shadow mask may be used to establish electrical connection between various elements of an interferometric modulator display device. For example, a shadow mask can be used to expose portions of the column routing traces on the front substrate for electrical connection between the routing traces and movable (column) electrodes (on a backplate or removable carrier) and between the routing traces and a column driver (see FIGS. 17A-17C, and 20). A shadow mask can also be used to expose portions of movable electrode landing pads on a front substrate for electrical connection between movable electrode routing traces on a backplate (see FIG. 19) and a column driver mounted on the front substrate. A shadow mask can be used to expose portions of the row routing traces/landing pads on the front substrate for electrical connection between the routing traces and a row driver mounted on the front substrate.

Figure 44A:
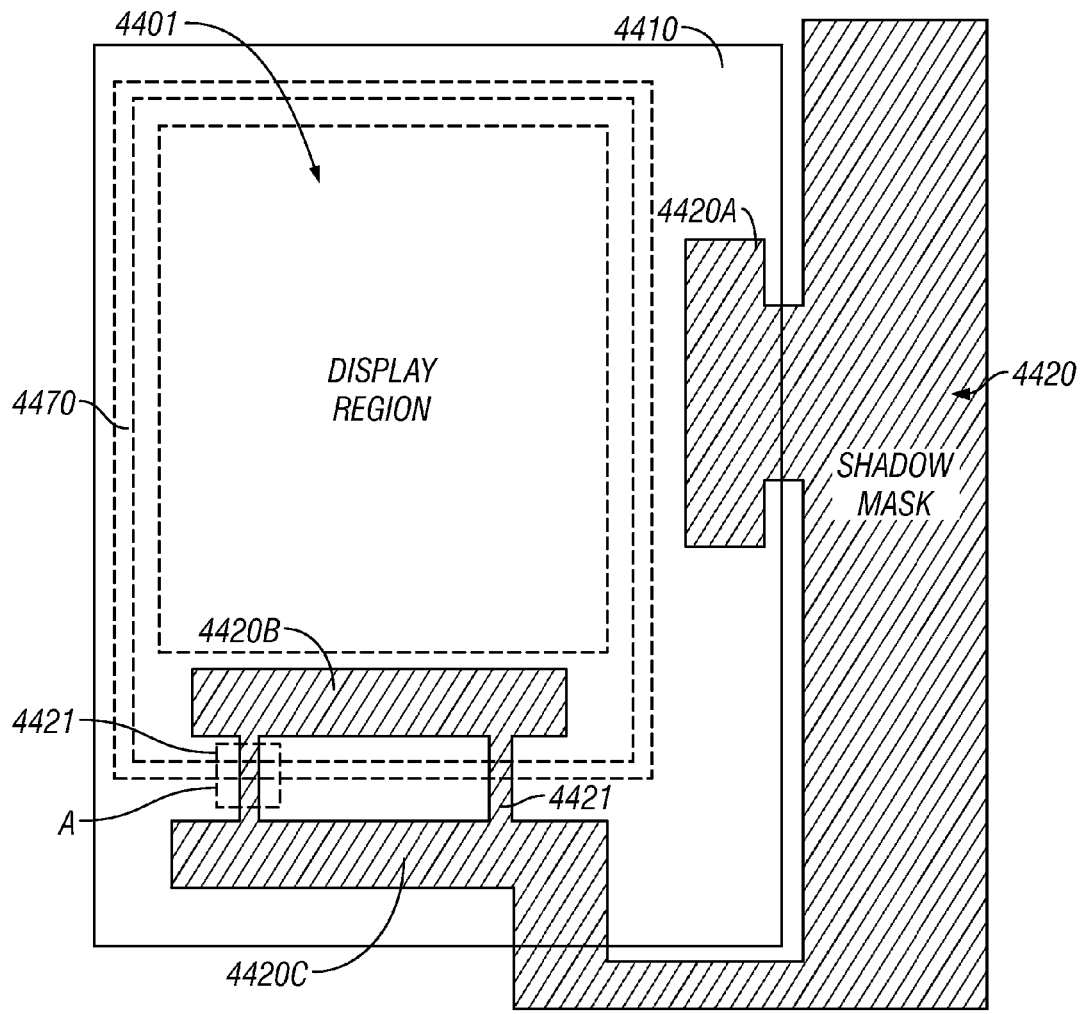
FIG. 44A is a schematic plan view.

The shadow mask blocking sections of interest are connected to one another as shown in FIG. 44A. The shadow masks 4420 include first, second, and third blocking portions 4420a, 4420b, 4420c to cover a row driver chip region, portions of the column routing traces, and a column driver chip region, respectively. The second blocking portion 4420b for blocking portions of the routing traces may be connected to the third blocking portion 4420c for blocking the column driver chip region via shadow mask connectors 4421. With the blocking portions 4420a, 4420b, 4420c between the front substrate 4410 and a sputtering target, a dielectric material is deposited across the front substrate 4410. In other embodiments, CVD or evaporating methods can also be used for forming the dielectric material on the front substrate 4410. As a result, portions covered by the shadow mask 4420 are substantially free of the dielectric material, exposing an underlying conductive layer. This configuration provides bonding regions for electrical connection, e.g., contacts between movable electrodes and column routing traces (4420b), and landing pads for a column driver (4420c) and a row driver (4420a). The dielectric material is deposited on other portions not covered by the shadow mask 4420, forming part of an optical stack. The dielectric layer serves to passify conductors in routing regions. Similarly, portions of the conductive layer under the connectors 4421 are also exposed because the connectors 4421 mask the portions during the dielectric material deposition.

After depositing the dielectric material, a sealant may be applied to the edges of the display region 4401. In the illustrated embodiment, the sealant is formed along a sealing region 4470 surrounding the display region 4401. The sealing region 4470 has an annular shape, and has a first width W1 extending in a direction toward the array region 4401. The sealant may contact the portions of conductive layers undesirably exposed through the dielectric layer because of the connectors 4421. In an embodiment in which the sealant is formed of a conductive material, there may be an electrical connection between the conductive layer and the sealant, which may cause an electrical current to flow through the sealant, and shorting the exposed conductors. This may cause malfunction of the interferometric modulator display device.

In order to prevent such an electrical short, the shaped front substrate 4410 may be provided with at least one isolation trench or recess 4430 at an intersection between the shadow mask connector 4421 and the sealing region 4470. The trench 4430 has a second width W2 extending in the direction toward the array region 4401. The second width W2 of the trench 4430 may be greater than the first width W1 of the sealing region 4470 such that trench 4430 extends across a portion of the sealing region 4470. The trench 4430 has a depth sufficient to make the conductive layer discontinuous between the bottom of the trench 4430 and the surface of the front substrate 4410, and its position and width ensures the connector 4421 is narrower than the trench 4430 in the region of overlap, as shown in FIG. 44C.

Figure 44B:
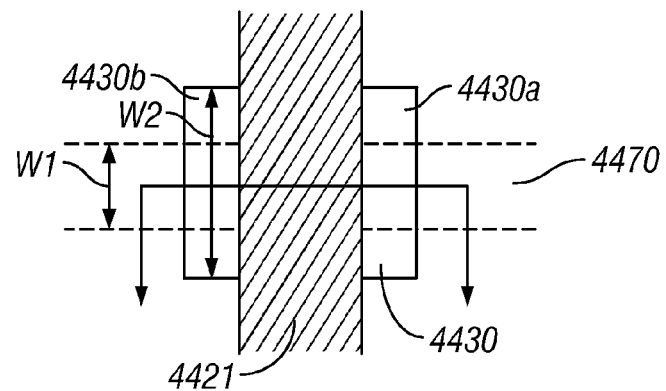
FIG. 44B is an enlarged view.
Figure 44C:
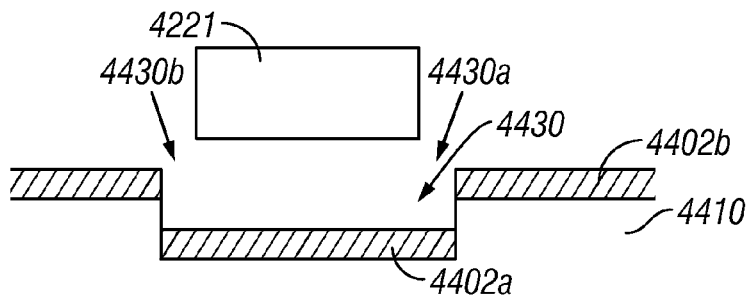
FIGS. 44C-44E are schematic cross sections illustrating one embodiment of a method of using a shadow mask with conductive sealant on a front substrate.
Figure 44D:
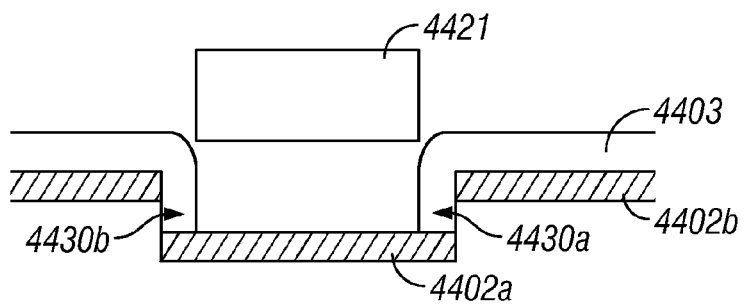
Figure 44E:
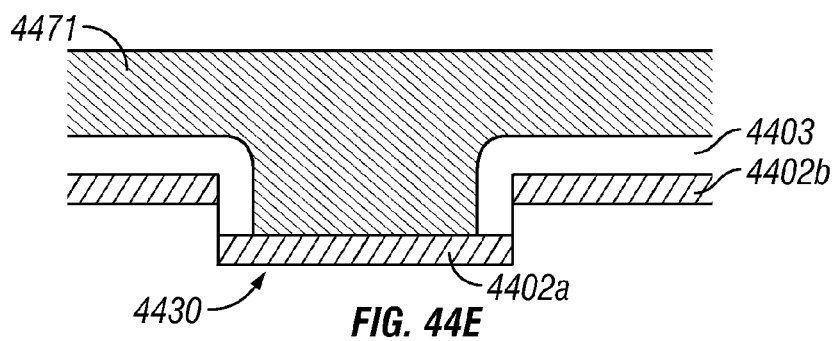

FIGS. 44B-44E illustrate a method of forming a sealant on the front substrate 4410 having the isolation trench 4430 according to one embodiment. First, a conductive layer 4402a, 4402b is formed on the front substrate 4410 and the bottom of the isolation trench 4430, as shown in FIG. 44C. Then, the shadow masks 4420 are placed over the front substrate 4410 such that the connector 4421 covers a portion of the isolation trench 4430 while exposing two side edges 4430a, 4430b of the trench 4430 as shown in FIGS. 44B and 44C. Subsequently, a dielectric material 4403 is deposited on the front substrate 4410 while coating the side edges 4430*a*, 4430*b* of the trench 4430, as shown in FIG. 44D. Subsequently, the shadow masks 4420 are removed from the front substrate 4410. Next, a sealant 4471 is formed on the sealing region 4470 (FIG. 44A) and into the trench 4430, as shown in FIG. 44E. The sealant 4471 contacts the isolated conductive material 4402*a* on the bottom of the trench 4430. However, the dielectric material 4403 on the side edges 4430*a*, 4430*b* of the trench 4430 prevents the sealant 4471 from being electrically connected to the conductive layer 4402*b* on the top surface of the front substrate 4410. This configuration thus prevents an electrical short between the sealant 4471 and the conductive layer 4402*b*.

In another embodiment in which an insulating sealant is used, the front substrate does not have an isolation trench. In certain embodiments in which the shaped back substrate has routing traces exposed to the outside as in the routing option 3 described above with respect to FIGS. 42A-42C, an insulating material may be deposited and patterned on the routing traces to prevent an electrical short between the routing traces and a conductive sealant because only contact pads needed are for the drivers outside the seal.

B. Embodiment B

In another variant on combination 1 of Table 1 above, a shaped front substrate may be combined with a shaped carrier backplate having no edge rails and posts to form an interferometric modulator display device. The configuration of the shaped front substrate may be as described above with reference to one or more of FIGS. 10, 11A-11B, 16A-18C, and 34A-34D. The configuration of the shaped carrier backplate may be as described above with respect to the shaped carrier of FIG. 32B or 32C. The combined structure of the front substrate and the backplate may be as described above with reference to one or more of FIGS. 8, 9, 13-15, 17A-18C, 34A-34D. The routing and packaging structures described above may also apply to this embodiment.

In the embodiments described above in which a shaped front substrate and a shaped carrier backplate are used to form an interferometric modulator display device, a partial wetting black mask which is described below with respect to FIGS. 53A-53D may be used. In some embodiments, a patterned black mask which is also described below may be used.

2. Shaped Carrier Backplate and Patterned Front Substrate

In another embodiment, combination 2 of Table 1 above, a shaped carrier backplate and a patterned front substrate may be combined with each other to form an interferometric modulator display device. The configuration of the patterned front substrate may be as described above with reference to FIG. 22C. The configuration of the shaped carrier backplate may be as described above with reference to one of FIGS. 27A-27C, 28, and 32A-33D. The interferometric modulator display device made by the process described herein may have a relatively small gap (e.g., between about 6,500 Å and about 20 µm, and particularly between about 2 µm and about 15 µm or between about 10,000 Å and about 5 µm) between the front substrate and the backplate thereof.

In one embodiment, the patterned front substrate may have conductive posts for routing movable electrodes, as shown in FIG. 22C. In other embodiments, the shaped carrier backplate may have a routing structure as shown in FIG. 24A or 24B. In the embodiments described above, a patterned black mask may be used to avoid unwanted reflections in the post area.

3. Shaped Carrier Backplate and Preformed Support Front Substrate

In yet another embodiment, combination 3 of Table 1 above, a shaped carrier backplate and a preformed support front substrate may be combined with each other to form an interferometric modulator display device. The configuration of the preformed support front substrate may be as described above with reference to FIG. 23C, and is structurally similar to a shaped front substrate, except that the support structures (e.g., posts and rails) are not integral with the substrate and can be formed of a different material to allow separate selection of materials for different functions. The configuration of the shaped carrier backplate may be as described above with reference to one of FIGS. 27, 28, and 32. The interferometric modulator display device made by the process described herein may have a relatively small gap (e.g., between about 6,500 Å and about 20 µm, and particularly between about 2 µm and about 15 µm or between about 10,000 Å and about 5 µm) between the front substrate and the backplate thereof.

In one embodiment, the preformed support front substrate may have conductive posts for routing movable electrodes, as shown in FIG. 23C. In other embodiments, the shaped carrier backplate may have a routing structure as shown in FIG. 24A or 24B. In the embodiments described above, a patterned black mask or partial wetting black mask (see FIGS. 53A-53D and attendant description) may be used to avoid unwanted reflections in the post area.

4. Shaped Removable Carrier and Shaped Front Substrate

In yet another embodiment, combination 4 of Table 1 above, a shaped removable carrier is used to provide movable electrodes onto a shaped front substrate to form an interferometric modulator display device. The configuration of the shaped front substrate may be as described above with reference to one or more of FIGS. 10, 11A-11B, 16A-18C, and 34A-34D. The configuration of the shaped removable carrier 4550 may be as described above with reference to FIGS. 35A-35D.

Figure 45A:
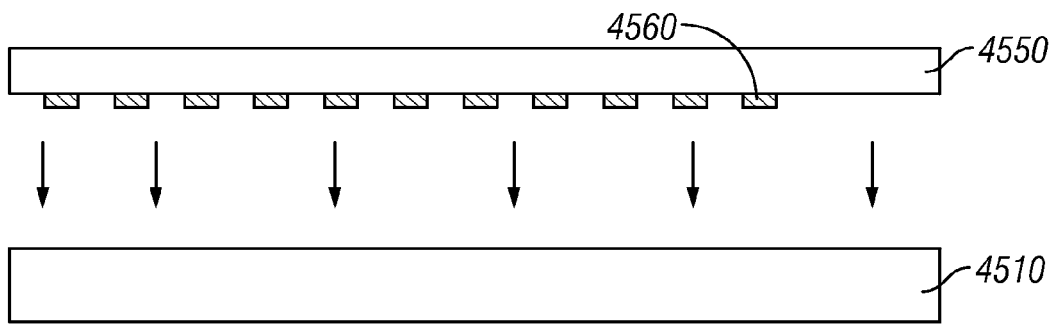
FIGS. 45A-45D are schematic cross sections illustrating one embodiment of a method of making an interferometric modulator display device using a removable carrier.
Figure 45B:
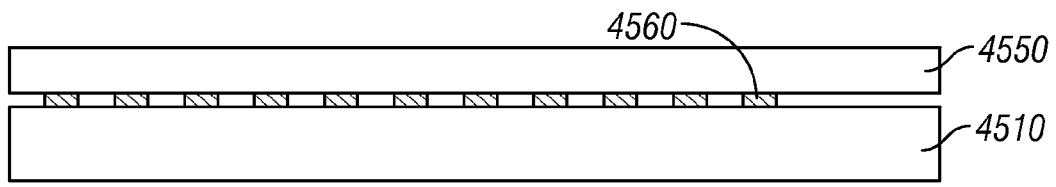
Figure 45C:
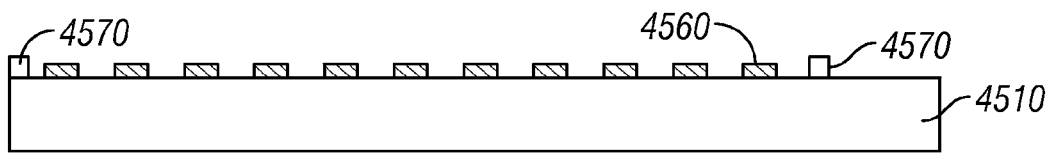
Figure 45D:
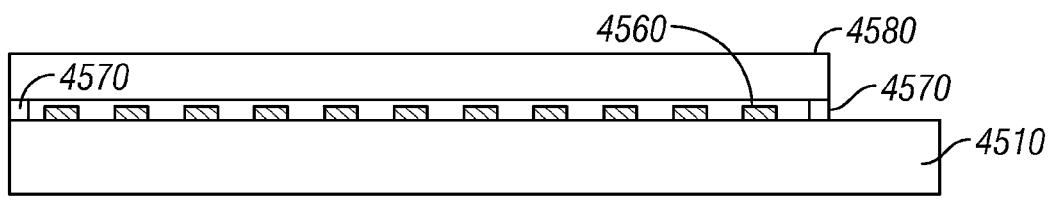

Referring to FIG. 45A, a shaped removable carrier 4550 with movable electrodes 4560 is placed over the shaped front substrate 4510 (details omitted for simplicity). The movable electrodes 4560 are interposed between the front substrate 4510 and the carrier 4550, as shown in FIG. 45B. Then, the movable electrodes 4560 are released from the carrier 4550, such as by etching a release layer (not shown) on the carrier as described with respect to FIGS. 35A-35D. Simultaneously with releasing the movable electrodes 4560 or subsequently thereafter, the carrier 4550 is removed from the front substrate 4510, as shown in FIG. 45C. When the carrier 4550 is removed, excess mechanical layers in elongated recesses of the carrier 4550 may also be removed along with the carrier 4550. In certain embodiments, the excess mechanical layers may remain on the front substrate 4510. In such embodiments, the front substrate 4510 may have excess mechanical layer supports as described with respect to FIGS. 34A-34D to support the excess mechanical layers. Next, a sealant 4570 is provided on the front substrate 4510. Finally, a permanent backplate 4580 is provided over the front substrate 4510 to cover the movable electrodes 4560 and remain in the final device. In one embodiment, the backplate 4580 may have a recess to accommodate the movable electrodes 4560 and optionally a drying agent or desiccant. The sealant 4570 may be formed of an insulating material, e.g., epoxy polymer. In another embodiment, the sealant 4570 may be formed of a conductive material. The sealant 4570 may be configured to provide hermetic sealing to the interferometric modulator display device.

In some embodiments, the shaped front substrate has a routing structure as described above with respect to the routing option 1 or 2 in which the carrier provides no routing traces extending from the movable electrodes. In other embodiments, the carrier may provide fully defined column routing traces similar to those shown in FIG. 19. In such embodiments, the front substrate has no routing structure, and the routing traces are transferred onto the front substrate simultaneously with the movable electrodes. In the embodiments described above, a partial wetting black mask or patterned black mask (FIGS. 53A-53D) may be used.

5. Shaped Removable Carrier and Patterned Front Substrate

In yet another embodiment, combination 5 of Table 1 above, a shaped removable carrier is used to provide movable electrodes onto a patterned front substrate to form an interferometric modulator display device. The configuration of the patterned front substrate may be as described above with reference to FIG. 22C. The configuration of the shaped removable carrier may be as described above with reference to FIGS. 35A-35C. The interferometric modulator display device in this embodiment may be made in a manner similar to that of the method described above with respect to the shaped removable carrier and the shaped front substrate. In this embodiment, a black mask may be used to avoid unwanted reflection in the vicinity of the support structures.

6. Shaped Removable Carrier and Preformed Support Front Substrate

In yet another embodiment, combination 6 of Table 1 above, a shaped removable carrier is used to provide movable electrodes onto a preformed support front substrate to form an interferometric modulator display device. The configuration of the preformed support front substrate may be as described above with reference to FIG. 23C and is structurally similar to a shaped front substrate, except that the support structures (e.g., posts and rails) are not integral with the substrate and can be formed of a different material to allow separate selection of materials for different functions. The configuration of the shaped removable carrier 4550 may be as described above with reference to FIGS. 35A-35C. The interferometric modulator display device in this embodiment may be made in a manner similar to that of the method described above with respect to the shaped removable carrier and the shaped front substrate. In this embodiment, a patterned or partial wetting black mask (see FIG. 53A-53D and attendant description) may be used.

7. Carrier Backplate with Patterned Movable Electrodes and Shaped Front Substrate In another embodiment, combination 7 of Table 1 above, a carrier backplate with patterned movable electrodes may be combined with a shaped front substrate to form an interferometric modulator display device. The configuration of the shaped front substrate may be as described above with reference to one or more of FIGS. 10, 11A-11B, and 16A-18C. The configuration of the carrier backplate may be as described above with reference to one of FIG. 36E, 37E, 38D or 39A-39B. The combined structure of the front substrate and the backplate may be as described above with reference to one or more of FIGS. 8, 9, 13-15, 17A-18C, and 34A-34D. The interferometric modulator display device made by the process described herein may have a relatively small gap (e.g., between about 6,500 Å and about 20 µm, and particularly between about 2 µm and about 15 µm or between about 10,000 Å and about 5 µm) between the front substrate and the backplate thereof.

The movable electrodes may be supported on rails and posts of the front substrate as shown in FIG. 13. In another embodiment, the movable electrodes may be suspended from the backplate using posts or rivets, as shown in FIG. 38D or 39B. The movable electrodes may be pinned by posts or rails from both the front substrate and the backplate. Certain examples of pinning by posts or rails will be described below with reference to FIGS. 46A-48. The routing options 1 and 2 described above may apply to this embodiment. In addition, the packaging and sealing structures described above may apply to this embodiment. In the embodiments described above, a partial wetting black mask (see FIG. 53A-53D and attendant description) or patterned black mask may be used.

8. Carrier Backplate with Patterned Movable Electrodes and Patterned Front Substrate In another embodiment, combination 8 of Table 1 above, a carrier backplate with patterned movable electrodes may be combined with a patterned front substrate to form an interferometric modulator display device. The configuration of the carrier backplate may be as described above with reference to one of FIG. 36E, 37E, 38D or 39A-39B. The configuration of the patterned front substrate may be as described above with reference to FIG. 22C. The interferometric modulator display device in this embodiment may be made in a manner similar to that of the method described above with respect to the carrier backplate with patterned movable electrodes and the shaped front substrate. The interferometric modulator display device made by the process described herein may have a relatively small gap (e.g., between about 6,500 Å and about 20 µm, and particularly between about 2 µm and about 15 µm or between about 10,000 Å and about 5 µm) between the front substrate and the backplate thereof. In this embodiment, a patterned black mask may be used to avoid unwanted reflection in the vicinity of the support structures on the front substrate.

9. Carrier Backplate with Patterned Movable Electrodes and Preformed Support Front Substrate In another embodiment, combination 9 of Table 1 above, a carrier backplate with patterned movable electrodes may be combined with a preformed support front substrate to form an interferometric modulator display device. The configuration of the carrier backplate may be as described above with reference to one of FIG. 36E, 37E, 38D or 39A-39B. The configuration of the preformed support front substrate may be as described above with reference to FIG. 23C and is structurally similar to a shaped front substrate, except that the support structures (e.g., posts and rails) are not integral with the substrate and can be formed of a different material to allow separate selection of materials for different functions. The interferometric modulator display device in this embodiment may be made in a manner similar to that of the method described above with respect to the carrier backplate with patterned movable electrodes and the shaped front substrate. The interferometric modulator display device made by the process described herein may have a relatively small gap (e.g., between about 6,500 Å and about 20 µm, and particularly between about 2 µm and about 15 µm or between about 10,000 Å and about 5 µm) between the front substrate and the backplate thereof. In this embodiment, a patterned or partial wetting black mask (see FIGS. 53A-53D and attendant description) may be used.

10. Removable Carrier with Patterned Movable Electrodes and Shaped Front Substrate In yet another embodiment, combination 10 of Table 1 above, a removable carrier with patterned movable electrodes is used to provide movable electrodes onto a shaped front substrate to form an interferometric modulator display device. The configuration of the removable carrier may be as described immediately above the discussion of lamination.

The configuration of the shaped front substrate may be as described above with reference to one or more of FIGS. 10, 11A-11B, 16A-18C, and 34A-34D. The interferometric modulator display device in this embodiment may be made in a manner similar to that of the method described above with respect to the shaped removable carrier and the shaped front substrate. In this embodiment, a partial wetting black mask (see FIGS. 53A-53D and attendant description) or patterned black mask may be used.

11. Removable Carrier with Patterned Movable Electrodes and Patterned Front Substrate In another embodiment, combination 11 of Table 1 above, a removable carrier with patterned movable electrodes is used to provide movable electrodes onto a patterned front substrate to form an interferometric modulator display device. The configuration of the removable carrier may be as described immediately above the discussion of lamination. The configuration of the patterned front substrate may be as described above with reference to FIG. 22C. The interferometric modulator display device in this embodiment may be made in a manner similar to that of the method described above with respect to the shaped removable carrier and the shaped front substrate. In this embodiment, a patterned black mask may be used.

12. Removable Carrier with Patterned Movable Electrodes and Preformed Support Front Substrate In another embodiment, combination 12 of Table 1 above, a removable carrier with patterned movable electrodes is used to provide movable electrodes onto a preformed support front substrate to form an interferometric modulator display device. The configuration of the removable carrier may be as described immediately above the discussion of lamination. The configuration of the preformed support front substrate may be as described above with reference to FIG. 23C and is structurally similar to a shaped front substrate, except that the support structures (e.g., posts and rails) are not integral with the substrate and can be formed of a different material to allow separate selection of materials for different functions.

The interferometric modulator display device in this embodiment may be made in a manner similar to that of the method described above with respect to the shaped removable carrier and the shaped front substrate. In one embodiment, the removable carrier is attached to the front substrate. Then, the patterned movable electrodes are released from the removable carrier by removing a release layer or a sacrificial layer interposed between the movable electrodes and the carrier. Subsequently, the carrier is removed using any suitable method, e.g., lifting, peeling, ashing, etc., while leaving the movable electrodes on the front substrate. Then, a permanent backplate is provided to cover the array region of the front substrate. The movable electrodes can be supported by various support structures on the front substrate and/or the permanent backplate (see FIGS. 46A-51). In this embodiment, a patterned or partial wetting black mask (see FIGS. 53A-53D and attendant description) may be used.

13. Shaped Front Substrate and Traditional Deposition of Movable Electrodes

In yet another embodiment, combination 13 of Table 1 above, a shaped front substrate having rails and troughs in its display region is provided. Then, a sacrificial material is provided to overfill the troughs of the front substrate. The sacrificial material is then planarized to provide a substantially flat surface together with the exposed rails of the front substrate. Subsequently, a movable electrode material is deposited and patterned on the front substrate to define movable electrodes, using any suitable process, e.g., photolithography and etching. Then, a permanent backplate is placed over the front substrate as described above with respect to the shaped removable carrier and the shaped front substrate. The movable electrodes can be supported by various support structures on the front substrate and/or the permanent backplate (see FIGS. 46A-51). In this embodiment, a partial wetting black mask (see FIGS. 53A-53D and attendant description) or patterned black mask may be used.

V. Spacers for Maintaining Space Between Front Substrate and Backplate

In one embodiment, an interferometric modulator display device is provided with spacers to maintain a space between the front substrate and the backplate thereof. Particularly, the spacers are positioned in the display region of the interferometric modulator display device to maintain a substantially uniform space in the display region. The spacers serve to reduce pressure-related variability across the array of the display device, which can strongly affect the position of the movable electrodes across the array differently. Greater uniformity allows for larger display sizes without loss of yield. In embodiments described below, the front substrate may be a shaped, patterned, or preformed support front substrate. The backplate may be a shaped carrier backplate, a carrier backplate with patterned movable electrodes, or a permanent backplate provided after using a removable carrier. Moreover, the techniques and structures provided herein allow provision of a gap substantially smaller than traditionally assembled front substrates and backplates.

Figure 46A:
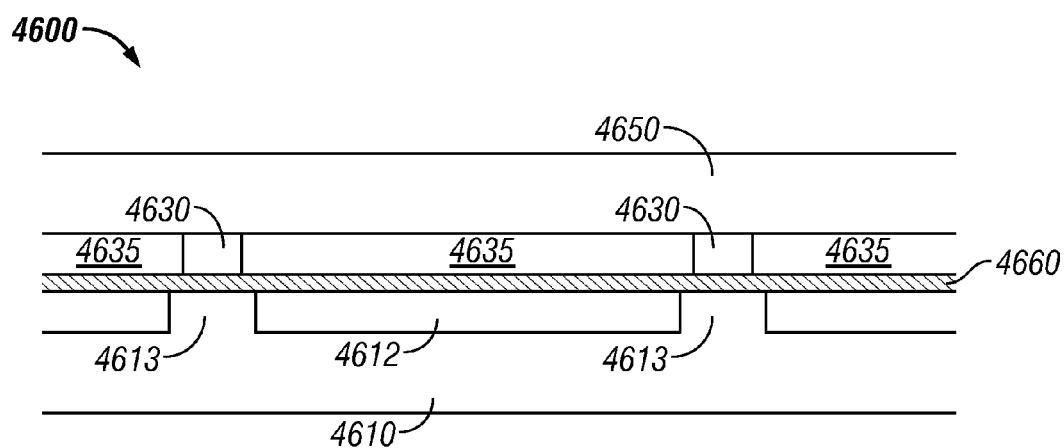
FIG. 46A is a cross section of one embodiment of an interferometric modulator display device having spacers extending between a movable electrode layer and a backplate.
Figure 46B:
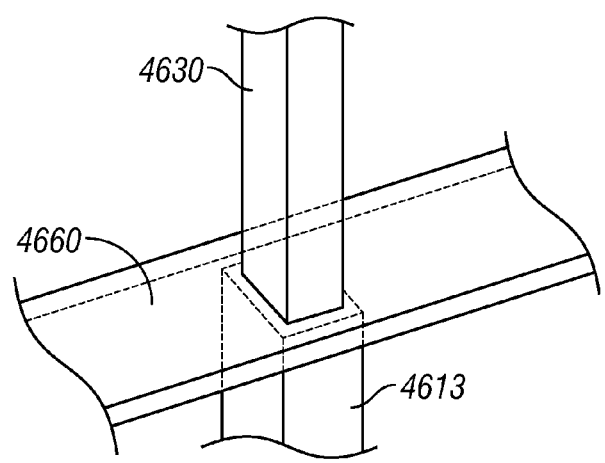
FIG. 46B is a perspective view of the interferometric modulator display device of FIG. 46A having spacers and supports trapping a movable electrode layer.

Referring to FIGS. 46A and 46B, an interferometric modulator display device 4600 includes a front substrate 4610 and a backplate 4650. The front substrate 4610 includes rails (not shown) defining troughs 4612. The front substrate 4610 also includes support structures in the form of posts 4613 in the troughs 4612. The device 4600 also includes movable electrodes 4660 between the front substrate 4610 and the backplate 4650.

The interferometric modulator display device 4600 further includes spacers 4630 to maintain a space 4635 between the front substrate 4610 and the backplate 4650. In the illustrated embodiment, the spacers 4630 are interposed between the movable electrodes 4660 and the backplate 4650. In one embodiment, the spacers 4630 may have a height of about 0.1 μm to about 20 μm.

Referring to FIG. 46B, one of the spacers 4630 extends from the backplate 4650 and pins a movable electrode 4660 supported on a corresponding one of the posts 4613. The spacer 4630 and the post 4613 together fix the movable electrode 4660. The spacers 4630 across the device 4600 also maintain a consistent space 4635 between the front substrate 4610 and the backplate 4650. In one embodiment, the spacers 4630 may be formed on the backplate 4650 using any suitable process (e.g., photolithography and etching) before attaching the backplate 4650 to the front substrate 4610. The spacers can be deposited and patterned onto the backplate 4650 or can be integrally formed with a shaped carrier backplate. In another embodiment, the spacers 4630 may be patterned on the movable electrodes 4660 using any suitable process. A skilled artisan will appreciate that various techniques may be used to form the spacers 4630. Additionally, the spacers 4630 and support structures 4613 are both illustrated as isolated pillars; however, one or both support structures can take the form of rails or other shapes.

Figure 47:
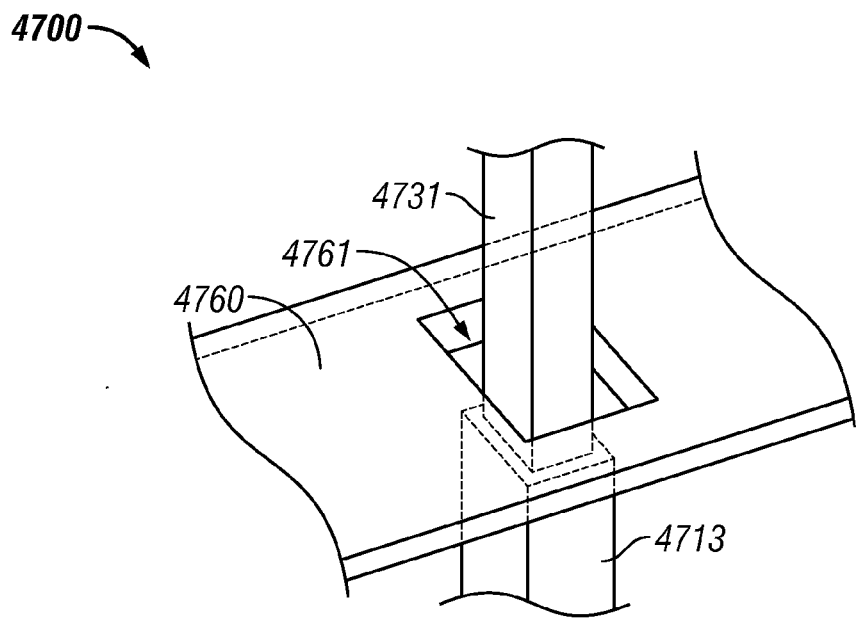
FIG. 47 is a perspective view of yet another embodiment of an interferometric modulator display device having spacers extending through the movable electrode layer.

Referring to FIG. 47, an interferometric modulator display device 4700 includes a spacer 4731 penetrating though a movable electrode 4760. In the illustrated embodiment, a movable electrode 4760 includes an opening or through-hole 4761 at a position over a post 4713. The spacer 4731 penetrates the movable electrode 4760 through the opening 4761.

The spacer 4731 maintains a space between the front substrate (not shown) and the backplate (not shown) of the interferometric modulator display device 4700. The spacer 4731 may also prevent or minimize the lateral movement of the movable electrode 4760 without undue interference with vertical flexing for actuation. The spacer 4731 may extend from the support structure 4713 of the front substrate or from the backplate (not shown). In one embodiment, the spacer 4731 may be formed on the front substrate using any suitable process before attaching the backplate to the front substrate. For example, in an embodiment in which a shaped front substrate is used, the spacer 4731 may be formed by embossing, photolithography and etching, or inscribing. In another embodiment, the spacer 4731 may be patterned on the backplate using any suitable process before attaching the backplate to the front substrate. In a variant of the above, the spacer 4731 and pattered movable electrode 4760 are both provided on a carrier backplate that is mounted onto the front substrate. A skilled artisan will appreciate that various techniques may be used to form the spacers 4731.

Figure 48:
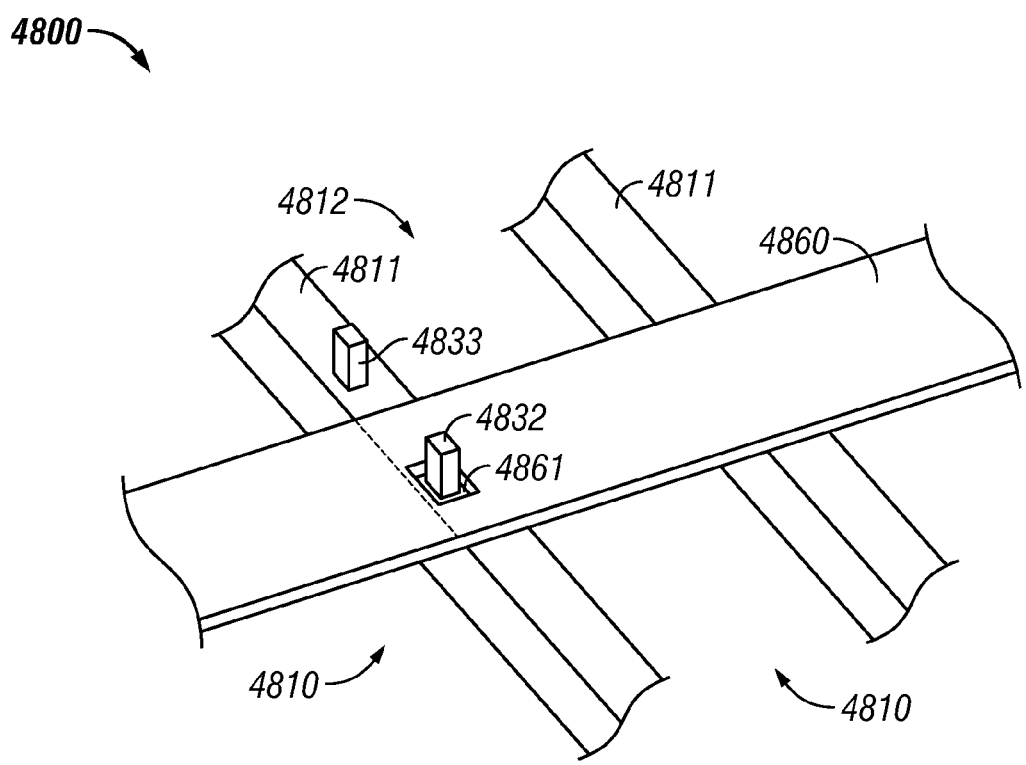
FIG. 48 is a perspective view of yet another embodiment of an interferometric modulator display device having spacers.

Referring to FIG. 48, an interferometric modulator display device 4800 includes a front substrate 4810 and a backplate (not shown). The front substrate 4810 includes rails 4811 defining troughs 4812 therebetween. The front substrate 4810 may also include posts (not shown) in the troughs 4812. The device 4800 also includes movable electrodes 4860 having at least one opening or through-hole 4861 over the rails 4811 of the front substrate 4810.

The interferometric modulator display device 4800 also includes a first spacer 4832 and a second spacer 4833 on the rails 4811. The first spacer 4832 penetrates the movable electrode 4860 through the opening 4861. The configuration of the first spacer 4832 is similar to that of the spacer 4731 of FIG. 47 except that the first spacer 4832 is positioned on the rail 4811. The second spacer 4833 is positioned on the rail 4811 while being laterally spaced apart from the movable electrode 4860. The second spacer 4833 serves solely to maintain a space between the front substrate and the backplate, and does not pin or fix the movable electrode 4860. The first and second spacers 4832, 4833 may be formed using any suitable method, for example, any of the methods for forming the spacer 4731 of FIG. 47 described above. In addition to the rails 4811, the front substrate 4810 can include posts within the troughs to stiffen the movable electrodes 4860.

Figure 49A:
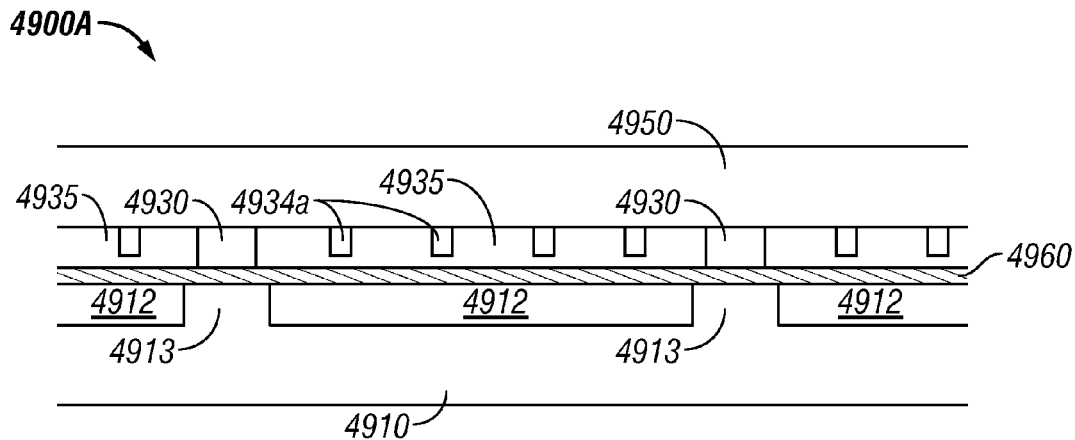
FIG. 49A is a cross section of one embodiment of an interferometric modulator display device having stop posts extending from a backplate.

Referring to FIG. 49A, an interferometric modulator display device 4900A includes a front substrate 4910 and a backplate 4950. The front substrate 4910 includes support structures 4913 (e.g., rails or posts) defining optical cavity or gap. The device 4900A also includes movable electrodes 4960 between the front substrate 4910 and the backplate 4960.

The interferometric modulator display device 4900A further includes spacers 4930 and stop posts 4934a. The spacers 4930 serve to maintain a desired space 4935 between the front substrate 4910 and the backplate 4950. In addition, the spacers 4930 add stiffness to the movable electrodes 4960 by pinning them. In the illustrated embodiment, the configuration of the spacers 4930 may be similar to that of one of the spacers 4630, 4731 of FIGS. 46B and 47. The stop posts 4934a are laterally spaced apart from the support structures 4913 while extending from the backplate 4950. The stop posts 4934a do not contact the movable electrodes 4960 at the illustrated position. During the operation of the device 4900, the stop posts 4934a function to stop the movable electrodes 4960 when they are relaxed and move from an actuated position proximate to the front substrate 4910 toward the backplate 4950. The stop posts 4934a thus prevent upward overshoot of the movable electrodes 4960. Such prevention is particularly applicable to the closely spaced substrates 4910, 4950 of the illustrated embodiment, which facilitate hermetic sealing. With a very small volume trapped between the substrates 4910, 4950, it is much easier to prevent leakage into the evacuated and hermetically sealed package. The spacers 4930 and the stop posts 4934a may be formed using any suitable process (e.g., embossing, photolithography and etching, or inscribing) on the backplate 4950.

Figure 49B:
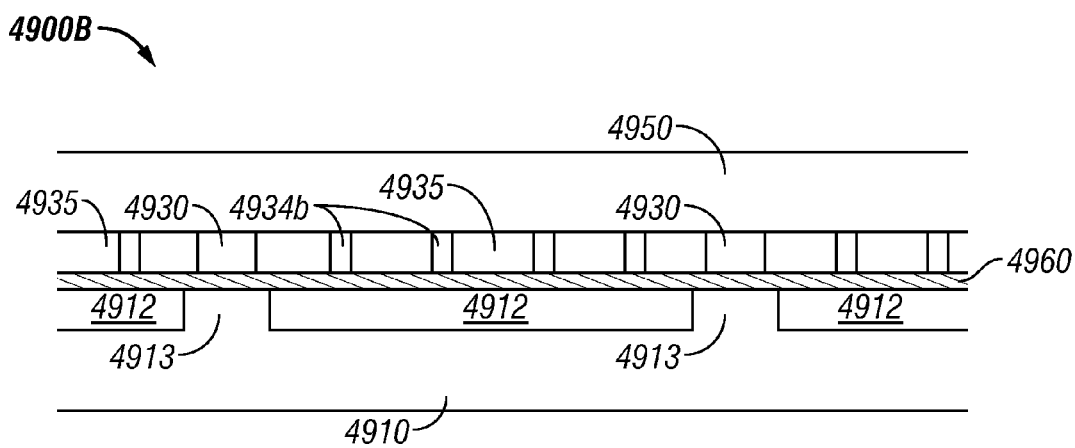
FIG. 49B is a cross section of another embodiment of an interferometric modulator display device having stop posts extending from a backplate.

Referring to FIG. 49B, an interferometric modulator display device 4900B includes a front substrate 4910 and a backplate 4950. The configurations of the front substrate 4910 and the backplate 4950 can be as described above with reference to FIG. 49A except that stop posts 4934b of FIG. 49B contact the movable electrodes 4960 at the illustrated position during operation. In certain embodiments, some or all of the stop posts 4934b can adhere to the movable electrodes 4960 such that only portions of the movable electrodes 4960 between the stop posts 4934b collapse during actuation. Of course, the figures are not to scale and in reality the posts will be spaced relatively far apart. In some embodiments, the backplate 4950 can further include rails (not shown) extending substantially perpendicular to the movable electrodes 4960.

Figure 49C:
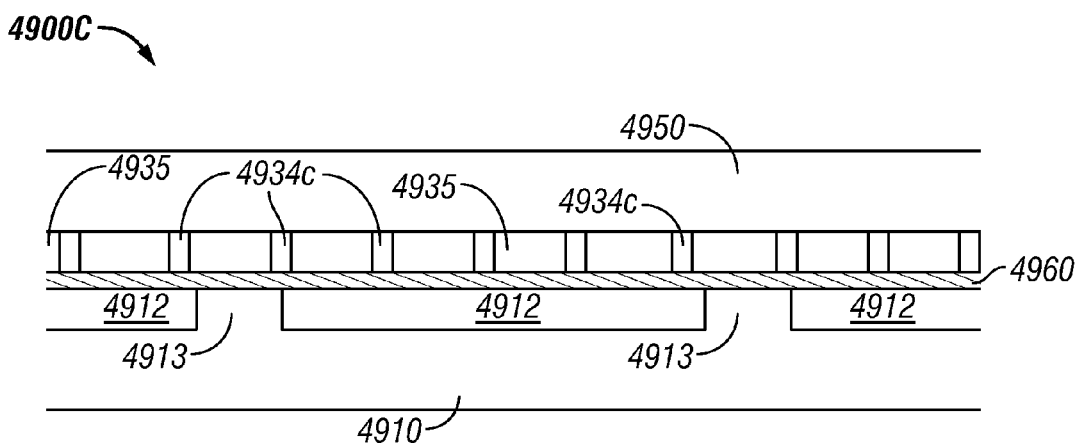
FIG. 49C is a cross section of yet another embodiment of an interferometric modulator display device having stop posts extending from a backplate.

Referring to FIG. 49C, an interferometric modulator display device 4900C includes a front substrate 4910 and a backplate 4950. The configurations of the front substrate 4910 and the backplate 4950 can be as described above with reference to FIG. 49B except that the backplate 4950 of FIG. 49C does not have spacers particularly aligned with the support structures 4913 of the front substrate 4910. Rather, the stop posts 4934c of the backplate 4950 are distributed without regard for alignment with support structures 4913 of the front substrate 4910. A skilled artisan will appreciate that various other configurations of spacers and/or stop posts may also be adapted for use with the interferometric modulator display devices 4600, 4700, 4800, 4900A-4900C.

Figure 50:
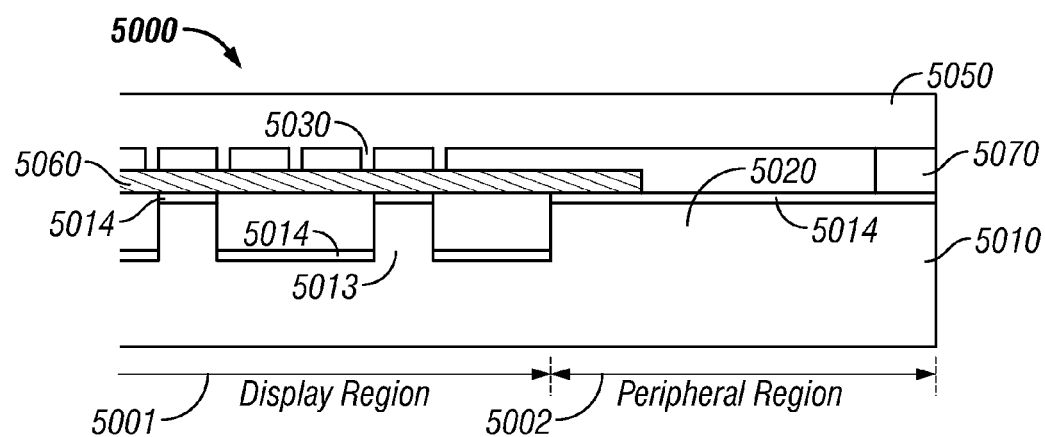
FIG. 50 is a cross section of one embodiment of an interferometric modulator display device having no support in the display region thereof.

Referring to FIG. 50, in yet another embodiment, an interferometric modulator display device 5000 includes a front substrate 5010 having a land 5020 in the peripheral region 5002 thereof. The configuration of the land 5020 may be as described above with reference to FIG. 17A-17C or 18A-18C.

The illustrated front substrate 5010 includes rails 5013, but no posts in the display region 5001 thereof. Thus, the rails 5013 and the land 5020 together serve to support movable electrodes 5060 of the device 5000. In addition, the land 5020 functions to define at least part of a gap between the front substrate and the backplate of the device 5000. The device 5000 also includes a backplate 5050 which may include support structures in the form of posts 5030 from which the movable electrodes 5060 are suspended. The device 5000 further includes optical stacks 5014 both in the display region 5001 and in the peripheral region 5002. The device 5000 also includes a sealant 5070 in the form of beads between the front substrate 5010 and the backplate 5050.

Figure 51:
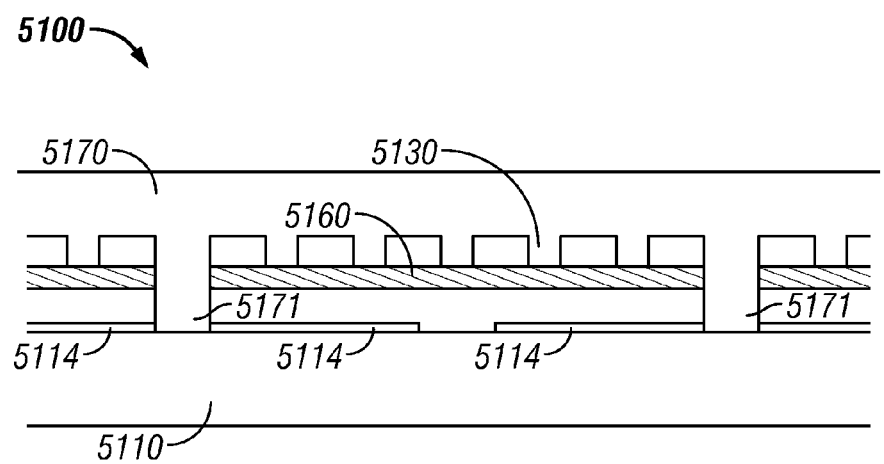
FIG. 51 is a cross section of one embodiment of an interferometric modulator display device having spacers extending from a backplate to a front substrate.

Referring to FIG. 51, an interferometric modulator display device 5100 includes a front substrate 5110 with no support formed thereon. The front substrate 5110 includes stationary electrodes 5114 formed by a patterning process, e.g., photolithography and etching. The device 5100 may instead have a backplate 5170 having supports 5171 extending therefrom. The supports 5171 extend down to the front substrate 5110, and maintain a gap between the front substrate 5110 and the backplate 5170. The device 5100 may have movable electrodes 5160 interposed between the front substrate 5110 and the backplate 5170. The movable electrodes 5160 may be suspended from support structures in the form of posts 5130 formed on the backplate 5170. Although not shown, the front substrate 5110 may have a land described above to support movable electrodes. A skilled artisan will appreciate that various other combinations of supports are also possible.

VI. Black Mask

1. Patterned Black Mask

Figure 52A:
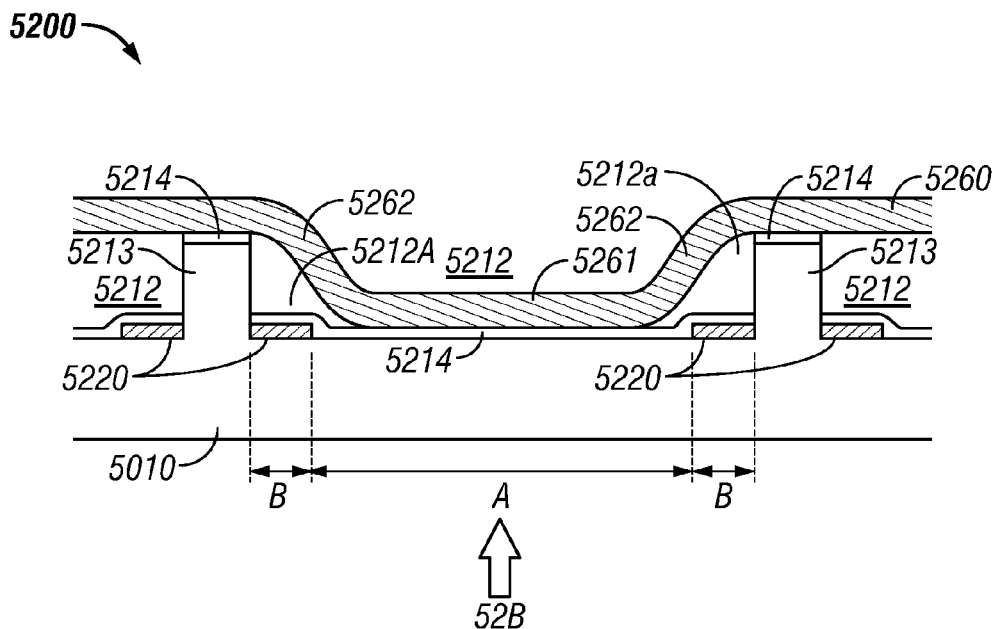
FIG. 52A is a cross section of one embodiment of an interferometric modulator display device having a patterned black mask.
Figure 52B:
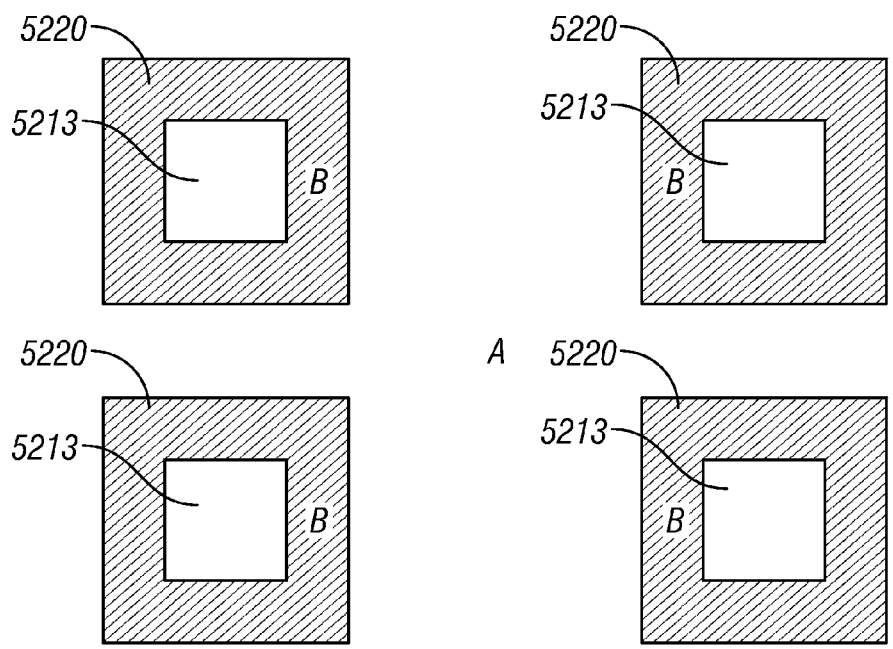
FIG. 52B is a top plan view of the interferometric modulator display device of FIG. 50A according to one embodiment.

Referring to FIGS. 52A and 52B, an interferometric modulator display device 5200 includes a front substrate 5210 and a backplate (not shown). The front substrate 5210 includes support structures in the form of posts 5213 and cavities 5212 defined by the posts 5213. The front substrate 5210 also includes an optical stack 5214 on the bottom of the cavities 5212. The device 5200 also includes a movable electrode 5262 supported on the posts 5213. In FIG. 52A, the movable electrode 5260 is in its actuated position. In the actuated position, the movable electrode 5260 is bent by electrostatic attraction toward a stationary electrode on the front substrate 5210. In the illustrated embodiment, one of the cavities 5212 forms a single pixel, but only part of a cavity (which may have several posts) is shown.

As shown in FIG. 52A, a central portion 5261 of the movable electrode 5260 contacts or comes close to the stationary electrode in the form of an optical stack 5214 of the front substrate 5210 while portions 5262 of the movable electrode 5260 proximate the support structures have a gap 5212a with the optical stack 5214. Because of the gap 5212a, the optical interference of light incident on non-adjoining regions A distant from the support structures 5213 is different from that of light incident on adjoining regions B proximate to the support structures 5213. In the actuated position, the non-adjoining regions A absorb light while the adjoining regions B at least partially reflect light. Such a difference in the optical interference produces a dark area in the non-adjoining regions A and a bright area in the adjoining regions B, which tends to wash out the intended dark color.

To prevent or mitigate the bright area in the actuated position, the interferometric modulator display device may include black masks in the adjoining regions B of the front substrate 5210. In the illustrated embodiment, the front substrate 5210 includes black masks 5220 under the optical stack 5214 proximate to the support structures. The black masks 5220 may be formed using photolithography and etching. In the context of this document, a black mask formed in such a manner is referred to as a "patterned" black mask. FIG. 52B illustrate a black mask 5220 viewed from below the front substrate 5210 as denoted by the arrow 52B in FIG. 52A.

In the illustrated embodiment, an optical stack 5214 is formed on top of the support structures 5213. This configuration allows the device 5200 not to have a black mask under the support structures 5213 because the optical stack 5214 and the movable electrode on top act identical to an actuated movable electrode and an optical stack below, thus serving as a black mask. The patterned black mask may apply to any of the interferometric modulator display device embodiments described above.

2. Partial Wetting Black Mask

Figure 53A:
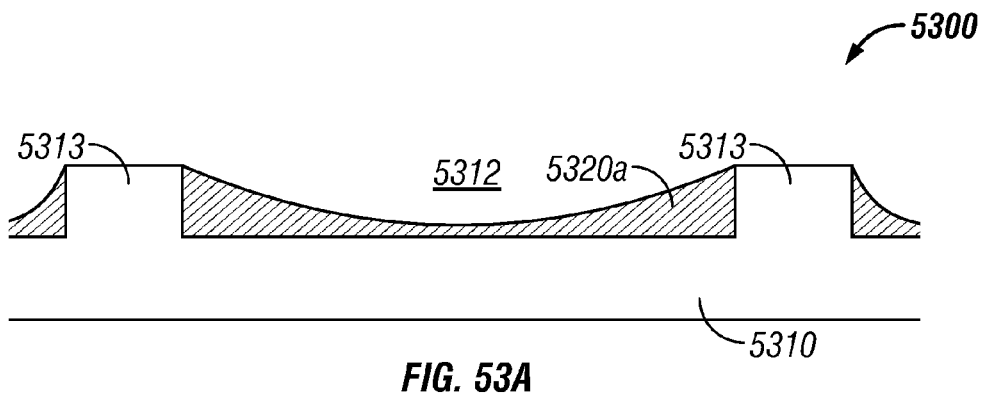
FIGS. 53A-53C illustrate one embodiment of a method of making a partial wetting black mask for an interferometric modulator display device.
Figure 53B:
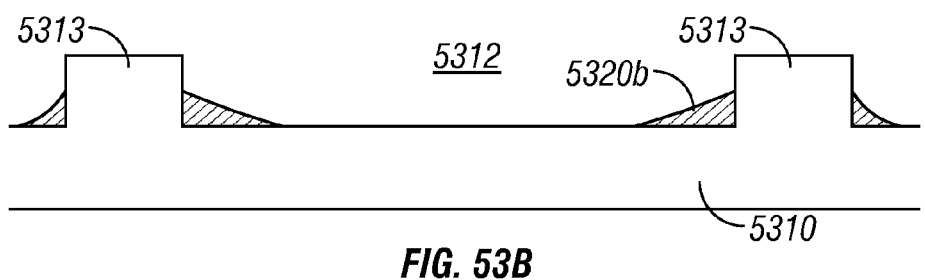
Figure 53C:
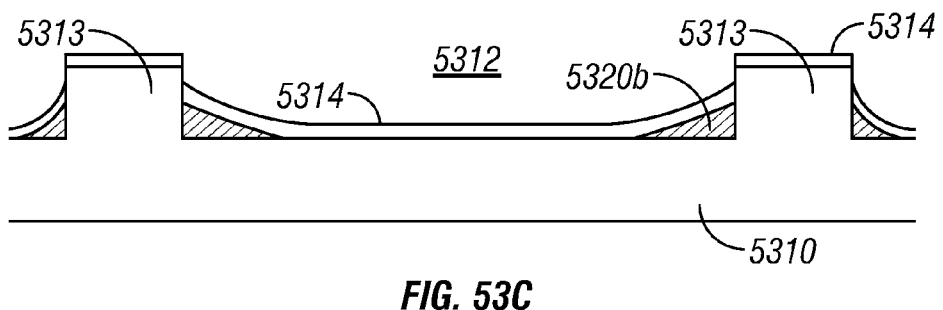

FIGS. 53A-53C illustrates another embodiment of a method of forming a black mask in an interferometric modulator display device 5300. First, a front substrate 5310 is provided including support structures 5313 and cavities 5312 defined by the support structures 5313. Then, the cavities 5312 are substantially filled with a black mask material 5320a using any suitable process, for example, spin coating or spray coating. In another embodiment, the front substrate 5310 may be immersed in a black mask material suspension or solution in a container. The black mask material 5320a may include a black pigment and an organic solvent. The black mask material 5320a may have a density or viscosity adapted for the processes described below. In one embodiment, the black pigment may be an organic material. In another embodiment, the black pigment may be an inorganic material. Examples of the black pigment include, but are not limited to, copper oxide, graphite, and carbon black. Examples of the solvent include, but are not limited to, acetone and isopropyl alcohol (IPA). In some embodiments, the black mask material may also include a photoresist and/or a polymeric material (e.g., thermosetting polymer).

Figure 53D:
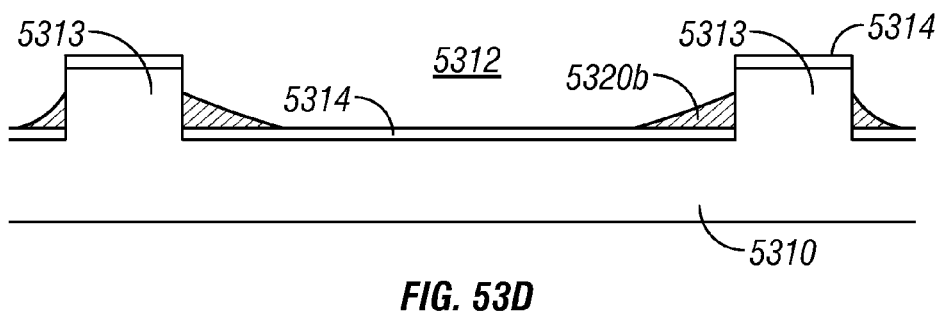
FIG. 53D illustrates another embodiment of an interferometric modulator display device having a partial wetting black mask.

Next, the solvent is removed from the cavities 5312 while leaving the black pigment in the cavities 5312. In one embodiment, the solvent may be removed by drying. In certain embodiments, the front substrate 5310 may be heated to facilitate drying of the solvent. Then, the surface tension of the black mask material 5320a drives a substantial portion of the material 5320a to regions proximate to the support structures 5313 while the solvent is being removed. Thus, a substantial portion of the black pigment remains near the support structures 5313 (e.g., within about 1 μm to about 10 μm from the posts 5313), thereby forming black masks 5320b, as shown in FIG. 53B. Subsequently, an optical stack 5214 is formed over the front substrate 5310, as shown in FIG. 53C. In another embodiment, a black mask 5320b may be formed after an optical stack 5314 is formed on a shaped front substrate 5310, as shown in FIG. 53D in a manner similar to that shown in FIGS. 53A and 53B. A black mask formed in the manner shown in FIGS. 53A-53D may be referred to as a partial wetting black mask in the context of this document. The partial wetting black mask may apply to the embodiments in which a shaped front substrate or a preformed support substrate is used. A skilled artisan will appreciate that the partial wetting black mask may be adapted for use in the various embodiments described above. In the illustrated embodiment, an optical stack 5314 on top of the support structures 5313 and a movable electrode (not shown) overlying the optical stack 5314 together serve as a black mask similar to those shown in FIG. 52A.

VII. Static Interferometric Display

It will be understood that although the embodiments of interferometric modulators discussed above relate to interferometric modulators having movable electrodes, other embodiments are possible. In particular, a static interferometric display may be provided, which includes a first partially reflective layer and a second layer which is at least partially reflective, separated by an interferometric gap defined by air or a light-transmissive material. The term "static interferometric display" refers to a device configured to display a static image using interferometric effect. The static image can include a black and white image and/or a color image, and may include patterns on a single interferometric gap.

It will be understood that the second reflective layer may be partially reflective, or may be fully reflective, depending on the embodiment. For convenience, the first partially reflective layer, for which partial transmission is functionally significant, may be referred to herein as a partially reflective layer, and the second reflective layer may be referred to as a reflective layer, and the two layers together may be referred to collectively as reflective layers, although it will be understood that the use of the term reflective layer is not intended to exclude partially reflective layers. Similarly, the partially reflective layer may be alternately referred to as an absorber.

In such a static interferometric display, there is no need to select or include conductive materials for use as electrodes, as the static interferometric display is not intended to be electrostatically actuatable. Similarly, the reflective layers need not be electrically isolated from one another, as there is no need to apply a voltage across the two layers (because there is neither movement nor relaxation from an actuated state). Thus, non-conductive material may be used to form the reflective layers, and conductive material may be used to define the interferometric gap. A static interferometric display may comprise an air gap instead of a light-transmissive layer. In further embodiments, a static interferometric display may be identical to an actuatable interferometric modulator, and may simply not be actuated. It will be understood that the use of a solid material to define the air gap may provide additional stability, however, in addition to further possible advantages discussed below.

In some embodiments, a static interferometric display can be formed by attaching two substrates, each of which has components preformed thereon, similar to the MEMS devices described above with reference to FIG. 9. In such embodiments, no sacrificial material is needed for preforming the components (e.g., cavities) on the substrates, as with previously described embodiments. In attaching the two substrates, any suitable technique (e.g., lamination, bonding, etc.) can be used.

In one embodiment, a static interferometric display may be formed by attaching a front substrate to a backplate. The "front substrate," as employed herein, is generally transparent and faces the viewer. At least one of the front substrate and the backplate may be shaped to form cavities of selected depth for interferometric modulation. The cavities may be formed by any suitable process, e.g., embossing, photolithography and etching, and inscribing.

Figure 54:
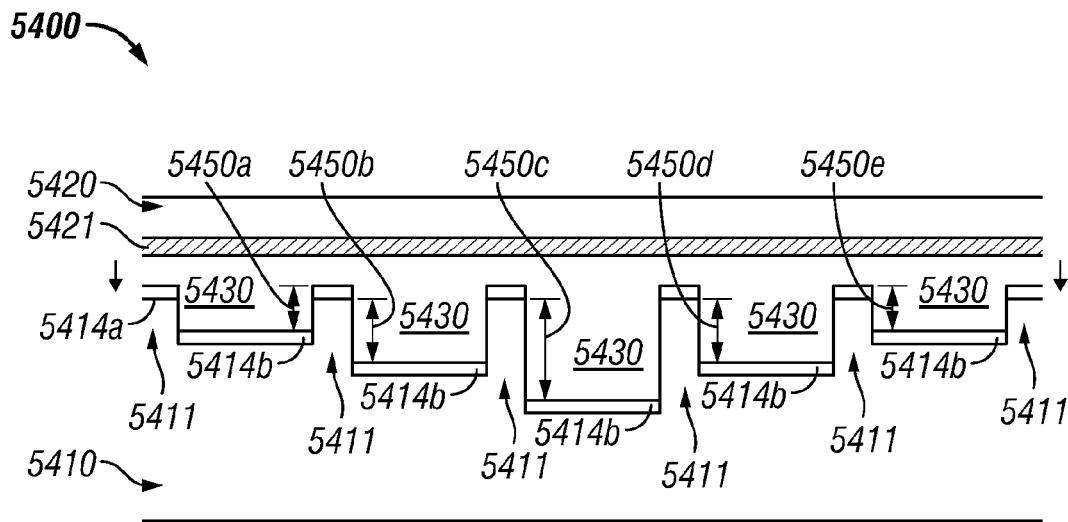
FIG. 54 is a cross section of one embodiment of a static interferometric display including a shaped front substrate.

1. Static Interferometric Display with Shaped or Preformed Support Front Substrate FIG. 54 illustrates the pre-lamination state of a static interferometric display 5400 according to one embodiment. The static interferometric display 5400 includes a front substrate 5410 and a backplate 5420. The front substrate 5410 includes a plurality of rails 5411 and a plurality of cavities or recesses 5430 defined by the rails 5411. In the context of this document, the rails 5411 may also be referred to as "supports" or "support structures." The front substrate 5410 also includes an optical layer or optical stack 5414a on top of the rails 5411 and the same optical layer or stack 5414b on the bottom of the cavities 5430. As described above with reference to FIG. 11A, the optical layer or stack 5414a on top of the rails 5411 can provide black or white color, depending on the interferometric display design, as governed by the optical thickness of the optical layer or stack 5414a. The backplate 5420 includes a reflective layer (or minor) 5421 facing the front substrate 5410.

The front substrate 5410 may be formed of a substantially transparent material. Examples of the transparent material include, but are not limited to, glass and transparent polymeric materials. The front substrate 5410 may be shaped by any method suitable for removing or shaping portions of the front substrate 5410 or forming recesses into a surface of the substrate 5410. Examples of shaping methods include, but are not limited to, embossing (e.g., the method described with reference to FIGS. 12A-12C), photolithography (or screen printing) and etching, and inscribing. Because the substrate 5410 may be shaped without adding an additional material to the substrate 5410 in at least some of the methods described above, the supports in the form of the rails 5411 may be formed integrally with and of the same material as that of the front substrate 5410. In other embodiments, support structures can be formed on a substantially planar front substrate by deposition and patterning of an additional material, as described above with respect to the preformed support front substrate.

Figure 56:
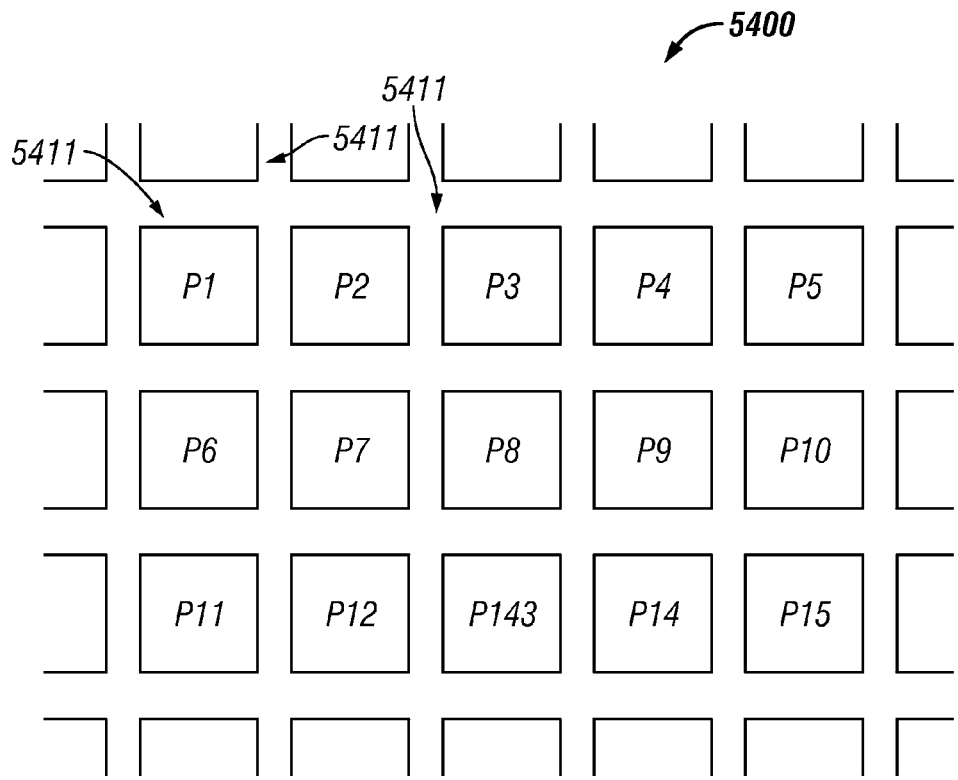
FIG. 56 is a top plan view of the static interferometric display of FIG. 54.

Each of the rails 5411 extends in either a row direction or a column direction parallel to one another, as shown in FIG. 56. The illustrated rails 5411 define cavities of a square shape arranged in a grid or matrix form. In other embodiments, the cavities can have various other shapes when viewed from above, e.g., rectangle, triangle, circle, oval, etc., and the grid need not be orthogonal. Indeed, the image can have any desired pattern, since there are no issues with respect to electrically addressing pixels. The rails 5411 have their top surfaces at substantially the same level, i.e., within a single plane.

The cavities 5430 are defined to have multiple depths 5450a-5450e, depending on the colors which the cavities 5430 are designed to produce in the resulting display. For optimal clarity and sharpness of color, the depths 5450a-5450e may be in a range from about 500 Å to about 5,000 Å. While interferometric effects can also be obtained with greater optical depth, the skilled artisan will appreciate that colors begin to wash out with greater depth as the optical distances correspond to multiples of a variety of wavelengths. In other embodiments in which fillers are used (e.g., FIGS. 57, 58, 60, and 61), the depths of the cavities given for air may be adjusted for such fillers because the fillers can have different optical density (index of refraction). Because the static interferometric display 5400 only displays a static image, the depths of the cavities are selected according to the pattern of the desired static image. A skilled artisan will appreciate suitable depths 5450a-5450e for producing desired colors and patterns using interferometric effect.

The optical stacks 5414a, 5414b may be a single layer or may include several fused layers. In one embodiment, the optical stacks 5414a, 5414b may be formed of a dielectric material having an absorption coefficient suitable for interferometric effect. Examples of the dielectric material include, but are not limited to, silicon dioxide and aluminum oxide. In another embodiment, the optical stack 5414a, 5414b may have a two-layered structure, including an upper sublayer and a lower sublayer. The upper sublayer may be formed of aluminum oxide. The lower sublayer may be formed of silicon dioxide.

In one embodiment, the optical stacks 5414a, 5414b may have a thickness between about 100 Å and about 1,600 Å. In the embodiment in which the optical stacks 5414a, 5414b have upper and lower sublayers, the upper sublayer may have a thickness of, for example, about 50 Å, while the lower sublayer may have a thickness of, for example, about 450 Å. In the illustrated embodiment, the optical stacks 5414a, 5414b are discontinuous between the bottom of the cavities 5430 and the top of the rails 5411 due to a directional deposition, such as sputtering.

In certain embodiments, the optical stacks 5414a, 5414b may also include a metallic absorber layer (or a partially reflective layer). The absorber layer may be formed of a semi-transparent thickness of metal, such as chromium (Cr) or germanium (Ge). The absorber layer may have a thickness between about 1 Å and about 100 Å, particularly between about 50 Å and about 100 Å.

In certain embodiments, the front substrate 5410 itself may be formed of a material having optical dispersion (index of refraction and absorption coefficient) suitable for interferometric effect. In such embodiments, the front substrate 5410 may not include optical stacks.

The backplate 5420 may be formed of any suitable material (e.g., a polymer, metal, and glass). The reflective layer 5421 of the backplate 5420 may be formed of a specular or reflective metal, for example, Al, Au, Ag, or an alloy of the foregoing, and is preferably thick enough to reflect substantially all visible light incident upon the front substrate 5410 for interferometric effect. In an exemplary embodiment, the reflective layer 5421 has a thickness of about 300 Å. The thicknesses of the reflective layer 5421 may vary widely in other embodiments. In certain embodiments, the backplate 5420 itself may be formed of a reflective material such as an aluminum foil. In such embodiments, the backplate 5420 does not include a separate reflective layer.

In the illustrated embodiment, the backplate 5420 is mounted on the front substrate 5410 as denoted by arrows such that the reflective layer 5421 contacts the top surfaces of the optical stacks 5414*a* on the rails 5411. The resulting static interferometric display 5400 may have substantially no gap between the reflective layer 5421 and the top surfaces of the optical stacks 5414*a* on the rails 5411.

2. Static Interferometric Display with Shaped or Preformed Backplate

Figure 55:
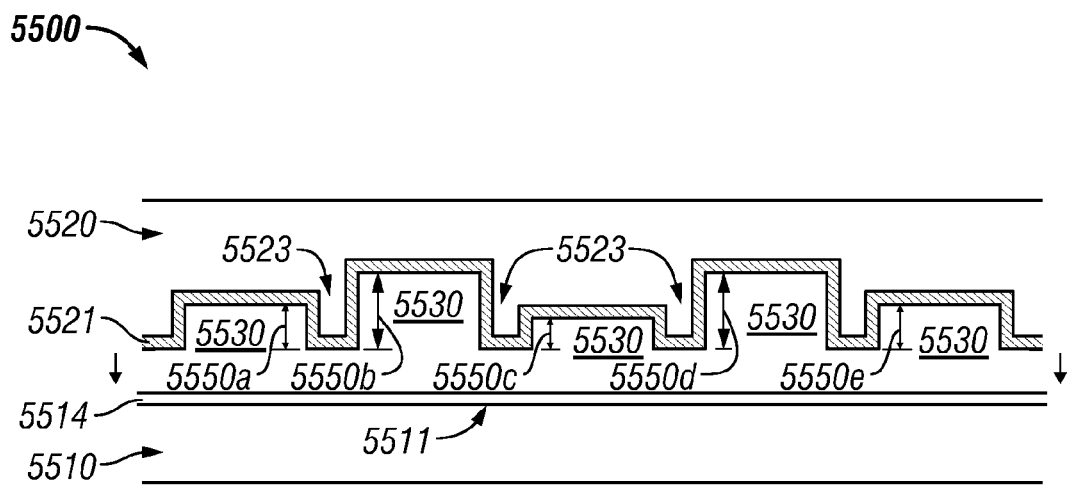
FIG. 55 is a cross section of another embodiment of a static interferometric display including a shaped backplate.

FIG. 55 illustrates the pre-lamination state of a static interferometric display 5500 according to another embodiment. The static interferometric display 5500 includes a front substrate 5510 and a backplate 5520. The front substrate 5510 includes a substantially planar surface 5511, and an optical layer or stack 5514 formed on the surface 5511. The backplate 5520 includes a plurality of rails 5523 and a plurality of cavities or recesses 5530 defined by the rails 5523. In the context of this document, the rails 5523 may also be referred to as "supports" or "support structures." The backplate 5520 also includes a reflective layer (or mirror) 5521 facing the front substrate 5510.

The configuration of the front substrate 5510 can be as described above with respect to that of the front substrate 5410 of FIG. 54 except that the front substrate 5510 of FIG. 55 is substantially planar. The configuration of the optical layers or stack 5514 can be as described above with respect to that of the optical layers or stacks 5414*a*, 5414*b* of FIG. 54 except that the optical layer or stack 5514 of FIG. 55 is substantially continuously formed on the surface of the front substrate 5510. In certain embodiments, the front substrate 5510 itself may be formed of a material having an absorption coefficient suitable for interferometric effect. In such embodiments, the front substrate 5510 may omit an optical stack.

The backplate 5520 may be formed of a material suitable for shaping. Examples of the material include, but are not limited to, glass, metal, and polymer. The backplate 5520 may be shaped by any method suitable for removing or shaping portions of the front substrate 5520 or forming recesses into a surface of the backplate 5520. Examples of shaping methods include, but are not limited to, embossing (e.g., the method described with reference to FIGS. 12A-12C), photolithography (or screen printing) and etching, and inscribing. Because the backplate 5520 is shaped without adding an additional material to the backplate 5520 in the methods described above, the supports in the form of the rails 5523 may be formed integrally with and of the same material as that of the backplate 5520. In other embodiments, support structures can be formed on a substantially planar backplate by deposition and patterning of an additional material, as described above with respect to the preformed support front substrate.

The rails 5523 extend in either a row direction or a column direction parallel to one another, similar to the pattern shown in FIG. 56. The rails 5523 have their bottom surfaces (facing the front substrate) at substantially the same level, i.e., within a single plane.

The cavities 5530 are shaped or preformed to have multiple depths 5550*a*-5550*e*, depending on the colors which the cavities 5530 are designed to produce in the resulting display. Because the static interferometric display 5500 only displays a static image, the depths of the cavities are selected according to the pattern of the desired static image. A skilled artisan will appreciate suitable depths 5550*a*-5550*e* for producing desired colors and patterns using interferometric effect.

The reflective layer 5521 of the backplate 5520 may be formed of a specular or reflective metal, for example, Al, Au, Ag, or an alloy of the foregoing, and is thick enough to reflect substantially all visible light incident upon the front substrate 5510 for interferometric effect. In an exemplary embodiment, the reflective layer 5521 has a thickness of about 300 Å. The thicknesses of the reflective layer 5521 may vary widely in other embodiments. In certain embodiments, a backplate may be formed of a reflective material such as aluminum. Such a backplate may be etched to form support structures. In such embodiments, the backplate may not include a separate reflective layer. In the illustrated embodiment, the reflective layer 5521 is continuously formed on surfaces of the backplate 5520. In other embodiments, the reflective layer 5521 may be discontinuous between the rails 5523 and the cavities 5530.

In the illustrated embodiment, the backplate 5520 is mounted on the front substrate 5510 as denoted by arrows such that the lowermost surfaces of the reflective layer 5521 (the bottom surfaces of the reflective layer 5521 underlying the rails 5523 and facing the front substrate 5510) contact the top surface of the optical stack 5514 of the front substrate 5510. The resulting static interferometric display 5500 may have substantially no gap between the lowermost surfaces of the reflective layer 5521 and the top surface of the optical stack 5514 of the front substrate 5510.

3. Static Interferometric Display with Cavity Filler

Figure 57:
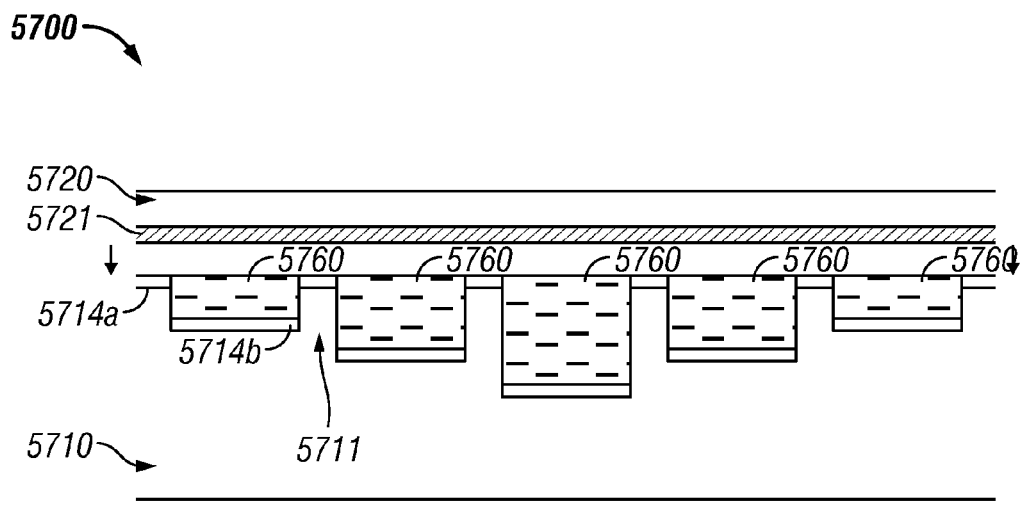
FIG. 57 is a cross section of another embodiment of a static interferometric display including a shaped front substrate.

FIG. 57 illustrates the pre-lamination state of a static interferometric display 5700 according to another embodiment. The static interferometric display 5700 includes a front substrate 5710 and a backplate 5720. The configuration of the front substrate 5710 can be as described above with respect to that of the front substrate 5410 of FIG. 54. The configuration of the backplate 5720 can be as described above with respect to that of the backplate 5420 of FIG. 54. The top plan view of the static interferometric display 5700 can be as described above with reference to FIG. 56.

The static interferometric display 5700 further includes a filler 5760 within the cavities of the front substrate 5710. The filler 5760 may be formed of a substantially transparent material. The substantially transparent material may have a suitable refractive index for interferometric effect. Examples of the substantially transparent material include, but are not limited to, oxides (e.g., $SiO_2$, $TiO_2$), nitrides (e.g., $SiN_3$, $SiN_4$), transparent photoresists, and transparent polymers. The filler 5760 may be formed by blanket depositing a filler material on the front substrate 5700 with the optical stacks 5714*a*, 5714*b* formed thereon, and then planarizing the top surface of the filler material. In certain embodiments, the filler may also cover the top surfaces of the optical stacks 5714*a* on the rails 5711.

In the illustrated embodiment, the backplate 5720 is mounted on the front substrate 5710 as denoted by arrows such that the lowermost surface of the reflective layer 5721 (facing the front substrate) contacts the top surface of the filler 5760 formed on the front substrate 5710. The resulting static interferometric display 5700 may have substantially no gap between the lowermost surface of the reflective layer 5721 and the top surface of the filler 5760. In certain embodiments, a reflective layer may be coated directly on the filler 5760. Then, a top surface of the reflective layer may be coated with a material having hardness suitable for protecting the reflective layer, instead of laminating a separate backplate. In other embodiments, a backplate may be attached to the reflective layer which has been directly formed on the filler 5760.

Figure 58:
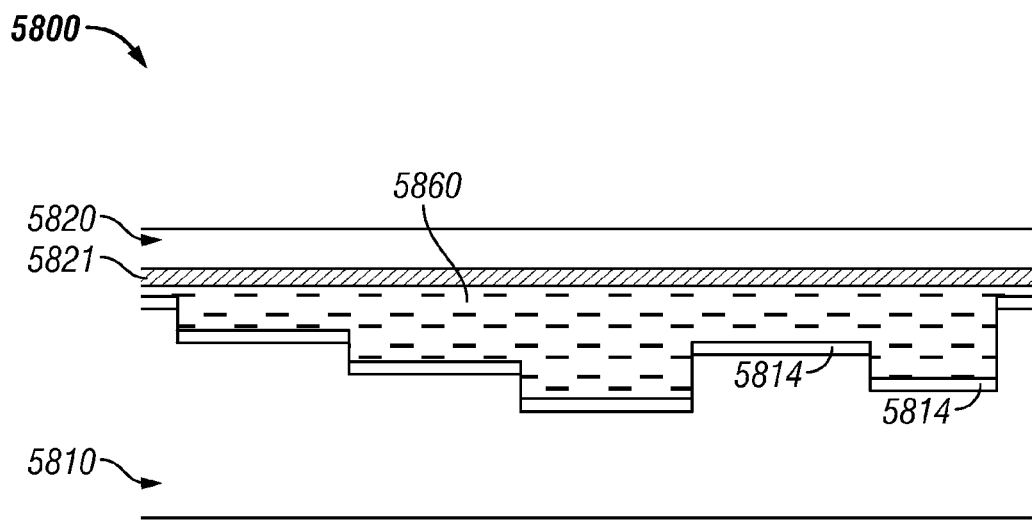
FIG. 58 is a cross section of yet another embodiment of a static interferometric display including a shaped front substrate without separate supports for each pixel.

FIG. 58 illustrates a static interferometric display 5800 according to another embodiment. The static interferometric display 5800 includes a front substrate 5810 and a backplate 5820. The configuration of the front substrate 5810 can be as described above with respect to that of the front substrate 5710 of FIG. 57 except that the front substrate 5810 of FIG. 58 does not include rails. The front substrate 5810 includes cavities having discrete depths which form a stepped surface. The illustrated front substrate 5810 includes a filler 5860 similar to the filler 5760 of FIG. 5760. The filler 5860 may be formed by blanket depositing a filler material on the front substrate 5800 with the optical stacks 5814 formed thereon, and then planarizing the top surface of the filler material. The configuration of the backplate 5820 can be as described above with respect to that of the backplate 5720 of FIG. 57.

Figure 59:
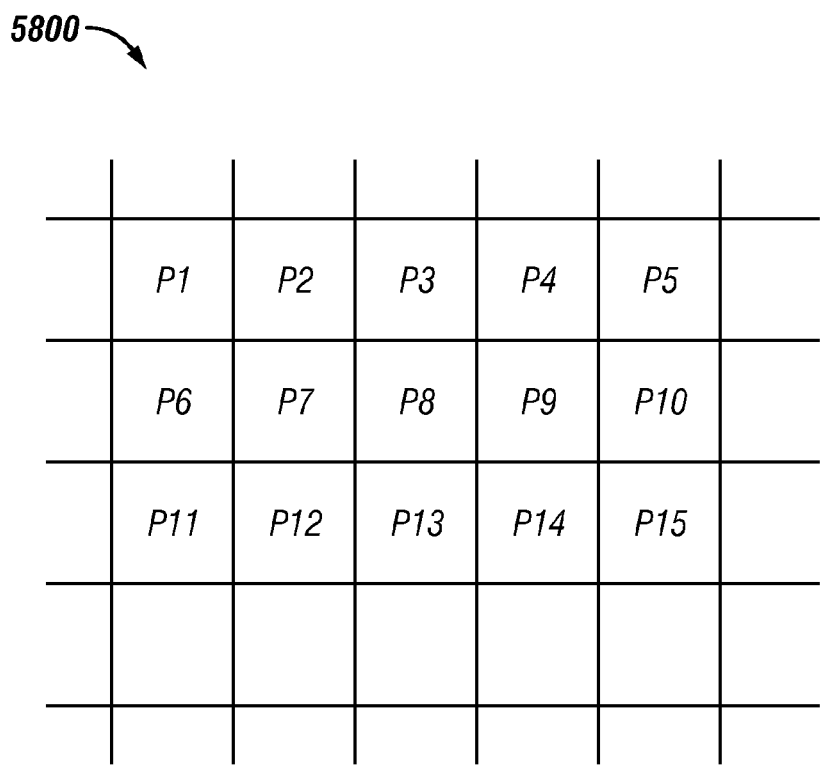
FIG. 59 is a top plan view of the static interferometric display of FIG. 58.

FIG. 59 illustrates a top plan view of a portion of the static interferometric display 5800 of FIG. 58. Because the static interferometric display 5800 includes no rails, it does not have partitions when viewed from above, as shown in FIG. 59. The static interferometric display 5800 includes square-shaped pixels P1-P15. A skilled artisan will appreciate that a static interferometric display can have various other shapes of pixels and that the grid need not be orthogonal. Indeed, the image can have any desired pattern, since pixels need not be electrically addressed.

Figure 60:
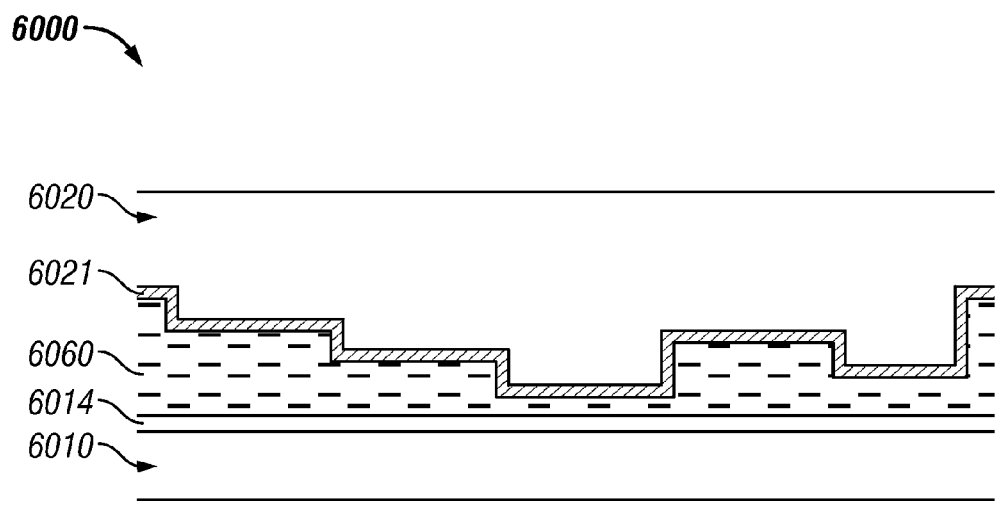
FIG. 60 is a cross section of another embodiment of a static interferometric display including a shaped backplate.

FIG. 60 illustrates a static interferometric display 6000 according to another embodiment. The static interferometric display 6000 includes a front substrate 6010 and a backplate 6020. The configuration of the front substrate 6010 can be as described above with respect to that of the front substrate 5510 of FIG. 55. The configuration of the backplate 6020 can be as described above with respect to that of the backplate 5520 of FIG. 55 except that the backplate 6020 of FIG. 60 does not include rails.

The illustrated backplate 6020 includes a filler 6060 similar to the filler 5860 of FIG. 58. The filler 6060 may be formed by blanket depositing a filler material on the backplate 6020 with a reflective layer 6021 formed thereon, and then planarizing the top surface of the filler material. Then, the backplate 6020 with the filler 6060 may be attached to the front substrate 6010 with an optical stack 6014 formed thereon, thereby forming a static interferometric display. The top plan view of the static interferometric display 6000 can be as described above with reference to FIG. 59.

4. Static Interferometric Display with Continuous Depth Cavities

Figure 61:
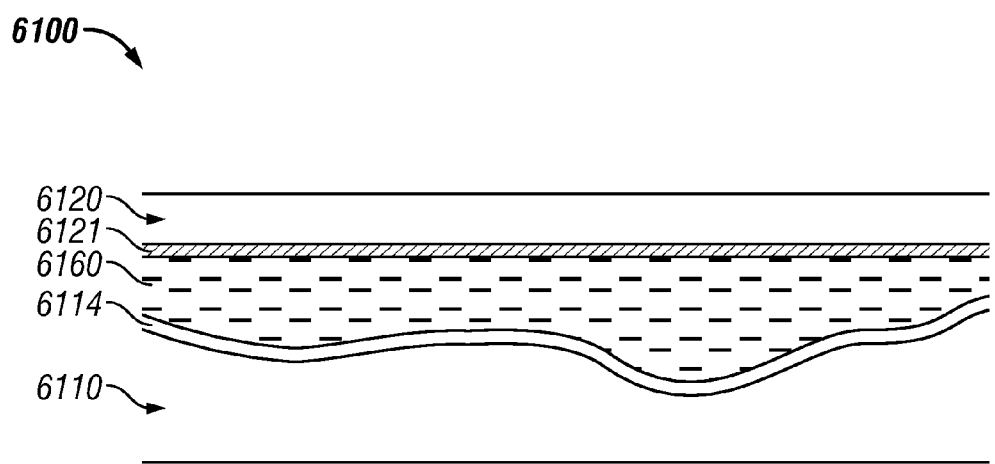
FIG. 61 is a cross section of another embodiment of a static interferometric display including a shaped front substrate.

FIG. 61 illustrates a static interferometric display 6100 according to another embodiment. The static interferometric display 6100 includes a front substrate 6110 and a backplate 6120. The configuration of the front substrate 6110 can be as described above with respect to that of the front substrate 5810 of FIG. 58 except that the front substrate 6110 of FIG. 61 includes cavities having depths which are continuous or smoothly transitioning rather than discrete. The front substrate 6110 also includes a filler 6160 similar to the filler 5860 of FIG. 58. The configuration of the backplate 6120 can be as described above with respect to that of the backplate 5820 of FIG. 58. In another embodiment, the backplate may have cavities having continuous or smoothly transitioning depths while the front substrate is substantially flat. A skilled artisan will appreciate that various other combinations of front substrates and backplates are also possible.

In some of the embodiments described above, a front substrate and/or carrier (either permanent or removable) are shaped and discontinuous deposition is performed thereon. This method avoids expensive masking steps, thus reducing manufacturing costs. In addition, spacers, supports, stop posts formed on a back carrier each lead to better uniformity and reliability, and less pressure variation and moisture susceptibility with a smaller gap.

The embodiments, although described with respect to an interferometric modulator display device, are applicable more generally to other MEMS devices, particularly electrostatic MEMS with electrodes capable of relative movement.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

The invention claimed is:

1. A microelectromechanical system (MEMS) device, comprising:
    a front substrate comprising a first support extending from the front substrate;
    a backplate having a surface substantially opposing the front substrate such that the first support is interposed between the front substrate and the surface of the backplate;
    a moving electrode interposed between the front substrate and backplate, the moving electrode comprising a portion supported on the first support; and
    a second support extending from and integrally formed with the surface of the backplate, wherein the second support is positioned between the first support of the front substrate and the surface of the backplate.

2. The device of claim 1, wherein the first support comprises at least one of a post and a rail.

3. The device of claim 1, wherein the second support comprises a post.

4. The device of claim 1, wherein the portion of the moving electrode is interposed between the first support and the second support.

5. The device of claim 1, wherein the portion of the moving electrode comprises an opening and wherein the second support extends through the opening of the portion of the moving electrode.

6. The device of claim 1, wherein the second support is laterally spaced apart from the portion of the moving electrode.

7. The device of claim 1, wherein the MEMS device comprises an interferometric modulator.

8. A method of making a microelectromechanical system (MEMS) device, the method comprising:
    providing a front substrate comprising a first support extending from the front substrate;
    providing a backplate having a surface;
    attaching the front substrate to the backplate such that the first support is interposed between the front substrate and the surface of the backplate; and
    forming a second support between the first support of the front substrate and the surface of the backplate such that the second support extends from and is integrally formed with the surface of the backplate, wherein the second support comprises a post.

9. The method of claim 8, wherein the first support comprises a rail.

10. The method of claim 8, wherein forming the second support comprises forming the second support of the same material as the first support.

11. The method of claim 8, wherein forming the second support comprises forming the second support on the surface of the backplate before attaching the front substrate to the backplate.

12. The method of claim 8, wherein forming the second support comprises forming the second support of the same material as the backplate.

13. The method of claim 8, wherein forming the second support comprises etching the backplate.

14. A method of making a microelectromechanical system (MEMS) device, the method comprising:
   providing a front substrate comprising a first support extending from the front substrate;
   providing a backplate having a surface;
   providing a moving electrode between the front substrate and the backplate such that a portion of the moving electrode is supported on the first support;
   attaching the front substrate to the backplate such that the first support is interposed between the front substrate and the surface of the backplate; and
   forming a second support between the first support of the front substrate and the surface of the backplate such that the second support extends from and is integrally formed with the surface of the backplate.

15. The method of claim 14, wherein forming the second support comprises forming the second support such that the portion of the moving electrode is interposed between the first support and the second support.

16. The method of claim 14, wherein forming the second support comprises forming the second support such that the second support penetrates the portion of the moving electrode.

17. The method of claim 14, wherein forming the second support comprises forming the second support such that the second support is laterally spaced apart from the portion of the moving electrode.

18. A method of making a microelectromechanical system (MEMS) device, the method comprising:
   providing a front substrate comprising a first support extending from the front substrate;
   providing a backplate having a surface;
   attaching the front substrate to the backplate such that the first support is interposed between the front substrate and the surface of the backplate; and
   forming a second support between the first support of the front substrate and the surface of the backplate such that the second support extends from and is integrally formed with the surface of the backplate, wherein forming the second support comprises forming the second support to contact the first support of the front substrate.

19. A method of making a microelectromechanical system (MEMS) device, the method comprising:
   providing a front substrate comprising a first support extending from the front substrate;
   providing a backplate having a surface;
   attaching the front substrate to the backplate such that the first support is interposed between the front substrate and the surface of the backplate; and
   forming a second support between the first support of the front substrate and the surface of the backplate such that the second support extends from and is integrally formed with the surface of the backplate, wherein forming the second support comprises embossing the backplate.

* * * * *

UNITED STATES PATENT AND TRADEMARK OFFICE
CERTIFICATE OF CORRECTION

| | |
|---|---|
| PATENT NO. | : 8,284,475 B2 |
| APPLICATION NO. | : 12/752982 |
| DATED | : October 9, 2012 |
| INVENTOR(S) | : Sampsell et al. |

It is certified that error appears in the above-identified patent and that said Letters Patent is hereby corrected as shown below:

In column 2 (title page 4 item 56) at line 3, Under Other Publications, change "XeF2" to --XeF$_2$--.

In column 2 (title page 4 item 56) at line 4, Under Other Publications, change "SiO2," to --SiO$_2$,--.

In column 2 (title page 4 item 56) at line 18, Under Other Publications, change "XeF2" to --XeF$_2$--.

In column 2 (title page 4 item 56) at line 53, Under Other Publications, change "Reponse" to --Response--.

In column 2 (title page 4 item 56) at line 55, Under Other Publications, change "Communicationdated" to --Communication dated--.

In the Drawings:

Sheet 58 of 60 (FIG. 56) at line 6 (approx.), Change "P143" to --P13--.

In the Specification:

In column 1 at line 29, Change "and or" to --and/or--.

In column 7 at line 6, Change "minor" to --mirror--.

In column 14 at line 32, Change "respectively" to --respectively.--.

In column 22 at line 27-28, Change "α-direction)" to --(x-direction)--.

In column 26 at line 11, Change "minor)" to --mirror)--.

In column 30 at line 11, Change "Gravue" to --Gravure--.

In column 46 at line 67, Change "FIG." to --FIGS.--.

Signed and Sealed this
Fourteenth Day of May, 2013

Teresa Stanek Rea
*Acting Director of the United States Patent and Trademark Office*

CERTIFICATE OF CORRECTION (continued)
U.S. Pat. No. 8,284,475 B2

In column 50 at line 26, Change "passify" to --passivate--.

In column 53 at line 56, Change "FIG." to --FIGS.--.

In column 54 at line 19, Change "FIG." to --FIGS.--.

In column 54 at line 41, Change "FIG." to --FIGS.--.

In column 61 at line 50, Change "minor)" to --mirror)--.